(12) United States Patent
Fukuzaki

(10) Patent No.: US 11,289,485 B2
(45) Date of Patent: Mar. 29, 2022

(54) SEMICONDUCTOR DEVICE AND METHOD OF MANUFACTURING THE SAME

(71) Applicant: SONY SEMICONDUCTOR SOLUTIONS CORPORATION, Kanagawa (JP)

(72) Inventor: Yuzo Fukuzaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/770,205

(22) PCT Filed: Nov. 16, 2018

(86) PCT No.: PCT/JP2018/042528
§ 371 (c)(1),
(2) Date: Jun. 5, 2020

(87) PCT Pub. No.: WO2019/116827
PCT Pub. Date: Jun. 20, 2019

(65) Prior Publication Data
US 2020/0303375 A1    Sep. 24, 2020

(30) Foreign Application Priority Data
Dec. 12, 2017  (JP) .............................. JP2017-237695

(51) Int. Cl.
| H01L 27/092  | (2006.01) |
| H01L 21/8238 | (2006.01) |
| H01L 29/06   | (2006.01) |
| H01L 29/417  | (2006.01) |
| H01L 29/78   | (2006.01) |

(52) U.S. Cl.
CPC .. *H01L 27/0924* (2013.01); *H01L 21/823821* (2013.01); *H01L 29/0669* (2013.01); *H01L 29/41791* (2013.01); *H01L 29/785* (2013.01)

(58) Field of Classification Search
CPC ............. H01L 27/0924; H01L 29/0669; H01L 29/1054
See application file for complete search history.

(56) References Cited

U.S. PATENT DOCUMENTS

| 8,536,029 B1    | 9/2013  | Chang et al. |
| 2012/0138886 A1 | 6/2012  | Kuhn et al. |
| 2013/0341596 A1 | 12/2013 | Chang et al. |
| 2017/0162447 A1 | 6/2017  | Glass et al. |
| 2017/0255735 A1* | 9/2017 | Kim ................ H01L 21/823821 |

FOREIGN PATENT DOCUMENTS

| JP | 2014-505995 | 3/2014 |
| JP | 2017-523589 | 8/2017 |

OTHER PUBLICATIONS

International Search Report and Written Opinion prepared by the Japanese Patent Office dated Jan. 18, 2019, for International Application No. PCT/JP2018/042528.

* cited by examiner

*Primary Examiner* — Changhyun Yi
(74) *Attorney, Agent, or Firm* — Sheridan Ross P.C.

(57) ABSTRACT

A semiconductor device according to the present disclosure includes a first field effect transistor including at least two channel structure units each having a nanowire structure or a nanosheet structure, and a second field effect transistor having a Fin structure, in which the channel structure units are spaced apart from each other in a thickness direction of the first field effect transistor.

20 Claims, 43 Drawing Sheets

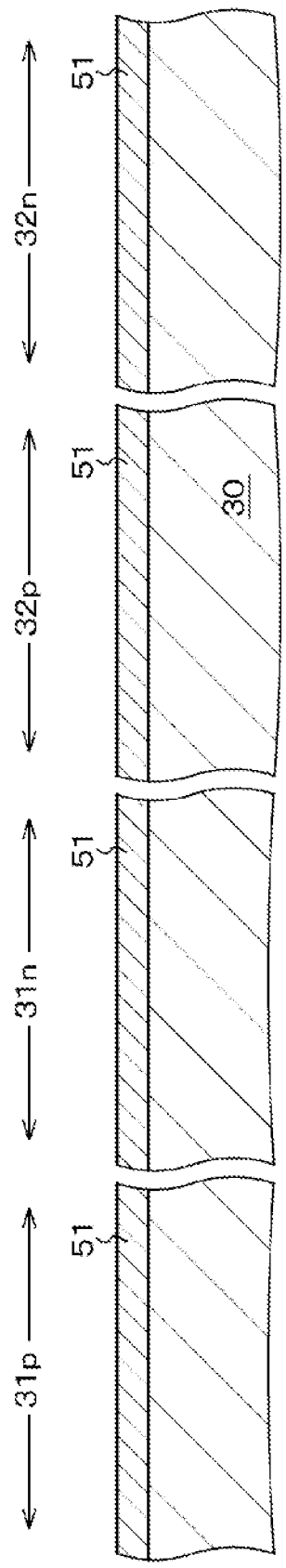
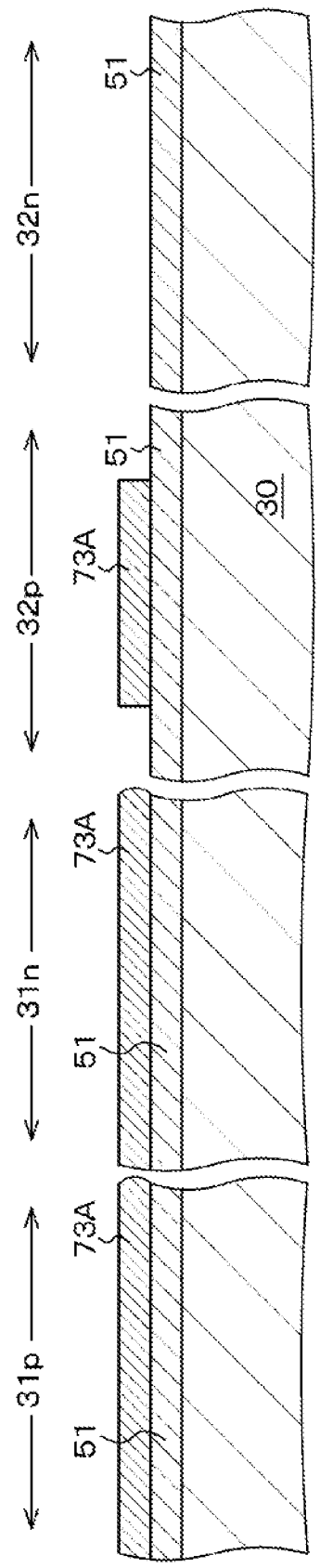
FIG. 24A
FIG. 24B

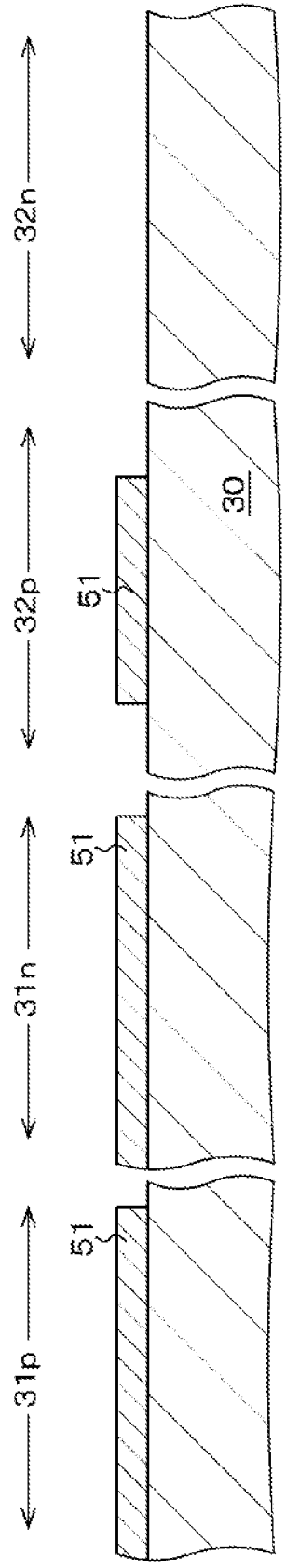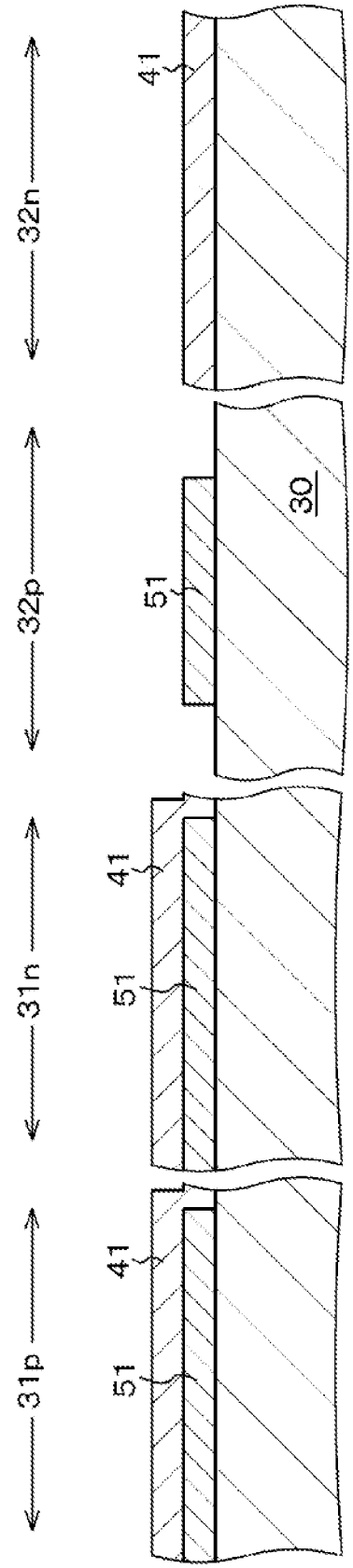
FIG. 25A
FIG. 25B

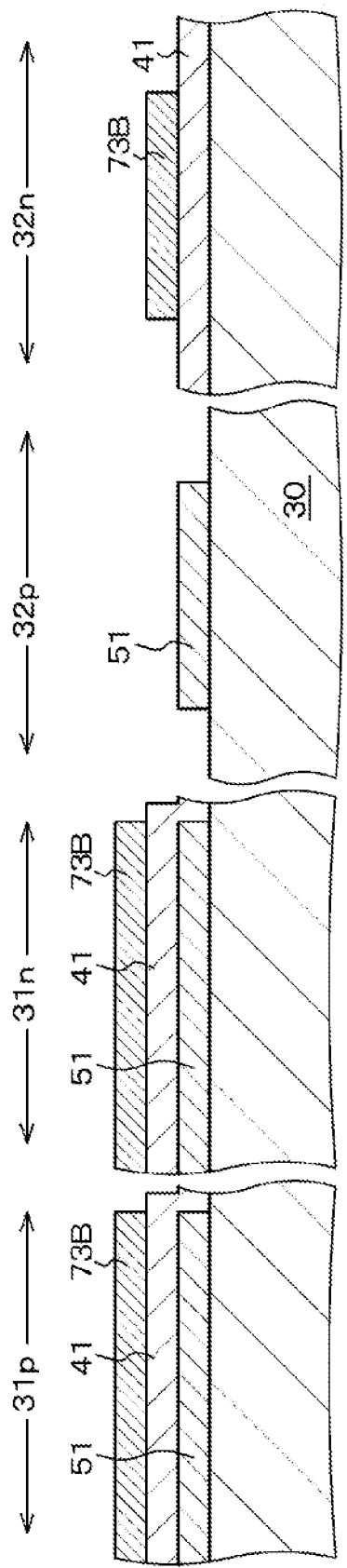
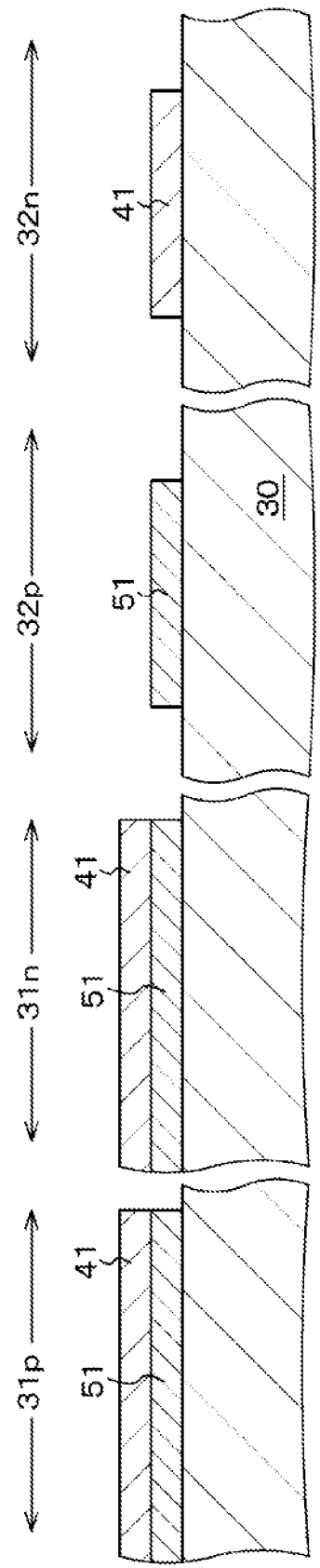
FIG. 26A
FIG. 26B

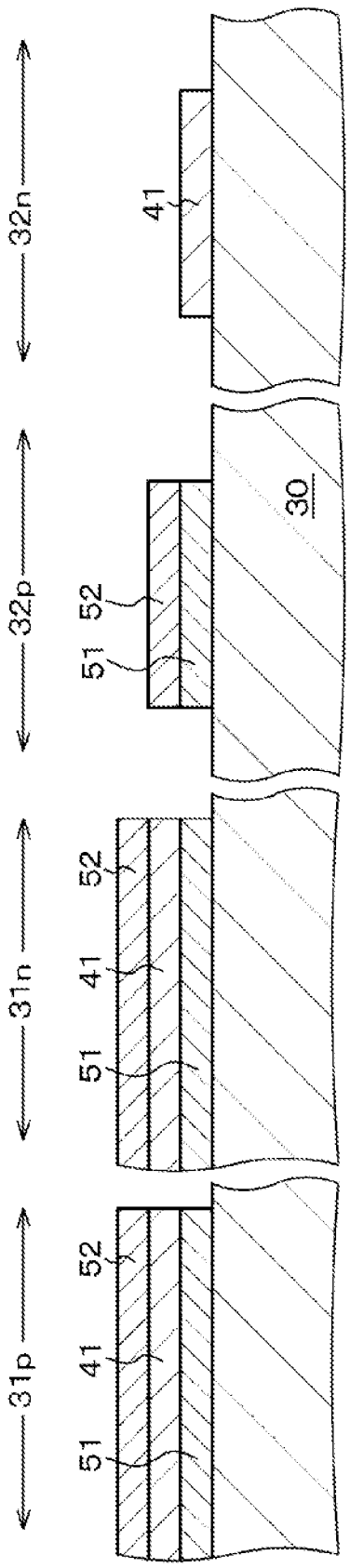
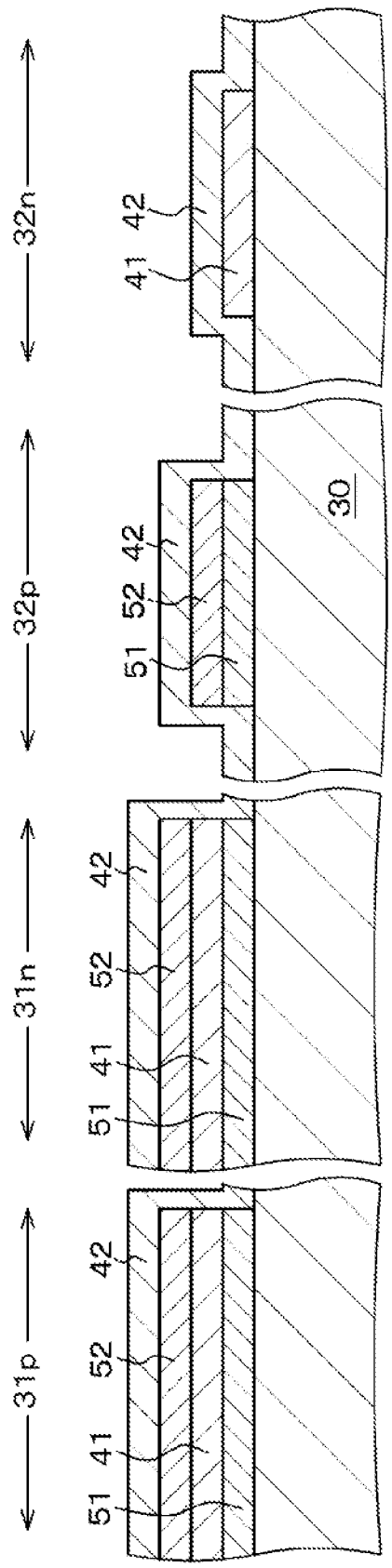
FIG. 28A
FIG. 28B

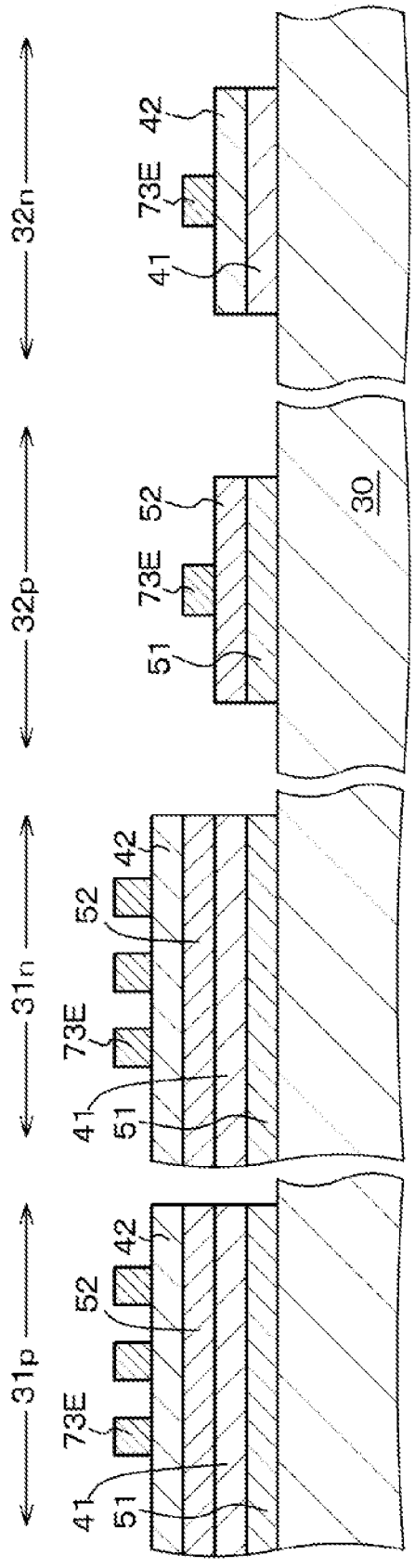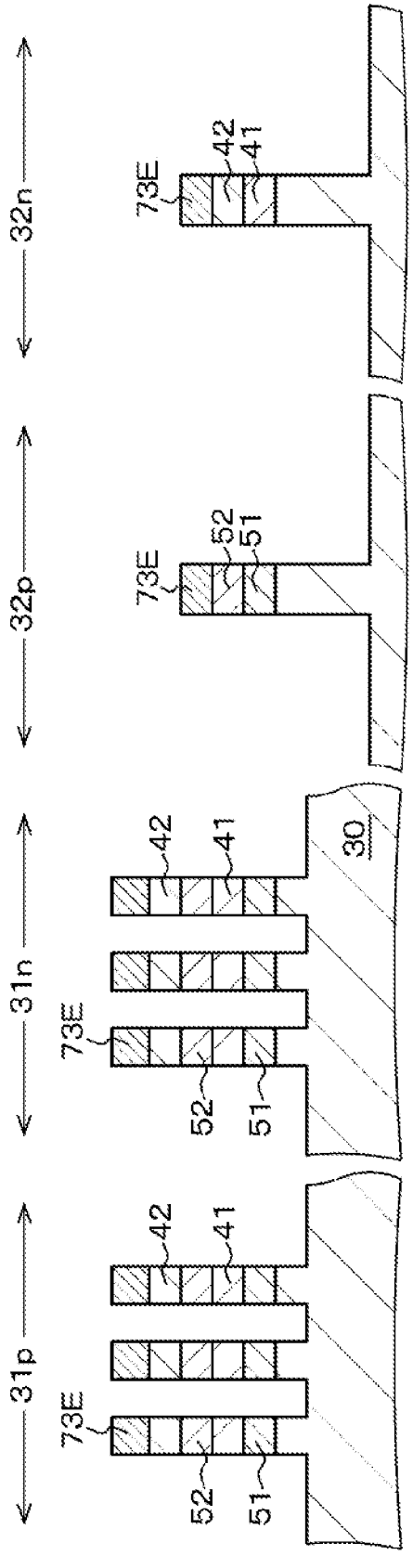

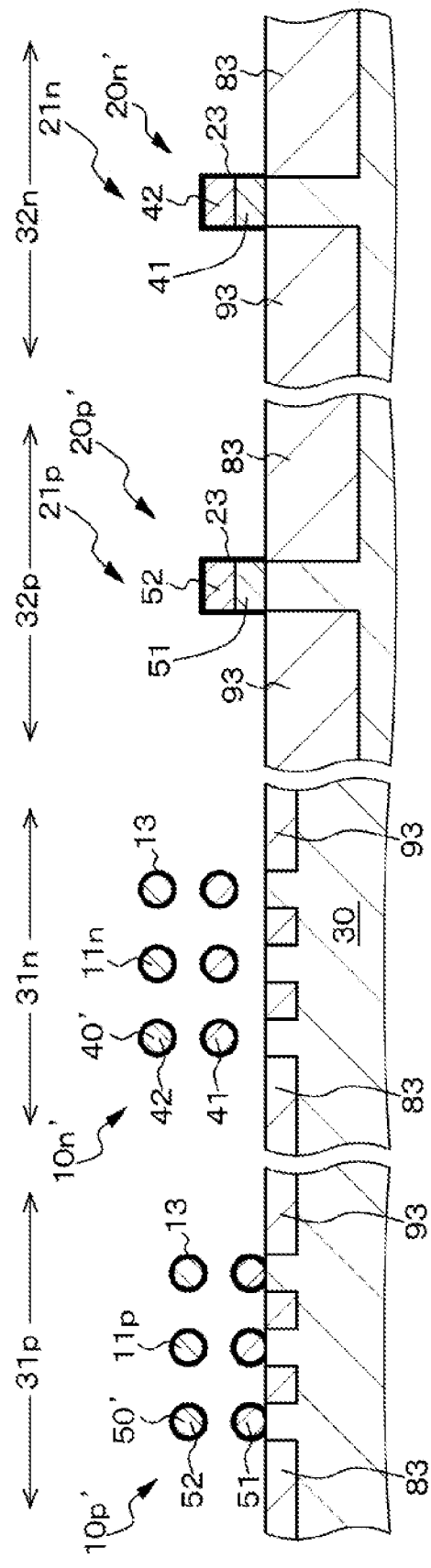
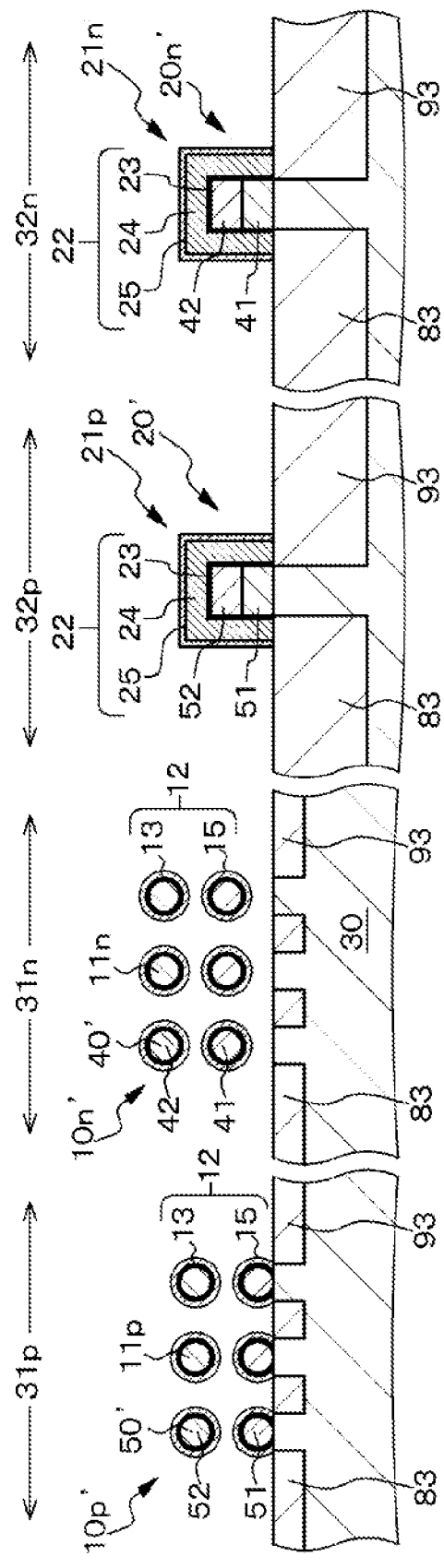

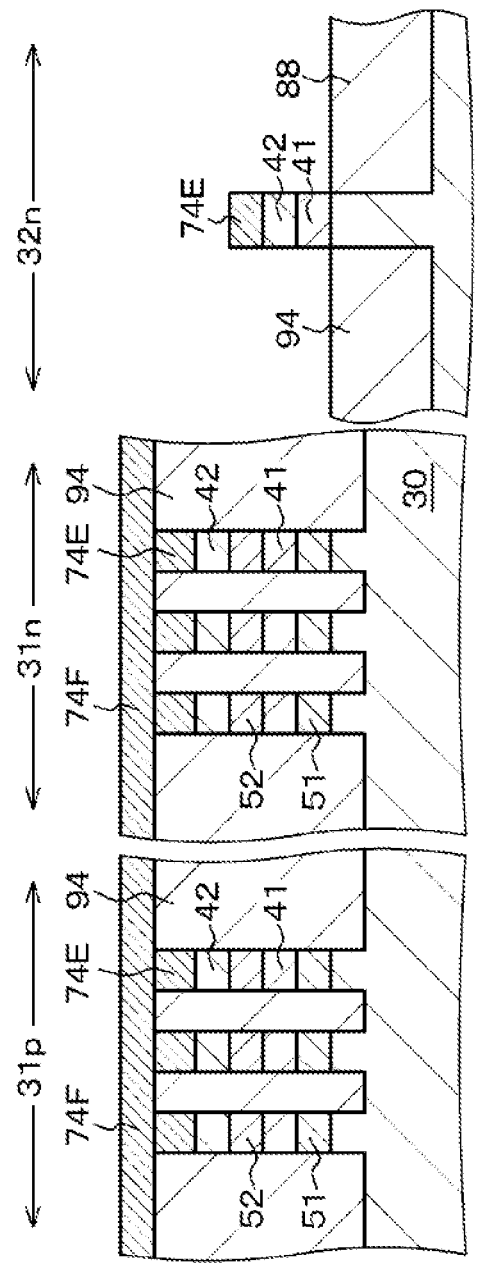
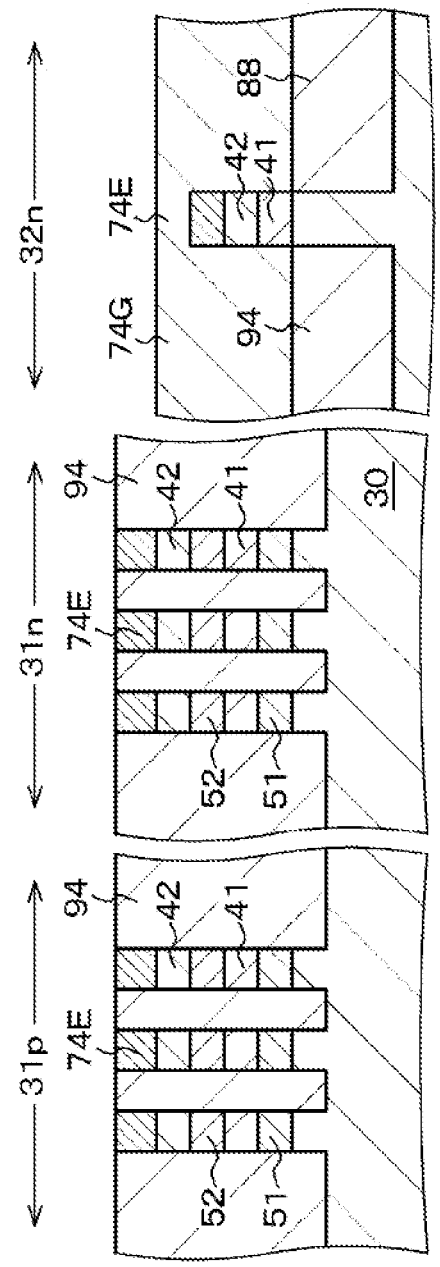
FIG. 41A
FIG. 41B

SEMICONDUCTOR DEVICE AND METHOD OF MANUFACTURING THE SAME

CROSS REFERENCE TO RELATED APPLICATIONS

This application is a national stage application under 35 U.S.C. 371 and claims the benefit of PCT Application No. PCT/JP2018/042528 having an international filing date of 16 Nov. 2018, which designated the United States, which PCT application claimed the benefit of Japanese Patent Application No. 2017-237695 filed 12 Dec. 2017, the entire disclosures of each of which are incorporated herein by reference.

TECHNICAL FIELD

The present disclosure relates to a semiconductor device and a method of manufacturing the same, and more specifically to a semiconductor device including a field effect transistor having a nanowire structure or a nanosheet structure and a field effect transistor having a Fin structure and a method of manufacturing the same.

BACKGROUND ART

Regarding the scaling trend of advanced MOS transistors since 2012, MOSFETs with a bulk planar structure have been the mainstream up to the 20 nm generation. From the 14 nm generation onwards, adopting a FET having a Fin structure (called "Fin FET" for convenience) or an FET having a fully depleted-silicon on insulator (FD-SOI) structure (called "FD-SOI FET" for convenience) has become a trend. By the way, the thickness of a silicon layer closely related to the scaling of a gate length, that is, the thickness of the Fin structure in the Fin FET or the thickness of a silicon layer in the FD-SOI FET is important in reducing the size of the FET, and it is considered that the limit of the thickness of the silicon layer is 5 nm.

A technology of overcoming the limit of the thickness of a silicon layer constituting a channel formation region of such an FET includes an FET having a nanowire structure (called "nanowire FET" for convenience) (for example, see PCT Japanese Translation Patent Publication No. 2014-505995). Furthermore, since an electric field applied to the channel formation region is strong in the nanowire FET, the nanowire FET having the channel formation region configured by the nanowire structure having the same diameter as the thicknesses of the silicon layers in the Fin FET and FD-SOI FET (hereinafter collectively called "Fin FET and the like") can have a shorter gate length than the gate lengths of the Fin FET and the like. It is said that the lower limit of the gate length in the Fin FET and the like is three times the thickness of the silicon layer, and the lower limit of the gate length in the nanowire FET is twice the diameter of the nanowire structure.

CITATION LIST

Patent Document

Patent Document 1: PCT Japanese Translation Patent Publication No. 2014-505995

SUMMARY OF THE INVENTION

Problems to be Solved by the Invention

FETs are considered to transition from the Fin FETs and the like to the nanowire FETs as the scaling progresses. At this time, FETs having a high operating voltage need to be formed on the same chip, the FETs being used for a circuit connected to an external power supply and for a circuit for inputting or outputting external signals (I/O circuit). Drive voltages of recent FETs are usually, for example, 1.5 volts, 1.8 volts, or 3.3 volts, and gate insulating films are set to be thick mainly from the viewpoint of reliability. However, it is difficult to configure a FET that satisfies such requirements from the nanowire FETs.

Therefore, an object of the present disclosure is to provide a semiconductor device that can allow coexistence of an FET having a relatively low drive voltage and an FET having a relatively high drive voltage, and a method of manufacturing the same.

Solutions to Problems

A semiconductor device according to the present disclosure for achieving the above object includes:

a first field effect transistor including at least two channel structure units each having a nanowire structure or a nanosheet structure; and a second field effect transistor having a Fin structure, in which the channel structure units are spaced apart from each other in a thickness direction of the first field effect transistor.

A method of manufacturing a semiconductor device according to a first mode of the present disclosure for achieving the above object includes the steps of:

(A) in a first region and a second region of a base, forming a first sacrificial layer on the first region and next forming a first semiconductor layer on the first sacrificial layer and on the second region;

(B) forming a second sacrificial layer on the first semiconductor layer in the first region and next forming a second semiconductor layer on the second sacrificial layer and on the first semiconductor layer in the second region;

(C) forming a stacked structure body including the first semiconductor layer, the first sacrificial layer, the second semiconductor layer, and the second sacrificial layer on the first region and next removing parts of the second sacrificial layer and the first sacrificial layer in the stacked structure body;

(C-1) obtaining a first structure including a source/drain region including the stacked structure body and a channel structure unit including the first semiconductor layer and the second semiconductor layer spaced apart from the first semiconductor layer in the first region; and (C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

A method of manufacturing a semiconductor device according to a second mode of the present disclosure for achieving the above object includes the steps of:

(A) forming a first semiconductor layer on a first region and on a second region of a base;

(B) forming a sacrificial layer on the first semiconductor layer, next removing the sacrificial layer in the second region, forming a second semiconductor layer on the sacrificial layer in the first region, and forming the second semiconductor layer on the first semiconductor layer in the second region;

(C) forming a stacked structure body including the second semiconductor layer, the sacrificial layer, and the first semiconductor layer and next removing a part of the sacrificial layer in the stacked structure body in the first region;

(C-1) obtaining a first structure including a source/drain region including the stacked structure body and a channel structure unit including the first semiconductor layer and the second semiconductor layer spaced apart from the first semiconductor layer in the first region; and C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

A method of manufacturing a semiconductor device according to a third mode of the present disclosure for achieving the above object includes the steps of:

(A) in a first a region, a first b region, a second a region, and a second b region of a base, forming a first A semiconductor layer on the first a region, the first b region, and the second a region and next forming a first B semiconductor layer on the first A semiconductor layer in the first a region and the first b region and on the second b region;

(B) forming a second A semiconductor layer on the first B semiconductor layer in the first a region and the first b region and on the first A semiconductor layer in the second a region and next forming a second B semiconductor layer on the second A semiconductor layer in the first a region and the first b region and on the first B semiconductor layer in the second b region;

(C) forming a first stacked structure body including the second B semiconductor layer, the second A semiconductor layer, the first B semiconductor layer, and the first A semiconductor layer in the first a region, and forming a second stacked structure body including the second B semiconductor layer, the second A semiconductor layer, the first B semiconductor layer, and the first A semiconductor layer in the first b region;

(D) removing parts of the second B semiconductor layer and the first B semiconductor layer in the first stacked structure body in the first a region, and removing parts of the second A semiconductor layer and the first A semiconductor layer in the second stacked structure body in the first b region;

(D-1) obtaining a first A structure including a source/drain region including the first stacked structure body and a channel structure unit including the first A semiconductor layer and the second A semiconductor layer spaced apart from the first A semiconductor layer in the first a region;

(D-2) obtaining a first B structure including a source/drain region including the second stacked structure body and a channel structure unit including the first B semiconductor layer and the second B semiconductor layer spaced apart from the first B semiconductor layer in the first b region;

(D-3) obtaining a second A structure including a source/drain region including a stacked structure of the first A semiconductor layer and the second A semiconductor layer and a channel formation region in the second a region;

(D-4) obtaining a second B structure including a source/drain region including a stacked structure of the first B semiconductor layer and the second B semiconductor layer and a channel formation region in the second b region; and (E) forming a gate insulating film and a gate electrode in the channel structure units in the first A structure and the first B structure and in the channel formation regions in the second A structure and the second B structure, and therefore obtaining a first A field effect transistor, a first B field effect transistor, a second A field effect transistor, and a second B field effect transistor in the first a region, the first b region, the second a region, and the second b region of the base, respectively.

BRIEF DESCRIPTION OF DRAWINGS

FIGS. 24A and 24B are schematic partial end views of a base and the like for describing a method of manufacturing the semiconductor device according to Example 3.

FIGS. 25A and 25B are schematic partial end views of a base and the like for describing a method of manufacturing the semiconductor device according to Example 3, following FIG. 24B.

FIGS. 26A and 26B are schematic partial end views of a base and the like for describing a method of manufacturing the semiconductor device according to Example 3, following FIG. 25B.

FIGS. 28A and 28B are schematic partial end views of a base and the like for describing a method of manufacturing the semiconductor device according to Example 3, following FIG. 27B.

FIGS. 30A and 30B are schematic partial end views of a base and the like for describing a method of manufacturing the semiconductor device according to Example 3, following FIG. 29B.

FIGS. 35A and 35B are schematic partial end views of a base and the like for describing a method of manufacturing the semiconductor device according to Example 3, following FIG. 34B.

FIGS. 41A and 41B are schematic partial end views of a base and the like for describing a method of manufacturing the semiconductor device according to Example 4, following FIG. 40B.

Figure 1A:
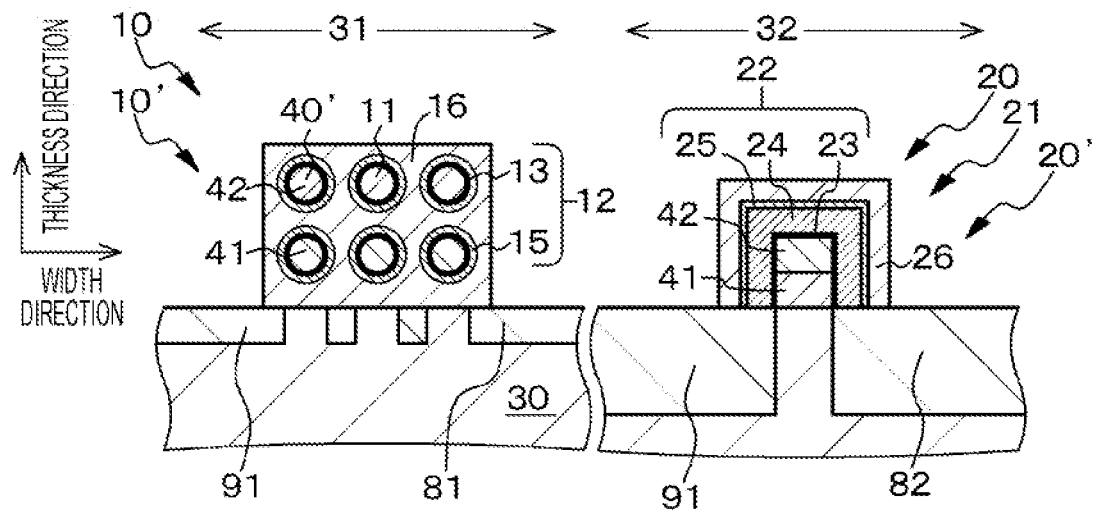
FIGS. 1A and 1B are a schematic partial end view of a semiconductor device according to Example 1, and a schematic layout view of a channel structure unit, a channel formation region, and a source/drain region of the semiconductor device according to Example 1.

Hereinafter, the present disclosure will be described on the basis of examples with reference to the drawings. The present disclosure is not limited to the examples, and various numerical values and materials in the examples are examples. Note that the description will be given in the following order.

1. General description of a semiconductor device according to the Present disclosure and methods of manufacturing the semiconductor device according to first to third modes of the present disclosure 2. Example 1 (a semiconductor device according to the present disclosure and a method of manufacturing the semiconductor device according to the first mode of the present disclosure)

3. Example 2 (a modification of the semiconductor device according to the present disclosure and a method of manufacturing the semiconductor device according to the second mode of the present disclosure)

4. Example 3 (a modification of the semiconductor device according to the present disclosure and a method of manufacturing the semiconductor device according to the third mode of the present disclosure)

5. Example 4 (a modification of the semiconductor device according to the present disclosure and modifications of the methods of manufacturing the semiconductor device according to Example 1 and Example 2)

6. Others

<General Description of a Semiconductor Device According to the Present Disclosure and Methods of Manufacturing the Semiconductor Device According to First to Third Modes of the Present Disclosure>

A semiconductor device according to the present disclosure or a semiconductor device obtained by a method of manufacturing the semiconductor device according to first or second mode of the present disclosure favorably satisfies:

$$0.90 \leq H_L/H_H \leq 1.04,$$

where a total height of channel structure units is $H_L$ and a height of a channel formation region of a second field effect transistor is $H_H$. Furthermore, a semiconductor device obtained by a method of manufacturing the semiconductor device according to a third mode of the present disclosure favorably satisfies:

$$0.91 H_{L-1A}/H_{H-2A} \leq 1.04; \text{ and}$$

$$0.90 H_{L-1B}/H_{H-2B} \leq 1.03,$$

where the total height of channel structure units of a first A field effect transistor is $H_{L-1A}$, the total height of channel structure units of a first B field effect transistor is $H_{L-1B}$, the height of a channel formation region of a second A field effect transistor is $H_{H-2A}$, and the height of a channel formation region of a second B field effect transistor is $H_{H-2B}$.

In the semiconductor devices according to the present disclosure including the above-described favorable forms or the semiconductor devices obtained by the methods of manufacturing the semiconductor devices according to the first and second modes of the present disclosure including the above-described favorable forms, a gate insulating film and a gate electrode for a first field effect transistor can be formed in channel structure units in the first field effect transistor, and a gate insulating film and a gate electrode for a second field effect transistor can be formed in a channel formation region in the second field effect transistor. That is, in the first field effect transistor, the channel structure units are spaced apart from each other in a thickness direction of the first field effect transistor, and outer peripheries of the channel structure units are at least partially covered with the gate insulating film along a peripheral direction, and the gate electrode is formed on the gate insulating film. That is, the gate insulating film and the gate electrode are formed between the channel structure unit and the channel structure unit, and a space between the channel structure unit and the channel structure unit is embedded with the gate insulating film and the gate electrode. The total height $H_L$ of the channel structure units is a total diameter of materials (for example, Si and SiGe) configuring a nanowire structure configuring the channel structure units, excluding the gate insulating film and the gate electrode, or a total thickness of the materials (for example, Si and SiGe) configuring a nanosheet structure, excluding the gate insulating film and the gate electrode. The height $H_L$ of the channel formation region is a total thickness of semiconductor layers configuring the channel formation region.

Furthermore, in the semiconductor device obtained the method of manufacturing the semiconductor device according to the third mode of the present disclosure including the above-described favorable forms, a gate insulating film and a gate electrode for the first A field effect transistor are formed in the channel structure unit in the first A field effect transistor, a gate insulating film and a gate electrode for the first B field effect transistor are formed in the channel structure unit in the first B field effect transistor, a gate insulating film and a gate electrode for the second A field effect transistor are formed in the channel formation region in the second A field effect transistor, and a gate insulating film and a gate electrode for the second B field effect transistor are formed in the channel formation region in the second B field effect transistor, as described above.

Moreover, in the semiconductor devices according to the present disclosure including the above-described various favorable forms, the first field effect transistor can be configured by a combination of an n-channel first field effect transistor and a p-channel first field effect transistor. Then, the channel structure units in one of the n-channel first field effect transistor and the p-channel first field effect transistor can be formed in odd-numbered levels of layers (a first layer, a third layer, and the like), and the channel structure units of the other first field effect transistor can be formed in even-numbered levels of layers (a second layer, a fourth layer, and the like). Moreover, in these cases, the channel structure unit in the n-channel first field effect transistor can contain Si, and the channel structure unit in the p-channel first field effect transistor can contain SiGe. Whether the first field effect transistor is the n-channel first field effect transistor or the p-channel first field effect transistor is Solely determined by a work function of the material configuring the gate electrode.

Moreover, in the semiconductor devices according to the present disclosure including the above-described various favorable forms, the second field effect transistor can be configured by a combination of an n-channel second field effect transistor and a p-channel second field effect transistor. Then, in this case, the channel formation region in the n-channel second field effect transistor can contain Si, and the channel formation region in the p-channel second field effect transistor can contain SiGe. Whether the second field effect transistor is the n-channel second field effect transistor or the p-channel second field effect transistor is solely determined by a work function of the material configuring the gate electrode.

Alternatively, in the semiconductor devices according to the present disclosure including the above-described various favorable, forms, the second field effect transistor can be configured by the n-channel second field effect transistor.

Moreover, in the semiconductor devices according to the present disclosure including the above-described various favorable forms and configurations or the semiconductor devices obtained by the methods of manufacturing the semiconductor devices according to the first and second modes of the present disclosure including the above-described various favorable forms, the first field effect transistor can be configured as a low withstand voltage/field effect transistor, and the second field effect transistor can be configured as a high withstand voltage/field effect transistor. Then, in this case, a voltage applied to the gate electrode of the first field effect transistor is 0.5 to 0.8 volts, and a voltage applied to the gate electrode of the second field effect transistor is 1.5 to 3 volts. Here, whether the field effect transistor is suitable as the low withstand voltage/field effect transistor or the high withstand voltage/field effect transistor largely depends on the thickness of the gate insulating film configuring the field effect transistor.

Furthermore, in the semiconductor device obtained by the method of manufacturing the semiconductor device according to the third mode of the present disclosure including the above-described various favorable forms (hereinafter, called the semiconductor device or the like according to the third mode of the present disclosure), the first A field effect transistor can be one of an n-channel first field effect transistor and a p-channel first field effect transistor, and the first B field effect transistor can be the other of the n-channel first field effect transistor and the p-channel first field effect transistor, and the second A field effect transistor can be one of an n-channel second field effect transistor and a p-channel second field effect transistor, and the second B field effect transistor can be the other of the n-channel second field effect transistor and the p-channel second field effect transistor.

Alternatively, in the semiconductor device or the like according to the third mode of the present disclosure, the first A field effect transistor can be one of the n-channel first field effect transistor and the p-channel first field effect transistor, and the first B field effect transistor can be the other of the n-channel first field effect transistor and the p-channel first field effect transistor, and the second A field effect transistor and the second B field effect transistor can be one of the n-channel second field effect transistors and the p-channel second field effect transistors.

Then, the channel structure units in the first A field effect transistor can be formed in odd-numbered levels of layers (a first layer, a third layer, and the like), and the channel structure units of the first B field effect transistor can be formed in even-numbered levels of layers (a second layer, a fourth layer, and the like).

Moreover, in these cases, the channel structure units in the n-channel various field effect transistors contain Si, the channel structure units in the p-channel various field effect transistors contain SiGe, the channel formation regions in the n-channel various field effect transistors contain Si, and the channel formation regions in the p-channel various field effect transistors contain SiGe.

Moreover, in the semiconductor device or the like according to the third mode of the present disclosure including the above-described various favorable forms and configurations, the first A field effect transistor and the first B field effect transistor can be low withstand voltage/field effect transistors, and the second A field effect transistor and the second B field effect transistor can be high withstand voltage/field effect transistors. Then, in this case, the voltage applied to the gate electrodes of the first A field effect transistor and the first B field effect transistor can be 0.5 to 0.8 volts, and the voltage applied to the gate electrodes of the second A field effect transistor and the second B field effect transistor can be 1.5 to 3 volts.

In the semiconductor devices according to the present disclosure including the above-described various favorable forms and configurations, the semiconductor devices obtained by the methods of manufacturing the semiconductor devices according to the first and second modes of the present disclosure including the above-described various favorable forms and configurations, and the semiconductor device or the like according to the third mode of the present disclosure including the above-described various favorable forms and configurations (hereinafter, these semiconductor devices may be collectively called "semiconductor devices and the like according to the present disclosure"), examples of the material configuring the gate electrode include TiN, TaN, Al, TiAl, and W in order to have the n-channel various field effect transistors in the case of configuring the channel structure units or the channel formation region with Si. Meanwhile, examples of the material configuring the gate electrode include TiN and W in order to have the p-channel various field effect transistors in the case of configuring the channel structure units or the channel formation region using SiGe. Furthermore, examples of the material configuring the gate insulating film include SiON and $SiO_2$, and high dielectric constant materials (so-called High-k material), such as $HfO_2$, HfAlON, and $Y_2O_3$.

In the semiconductor devices and the like according to the present disclosure, examples of a base include a silicon semiconductor substrate and an SOI substrate. A semiconductor layer favorably has crystallinity. However, the semiconductor layer may be polycrystal or may be amorphous in some cases. A sacrificial layer favorably has crystallinity. However, the sacrificial layer may be polycrystal or may be amorphous in some cases. In a case of configuring the semiconductor layer using Si, the sacrificial layer can be configured using SiGe, for example. In a case of configuring the semiconductor layer using SiGe, the sacrificial layer can be configured using Si, for example. Note that the material of the sacrificial layer is not limited to the above materials. In short, any material can be used as long as the material has a large etching selectivity between the sacrificial layer and the semiconductor layer when removing the sacrificial layer, and besides, an example of the material configuring the sacrificial layer includes Ge in the case of configuring the semiconductor layer using Si, for example. Examples of a method of forming the semiconductor layer and the sacrificial layer include an epitaxial CVD method, a plasma CVD method, and an atomic layer deposition method (ALD method).

In the semiconductor devices and the like according to the present disclosure, the number of the channel structure units in the thickness direction of the first field effect transistor may be two or more, and the number of the channel structure units in a direction orthogonal to the thickness direction of the first field effect transistor may be one or two or more. In the nanowire structure configuring each of the semiconductor devices and the like according to the present disclosure, both ends of a wire containing Si or SiGe, for example, with a diameter of 5 to 10 nm are supported by a stacked structure body, a first stacked structure body, or a second stacked structure body configuring a source/drain region. Furthermore, in the nanosheet structure configuring each of the semiconductor devices and the like according to the present disclosure, both ends of the material containing Si or SiGe, for example, and having a substantially rectangular cross-sectional shape with the width×the thickness of (10 to 50 nm)×(5 to 10 nm), for example, are supported by a stacked structure body, a first stacked structure body, or a second stacked structure body configuring a source/drain region. Note that whether the nanowire structure or the nanosheet structure is included depends on the thickness and the width of the material configuring the structure.

A field effect transistor having a Fin structure includes a channel formation region having a rectangular cross-sectional shape that is a channel formation region having a first semiconductor layer and a second semiconductor layer stacked on a base, a channel formation region having a first A semiconductor layer and a second A semiconductor layer stacked on a base, or a channel formation region having a first B semiconductor layer and a second B semiconductor layer stacked on a base, source/drain regions formed on both ends of the channel formation region and extending from the channel formation region, a gate insulating film formed from a top to a side surface of the channel formation region, and a gate electrode formed on the gate insulating film.

In the semiconductor device, how to arrange the first field effect transistor and the second field effect transistor depends on a required specification of the semiconductor device, and thus cannot be unconditionally specified. For example, examples of the required specification of the semiconductor device include, but are not limited to, a form in which a logic circuit is configured by a first field effect transistor and a transistor that exchanges signals and the like with an outside is configured by a second field effect transistor, a form in which a light receiving element in an imaging device is controlled by a second field effect transistor and a logic circuit that controls the imaging device is configured by a first field effect transistor, and a form in which a CPU, a GPU, or the like is configured by a first field effect transistor and a transistor that exchanges signals and the like with the outside is configured by a second field effect transistor.

EXAMPLE 1

Figure 1B:
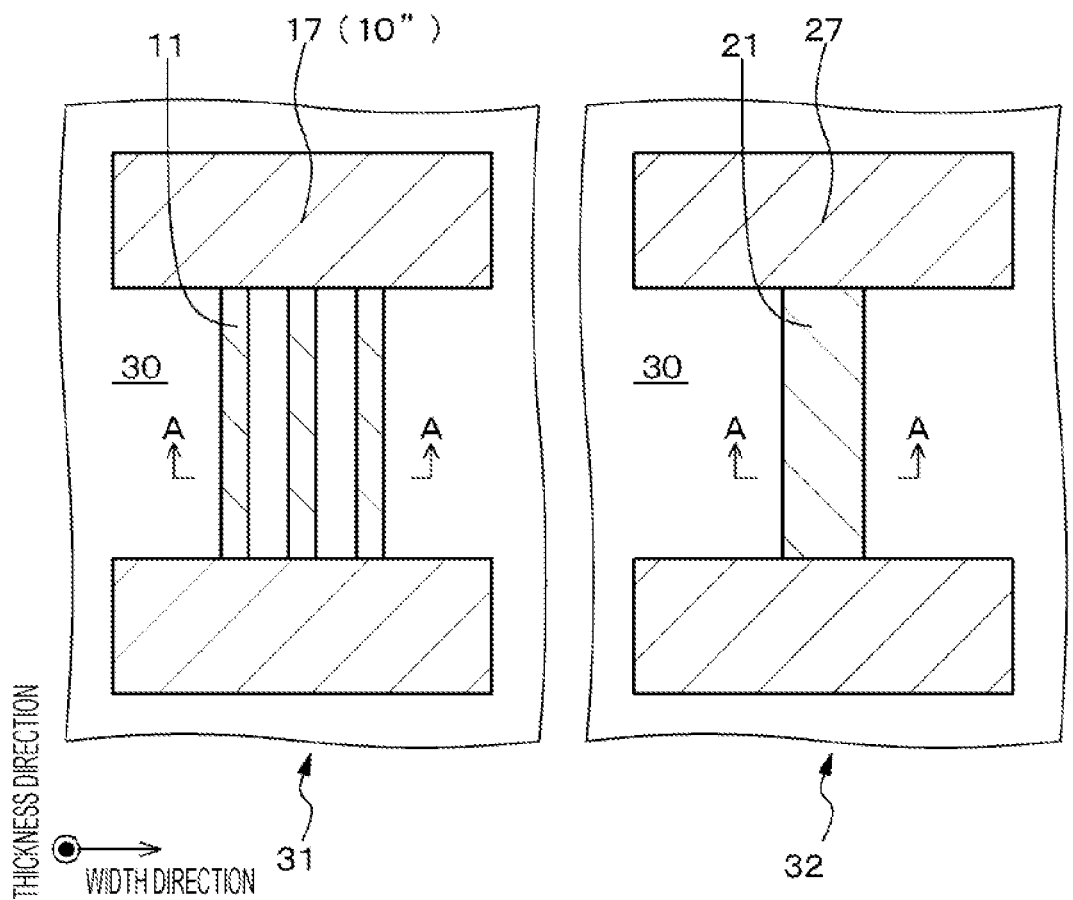

Example 1 relates to a semiconductor device according to the present disclosure and a method of manufacturing the semiconductor device according to the first mode of the present disclosure. FIG. 1A illustrates a schematic partial end view of the semiconductor device according to Example 1 and FIG. 1B illustrates a schematic layout view of a channel structure unit, a channel formation region, and a source/drain region of the semiconductor device according to Example 1. Note that FIG. 1A is a schematic partial end view along arrow A-A in FIG. 1B.

The semiconductor device according to Example 1 includes:

a first field effect transistor 10 including at least two channel structure units 11 (two in the thickness direction in the illustrated example) each having a nanowire structure or a nanosheet structure (a nanowire structure 40' in the illustrated example); and a second field effect transistor 20 having a Fin structure, in which the channel structure units 11 are spaced apart from each other in the thickness direction of the first field effect transistor 10. In the illustrated example, one channel structure unit 11 includes three nanowire structures 40' in the width direction.

In Example 1, a first semiconductor layer 41 and a second semiconductor layer 42 contain Si, a first sacrificial layer 61 and a second sacrificial layer 62 contain SiGe, and a base 30 includes a silicon semiconductor substrate.

Then, in the semiconductor device in Example 1, the relationship between a total height $H_L$ of the channel structure units 11 and a height $H_H$ of a channel formation region 21 of the second field effect transistor 20 satisfies:

$$0.90 \leq H_L/H_H \leq 1.04.$$

Specifically, for example,
the nanowire structure 40' has the diameter=9 nm,
$H_L$=18.5 nm, and
$H_H$=18.5 nm.

Furthermore, in the semiconductor device in Example 1, a gate insulating film 12 and a gate electrode 16 for the first field effect transistor 10 are formed in the channel structure units 11 in the first field effect transistor 10, and a gate insulating film 22 and a gate electrode 26 for the second field effect transistor 20 are formed in the channel formation region 21 in the second field effect transistor 20. That is, in the first field effect transistor 10, the gate insulating film 12 and the gate electrode 16 are formed between the channel structure unit 11 and the channel structure unit 11, and a space between the channel structure unit 11 and the channel structure unit 11 is embedded with the gate insulating film 12 and the gate electrode 16. The first field effect transistor 10 and the second field effect transistor 20 are n-channel field effect transistors. Examples of the material configuring the gate electrodes 16 and 26 include TiN, TaN, Al, TiAl, and W. Furthermore, gate insulating films 13 and 23 configuring parts of the gate insulating films 12 and 22 contain SIGN, a gate insulating film 24 contains and gate insulating films 15 and 25 configuring rests of the gate insulating films 12 and 22 contain a high dielectric constant material, specifically, $HfO_2$.

Then, in the semiconductor device in Example 1, the first field effect transistor 10 is a low withstand voltage/field effect transistor, the second field effect transistor 20 is a high withstand voltage/field effect transistor, the voltage applied to the gate electrode 16 of the first field effect transistor 10 is 0.5 to 0.8 volts, and the voltage applied to the gate electrode 26 of the second field effect transistor 20 is 1.5 to 3 volts.

Hereinafter, a method of manufacturing the semiconductor device according to Example 1 will be described with reference to FIGS. 2A, 2B, 2C, 3A, 3B, 3C, 4A, 4B, 4C, 5A, 5B, 5C, 6A, 6B, 7A, 7B, 8A, 8B, 9A, 9B, 10A, 10B, 11A, 11B, and 12. These drawings are schematic partial end views similar to the schematic partial end view taken along arrow A-A in FIG. 1B.

[Process-100]

First, in a first region 31 and a second region 32 of the base 30, the first sacrificial layer 61 is formed on the first region 31, and next, the first semiconductor layer 41 is formed on the first sacrificial layer 61 and the second region 32.

[Process-100A]

Figure 2A:
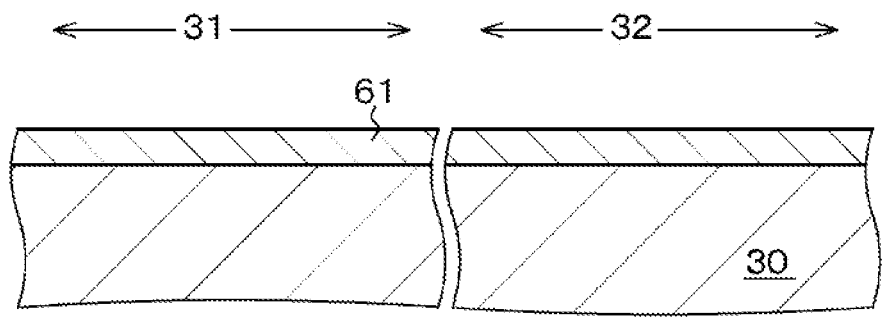
FIGS. 2A, 2B, and 2C are schematic partial end views of a base and the like for describing a method of manufacturing the semiconductor device according to Example 1.
Figure 2B:
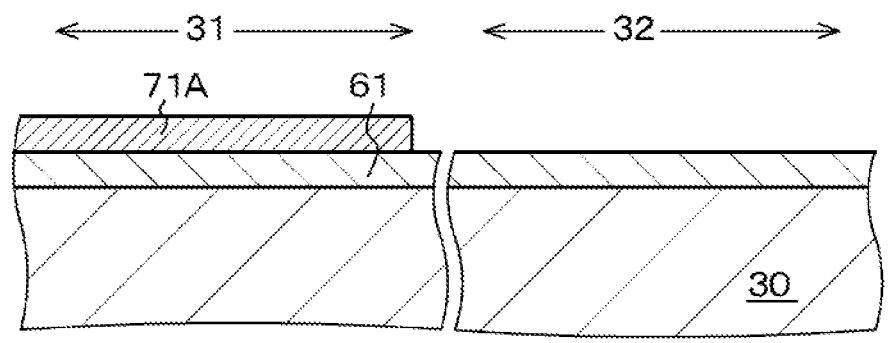
Figure 2C:
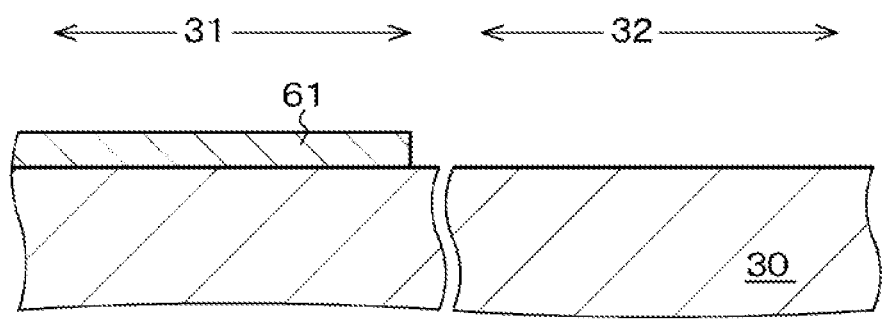

Specifically, first, the first sacrificial layer 61 is formed on the entire surface of the base 30 on the basis of an epitaxial CVD method (see FIG. 2A), and then an etching resist 71A having a desired resist pattern is formed on the first sacrificial layer 61 (see FIG. 2B). Then, the first sacrificial layer 61 on the first region 31 is patterned and the first sacrificial layer 61 on the second region 32 is removed, and then the etching resist 71A is removed, whereby the first sacrificial layer 61 can be formed on the first region 31 (see FIG. 2C).

[Process-100B]

Figure 3A:
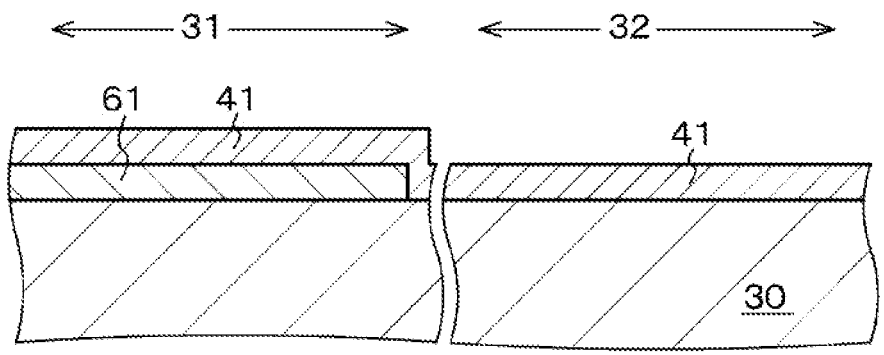
FIGS. 3A, 3B, and 3C are schematic partial end views of a base and the like for describing a method of manufacturing the semiconductor device according to Example 1, following FIG. 2C.
Figure 3B:
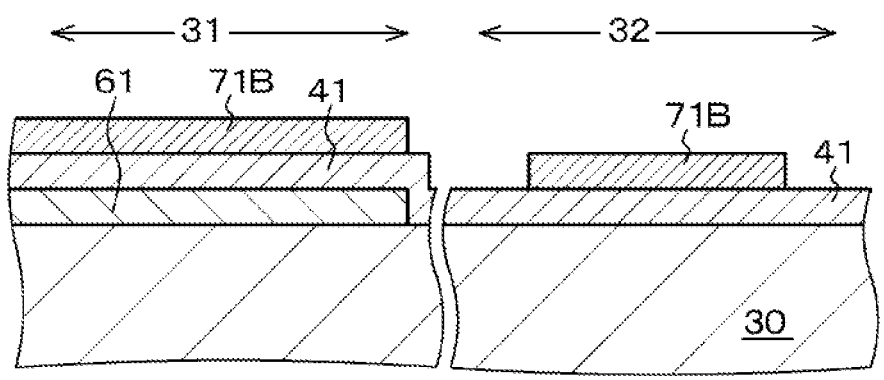
Figure 3C:
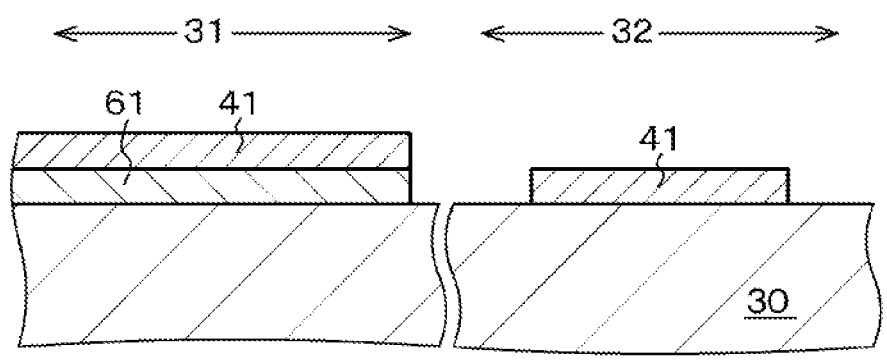
Figure 4A:
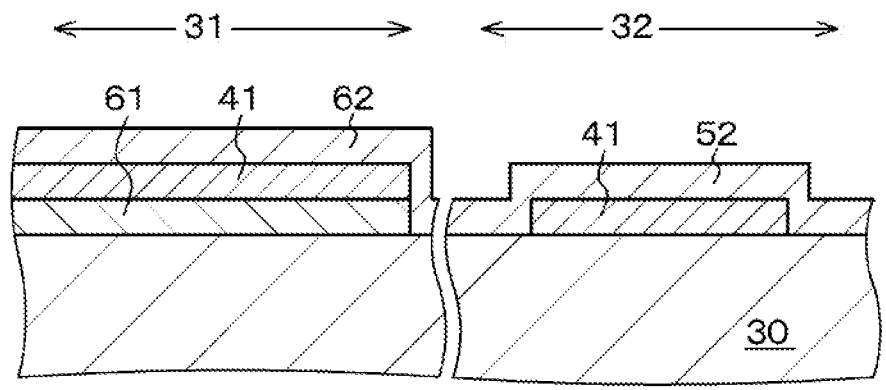
FIGS. 4A, 4B, and 4C are schematic partial end views of a base and the like for describing a method of manufacturing the semiconductor device according to Example 1, following FIG. 3C.
Figure 4B:
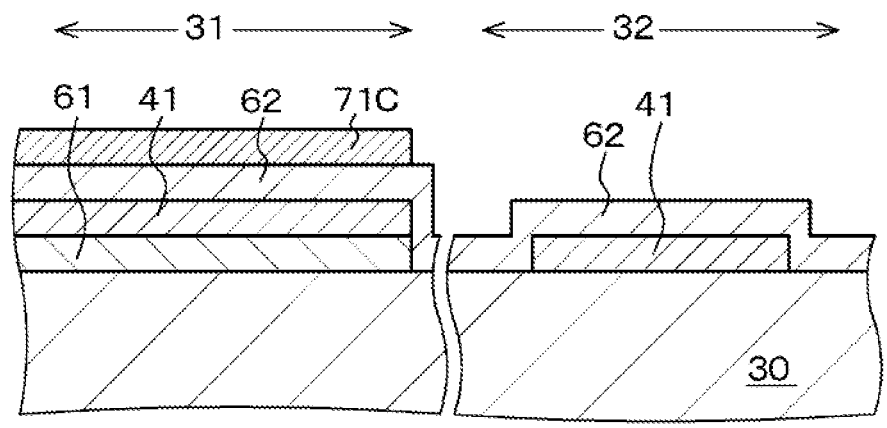
Figure 4C:
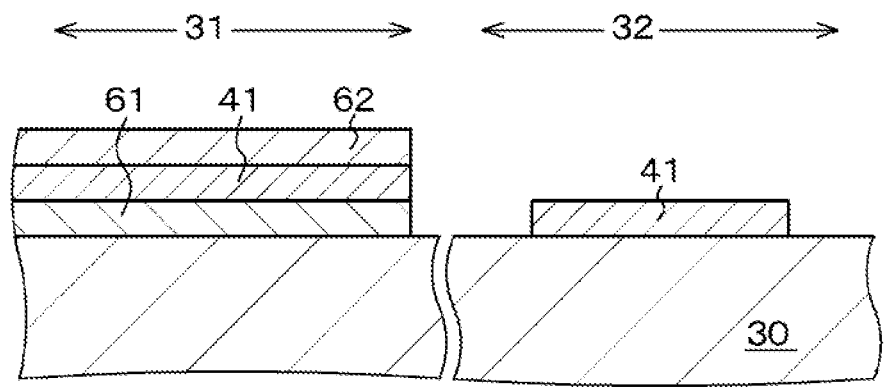

Next, the first semiconductor layer 41 is formed on the entire surface on the basis of the epitaxial CVD method (see FIG. 3A), and then an etching resist 71B) having a desired resist pattern is formed on the first semiconductor layer 41 (see FIG. 3B). Then, the first semiconductor layer 41 is patterned and then the etching resist 71B is removed, whereby the first semiconductor layer 41 can be formed on the first sacrificial layer 61 and on the second region 32 (see FIG. 3C).

[Process-110]

Next, the second sacrificial layer 62 is formed on the first semiconductor layer 41 in the first region 31, and next, the second semiconductor layer 42 is formed on the second sacrificial layer 62 and on the first semiconductor layer 41 in the second region 32.

[Process-110A]

Specifically, the second sacrificial layer 62 is formed on the entire surface on the basis of the epitaxial CVD method (see FIG. 4A), and then an etching resist 71C having a desired resist pattern is formed on the second sacrificial layer 62. Then, the second sacrificial layer 62 on the first region 31 is patterned and the second sacrificial layer 62 on the second region 32 is removed, and then the etching resist 71C is removed, whereby the second sacrificial layer 62 can be formed on the first semiconductor layer 41 in the first region 31 (see FIG. 4C).

[Process-110B]

Figure 5A:
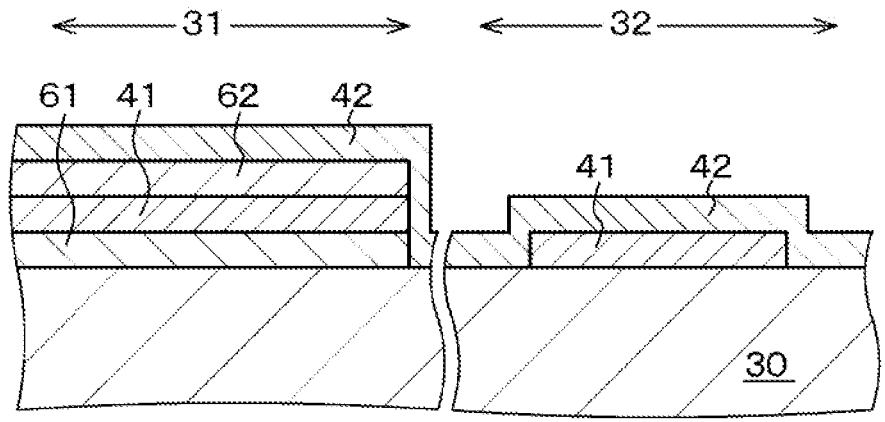
FIGS. 5A, 5B, and 5C are schematic partial end views of a base and the like for describing a method of manufacturing the semiconductor device according to Example 1, following FIG. 4C.
Figure 5B:
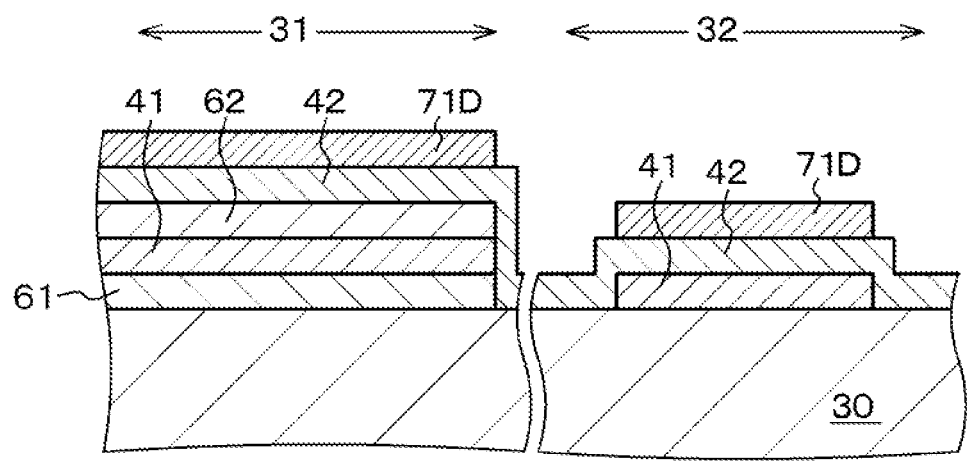
Figure 5C:
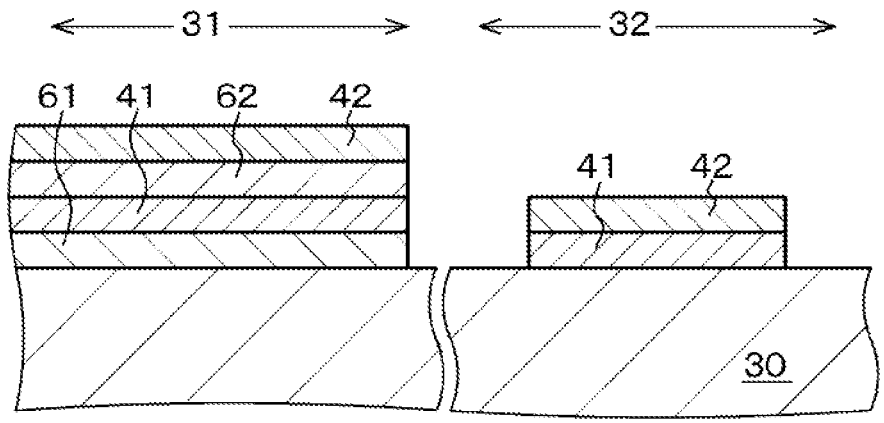

Next, the second semiconductor layer 42 is formed on the entire surface on the basis of the epitaxial CVD method (see FIG. 5A), and then an etching resist 71D having a desired resist pattern is formed on the second semiconductor layer 42 (see FIG. 5B). Then, the second semiconductor layer 42 is patterned and the etching resist 71D is removed, whereby the second semiconductor layer 42 can be formed on the second sacrificial layer 62 and on the first semiconductor layer 41 on the second region 32 (see FIG. 5C).

[Process-120]

Thereafter, a stacked structure body 10" including the first sacrificial layer 61, the first semiconductor layer 41, the second sacrificial layer 62, and the second semiconductor layer 42 is formed on the first region 31, and next, parts of the second sacrificial layer 62 and the first sacrificial layer 61 in the stacked structure body 10" are removed.

[Process-120A]

Figure 6A:
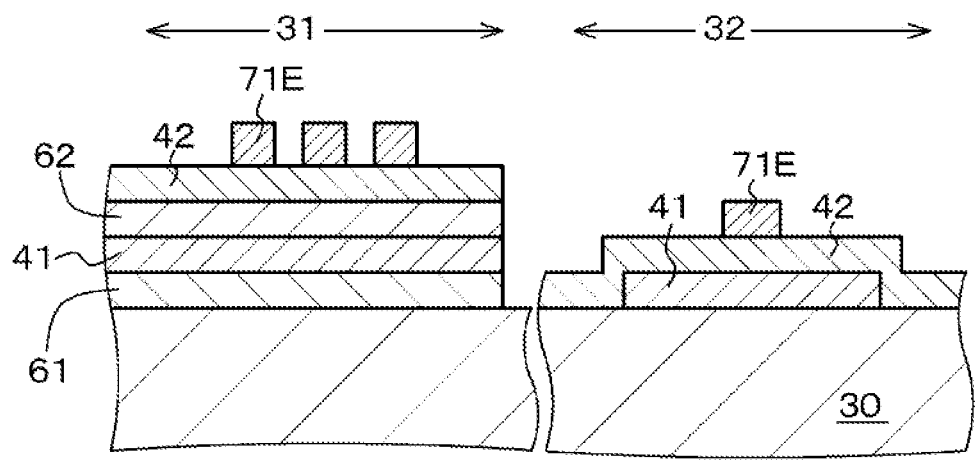
FIGS. 6A and 6B are schematic partial end views of a base and the like for describing a method of manufacturing the semiconductor device according to Example 1, following FIG. 5C.
Figure 6B:
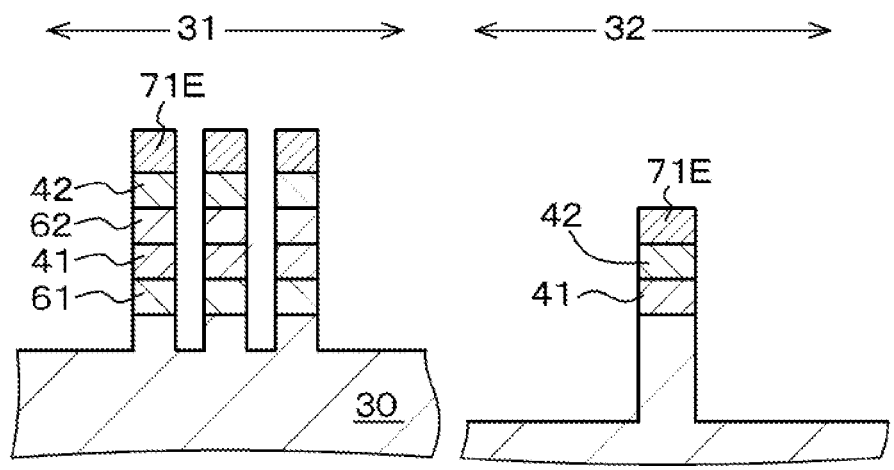

Specifically, an etching resist 71E having a desired resist pattern is formed on the entire surface (see FIG. 6A). Then, the second semiconductor layer 42, the second sacrificial layer 62, the first semiconductor layer 41, and the first sacrificial layer 61 in the first region 31 are patterned and the second semiconductor layer 42 and the first semiconductor layer 41 in the second region 32 are patterned, and further, a part of the base 30 is etched, whereby the structure illustrated in FIG. 6B can be obtained. A nanowire structure or a nanosheet structure is obtained depending on the width of the etching resist 71E.

Along with the above, a source/drain region 27 including the first semiconductor layer 41 and the second semiconductor layer 42 in the second field effect transistor 20 is formed. Furthermore, a source/drain region 17 including the first, semiconductor layer 41, the first sacrificial layer 61, the second semiconductor layer 42, and the second sacrificial layer 62 in the first field effect transistor 10 is formed.

[Process-120B]

Figure 7A:
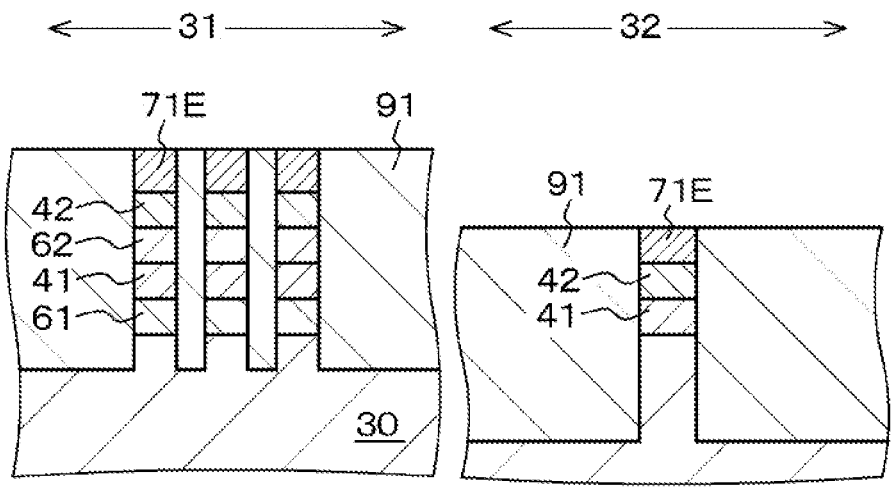
FIGS. 7A and 7B are schematic partial end views of a base and the like for describing a method of manufacturing the semiconductor device according to Example 1, following FIG. 6B.
Figure 7B:
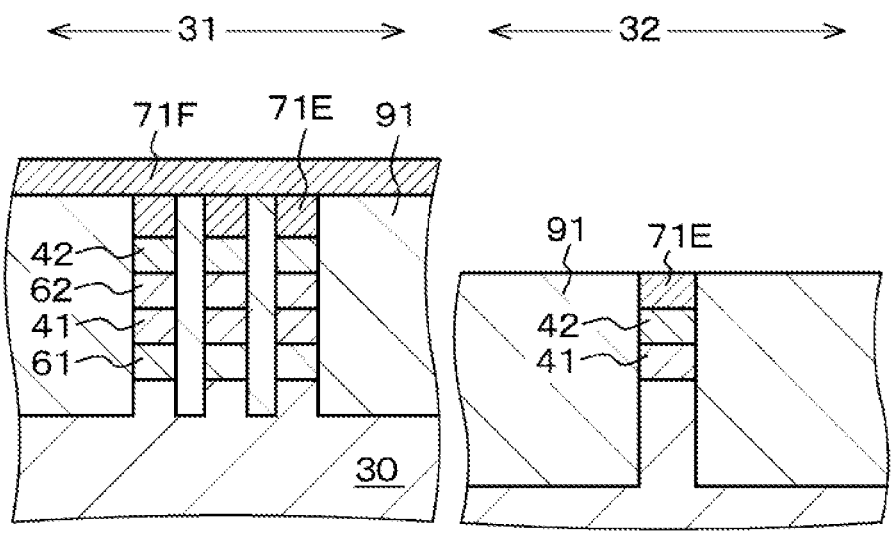
Figure 8A:
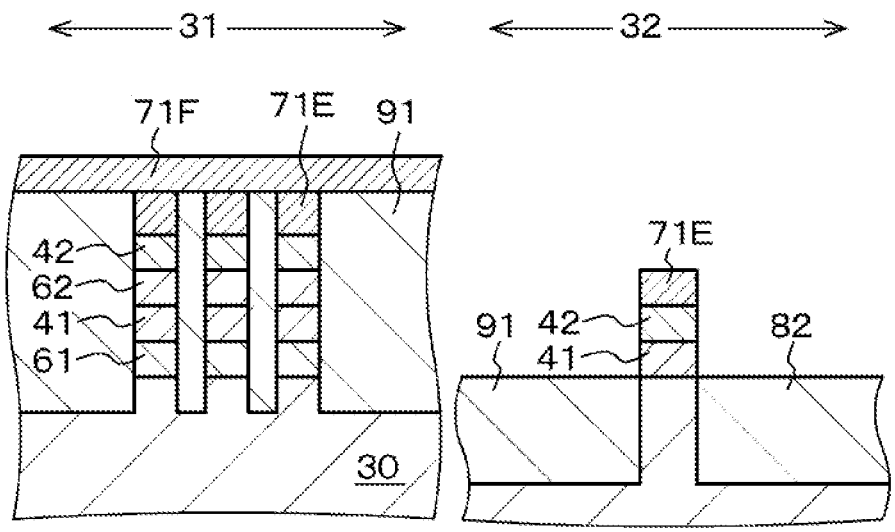
FIGS. 8A and 8B are schematic partial end views of a base and the like for describing a method of manufacturing the semiconductor device according to Example 1, following FIG. 7B.
Figure 8B:
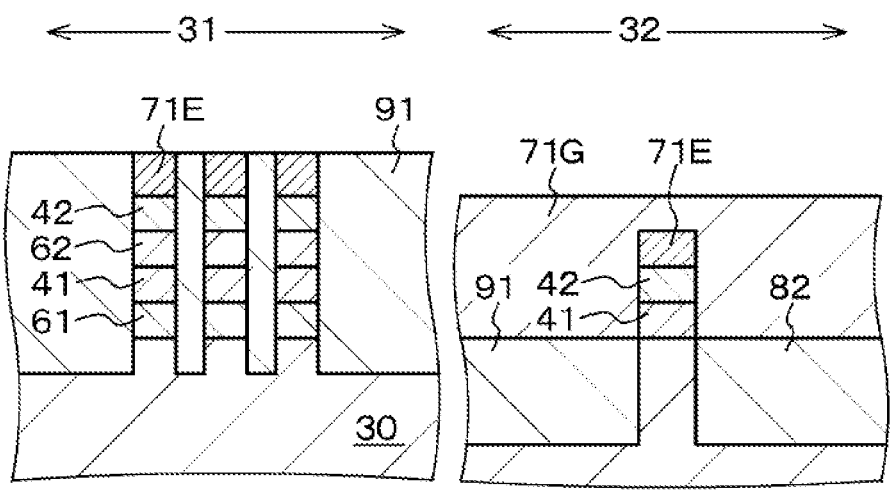
Figure 9A:
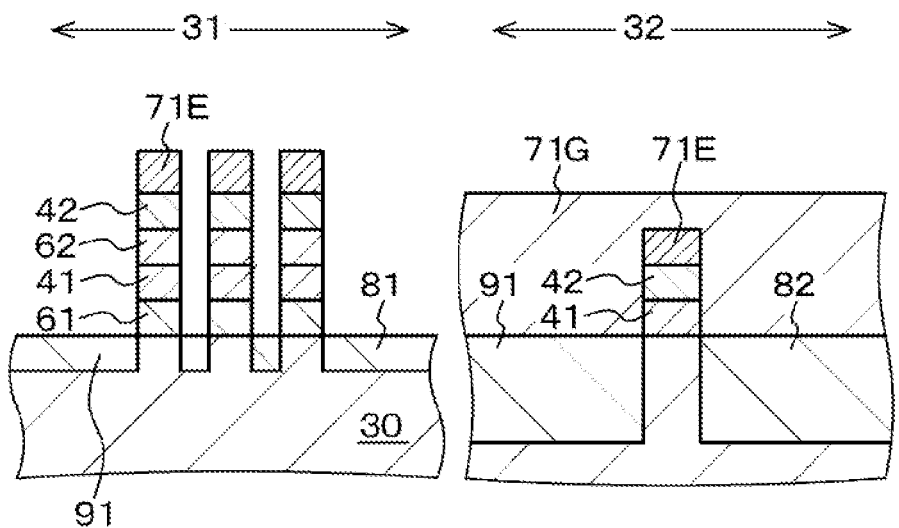
FIGS. 9A and 9B are schematic partial end views of a base and the like for describing a method of manufacturing the semiconductor device according to Example 1, following FIG. 8B.
Figure 9B:
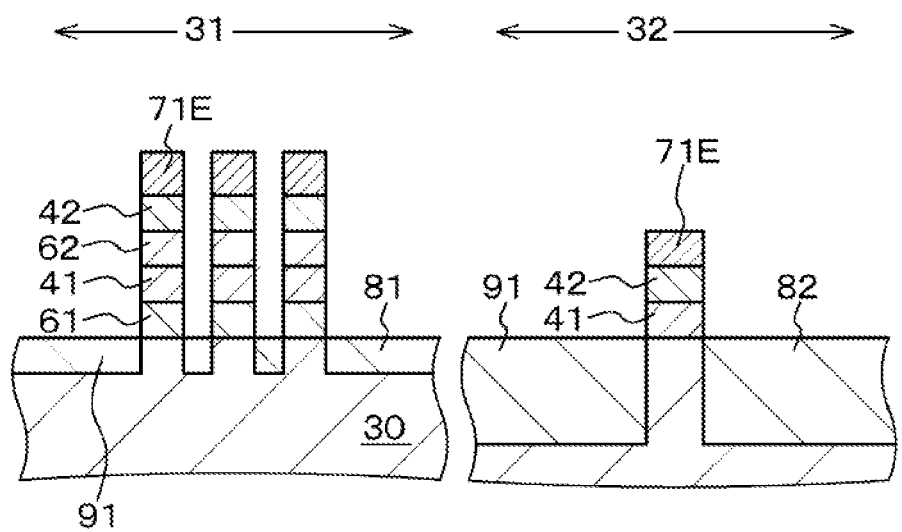

Next, an insulating layer 91 containing $SiO_2$ is formed on the entire surface on the basis of the CVD method, and then flattening processing is performed, whereby the structure illustrated in FIG. 7A can be obtained. Next, an etching resist 71F is formed in the first region 31 (see FIG. 7B) and then the insulating layer 91 in the second region 32 is etched, whereby the structure illustrated in FIG. 8A can be obtained. An element isolation region 82 is formed by embedding a top of the base 30 with the insulating layer 91. Thereafter, the etching resist 71F is removed and an etching resist 71G is formed in the second region 32 (see FIG. 8B), then the insulating layer 91 in the first region 31 is etched (see FIG. 9A), and the etching resist 71G is removed (see FIG. 9B). Then, moreover, the etching resist 71E is removed, whereby the stacked structure body 10" including the second semiconductor layer 42, the second sacrificial layer 62, the first semiconductor layer 41, and the first sacrificial layer 61 can be formed in the first region 31 (see FIG. 10A). An element isolation region 81 is formed by embedding a top of the base 30 with the insulating layer 91.

[Process-120C]

Figure 10A:
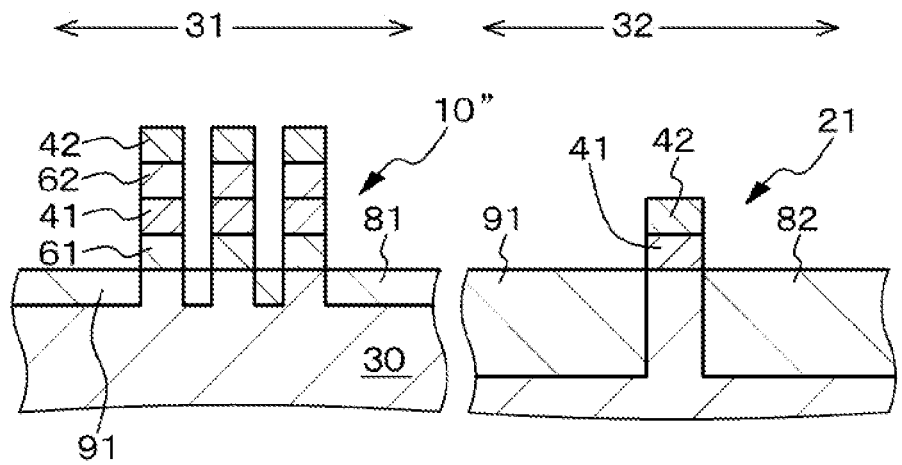
FIGS. 10A and 10B are schematic partial end views of a base and the like for describing a method of manufacturing the semiconductor device according to Example 1, following FIG. 9B.
Figure 10B:
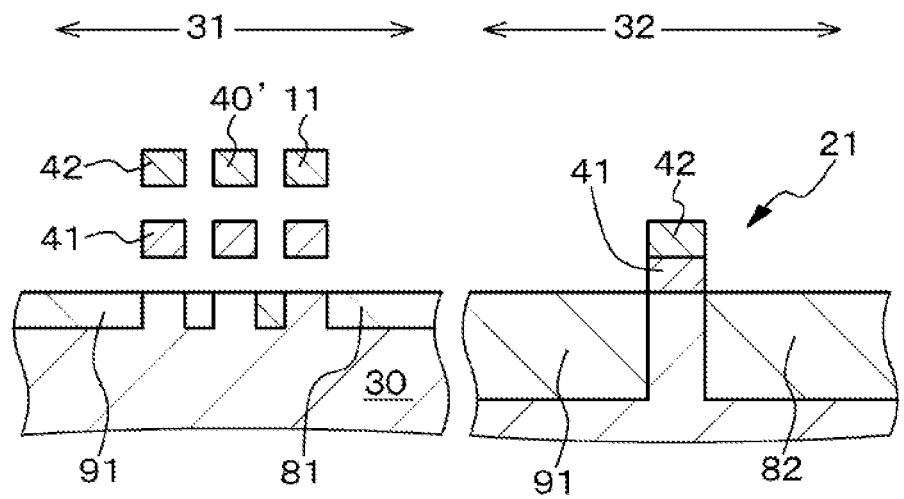

Then, the first sacrificial layer 61 and the second sacrificial layer 62 containing SiGe are removed using an etchant having an etching selectivity for the material (Si) configuring the first semiconductor layer 41 and the second semiconductor layer 42, whereby the structure illustrated in FIG. 10B can be obtained. Both ends of the channel structure unit 11 of the first field effect transistor 10 having the nanowire structure 40' are supported by the source/drain region 17 of the first field effect transistor 10.

In this way, (C-1) a first structure 10' including the source/drain region 17 having the stacked structure body 10", and the channel structure units 11 including the first semiconductor layer 41 and the second semiconductor layer 42 spaced apart from the first semiconductor layer 41, in the first region 31, and (C-2) a second structure 20' including the source/drain region 27 having a stacked structure of the first semiconductor layer 41 and the second semiconductor layer 42, and the channel formation region 21, in the second region 32 can be obtained.

[Process-130]

Thereafter, the gate insulating films 12 and 22 and the gate electrodes 16 and 26 are formed in the channel structure units 11 in the first structure 10' and in the channel formation region 21 in the second structure 20', whereby the first field effect transistor 10 and the second field effect transistor 20 are obtained in the first region 31 and the second region 32, respectively.

[Process-130A]

Figure 11A:
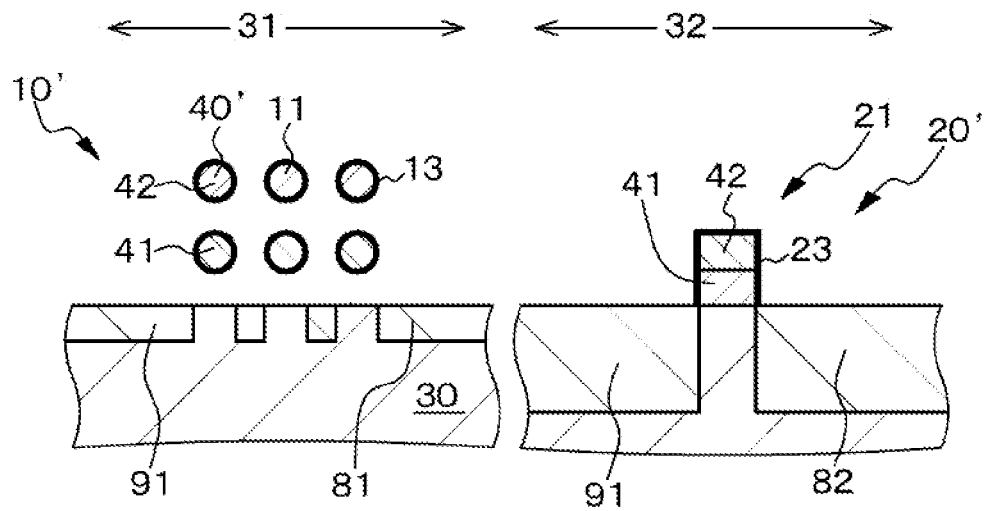
FIGS. 11A and 11B are schematic partial end views a base and the like for describing a method of manufacturing the semiconductor device according to Example 1, following FIG. 10B.
Figure 11B:
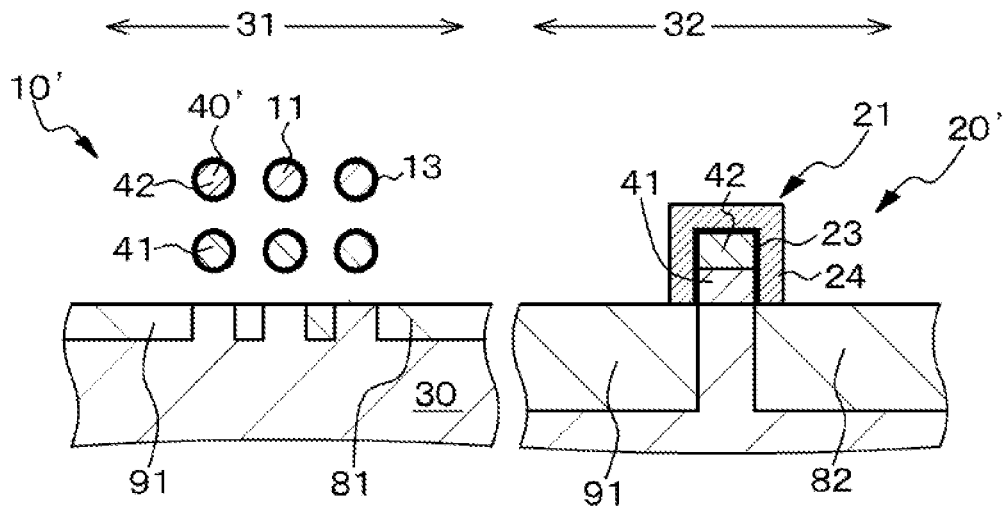

Specifically, first, a resist layer (not illustrated) including a desired resist pattern is formed, and thermal oxidation treatment is performed for the channel structure units 11 of the first structure 10' and the channel formation region 21 of the second structure 20', whereby parts 13 and 23 of the gate insulating films containing SiON are formed (see FIG. 11A). By performing the thermal oxidation treatment, the cross-sectional shape of the channel structure unit of the first field effect transistor having the nanowire structure becomes circular. This similarly applies to the following examples.

[Process-130B]

Next, the resist layer is removed, then a mask layer containing SiN (not illustrated) is formed on the entire surface, the mask layer in the channel formation region 21 is removed, and a part 23 of the gate insulating film formed on the channel formation region 21 is exposed. Then, the thermal oxidation treatment is performed, whereby a part 24 of the gate insulating film containing a thermal oxidation film is formed in the channel formation region 21 of the second structure 20' (see FIG. 11B). Thereafter, the mask layer is removed.

[Process-130C]

Figure 12:
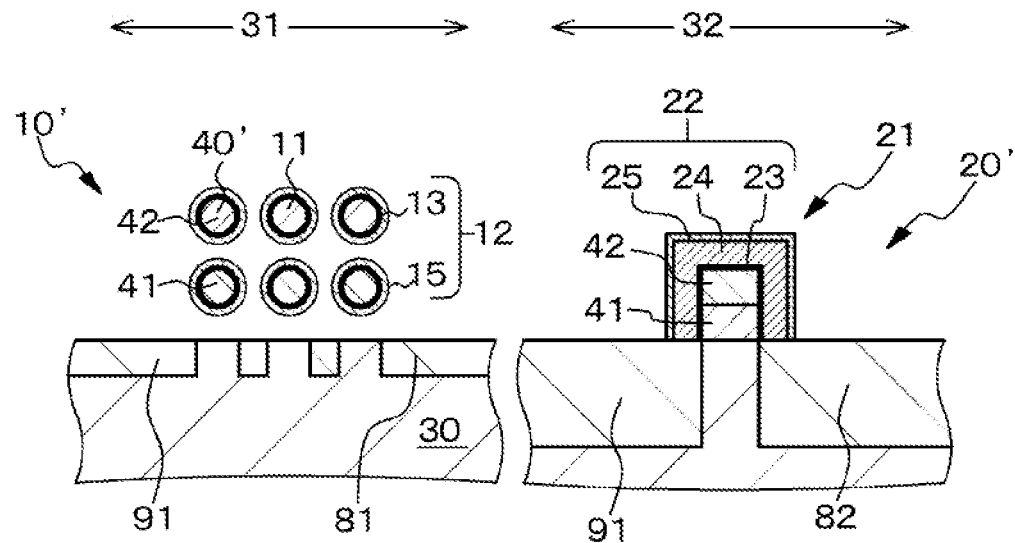
FIG. 12 is a schematic partial end view of a base and the like for describing a method of manufacturing the semiconductor device according to Example 1, following FIG. 11B.

Next, remaining parts 15 and 25 of the gate insulating films containing $HfO_2$ are formed on parts 13 and 24 of the gate insulating films on the basis of an atomic layer deposition (ALD) method (see FIG. 12). The total thickness of the gate insulating films 23, 24, and 25 formed in the channel formation region 21 of the second structure 20' is larger than the thicknesses of the gate insulating films 13 and 15 formed in the channel structure units 11 of the first structure 10'.

[Process-130D]

Thereafter, a material layer configuring the gate electrodes is formed on the entire surface on the basis of the CVD method, and this material layer is patterned, whereby the gate electrodes 16 and 26 are formed on the gate insulating films 12 and 22. Thus, the structure illustrated in FIGS. 1A and 1B can be obtained.

[Process-140]

Next, an insulating layer (not illustrated) is formed on the entire surface, openings are formed in the insulating layer located above the gate electrodes 16 and 26 and the source/drain regions 17 and 27, and connection holes and wirings are only required to be formed through the openings onto the insulating layer.

The semiconductor device according to Example 1 or the semiconductor device obtained by the method of manufacturing the semiconductor device according to Example 1, or semiconductor devices according to Examples 2 to 4 or semiconductor devices obtained by methods of manufacturing the semiconductor devices according to Examples 2 to 4 to be described below have the first field effect transistor having the nanowire structure or the nanosheet structure and the second field effect transistor having the Fin structure. Therefore, a semiconductor device that ran allow coexistence of an FET having a relatively low drive voltage and an FET having a relatively high drive voltage can be provided.

By the way, to implement the first field effect transistor having the nanowire structure provided with the thin gate insulating film end the second field effect transistor having the Fin structure provided with the thick gate insulating film at the same time, it is necessary to deposit an insulating film or to thermally oxidize the channel structure units and the channel formation region. However, in the former case, noise characteristics of the field effect transistors are poor and formation (embedding) of the gate electrodes is difficult. Meanwhile, in the latter case, the nanowire structure becomes narrow and the performance of the field effect transistors deteriorates. To solve the problems, in the semiconductor device according to Example 1 or the semiconductor devices obtained by the methods of manufacturing the semiconductor devices according to the first to third modes of the present disclosure, the channel structure units of the first field effect transistor have a structure different from the channel formation region of the second field effect transistor, and the cross section of the channel formation region of the second field effect transistor can be made larger than the cross sections of the channel structure units of the first field effect transistor. Therefore, when the channel structure units and the channel formation region are thermally oxidized to form the gate insulating film, the thick gate insulating film can be formed in the channel formation region of the second field effect transistor while preventing the nanowire structure from becoming thinner. As a result, a semiconductor device that can allow coexistence of an FET having a relatively low drive voltage and an FET having a relatively high drive voltage can be provided while preventing deterioration of the performance of the first field effect transistor and the second field effect transistor. Furthermore, the channel formation region of the second field effect transistor is configured by the integrated semiconductor layers, and no gap is present between the semiconductor layers configuring the channel formation region, and it is not necessary to fill the gap between the semiconductor layers configuring the channel formation region with the gate electrode. Furthermore, since the thermal oxidation film can be formed, a high-quality insulating film with low interface trap density can be formed, and 1/f noise performance can be improved by one to two digits.

EXAMPLE 2

Example 2 is a modification of Example 1 and relates to a method of manufacturing a semiconductor device according to the second mode of the present disclosure.

Figure 13:
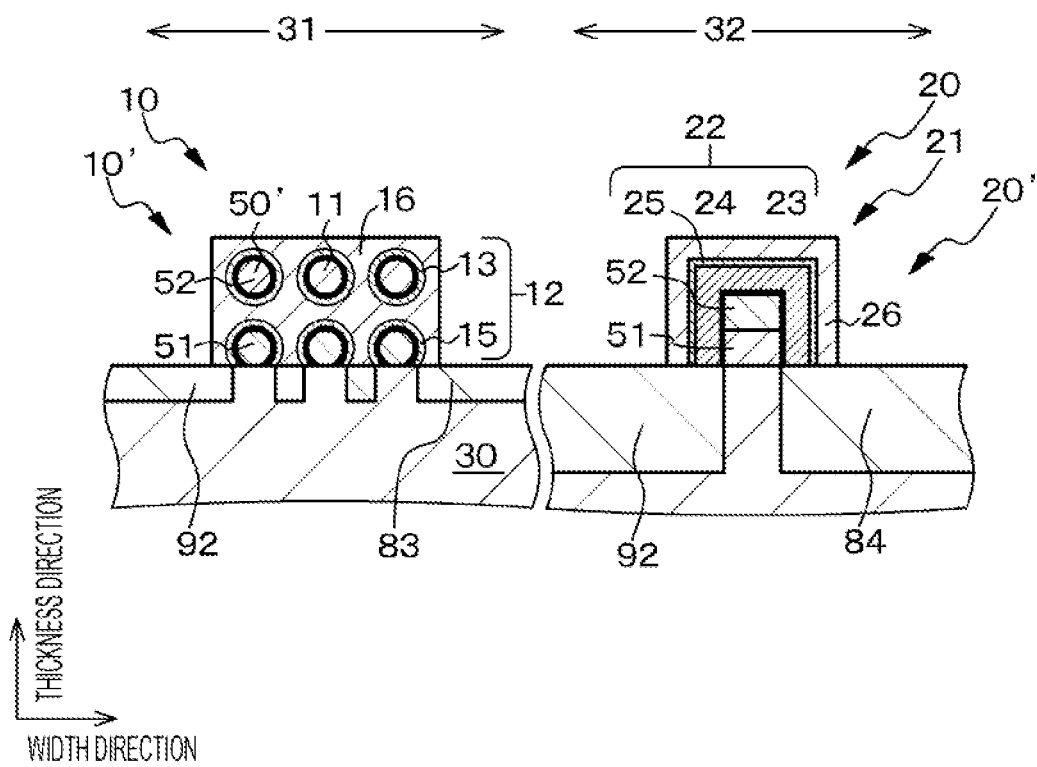
FIG. 13 is a schematic partial cross-sectional view of a semiconductor device according to Example 2.

As a schematic cross-sectional view is illustrated in FIG. 13, the semiconductor device according to Example 2 includes:

a first field effect transistor 10 including at least two channel structure units 11 (two in the thickness direction in the illustrated example) each having a nanowire structure or a nanosheet structure (a nanowire structure 50' in the illustrated example); and a second field effect transistor 20 having a Fin structure, in which the channel structure units 11 are spaced apart from each other in the thickness direction of the first field effect transistor 10. In the illustrated example, one channel structure unit 11 includes three nanowire structures 50' in the width direction. The schematic layout view of elements of the semiconductor device according to Example 2 is similar to the layout view illustrated in FIG. 1B.

In Example 2, a first semiconductor layer 51 and a second semiconductor layer 52 contain SiGe, a sacrificial layer 63 contains Si, and a base 30 includes a silicon semiconductor substrate.

Then, even in the semiconductor device in Example 2, the relationship between the total height $H_L$ of the channel structure units 11 and the height $H_H$ of the channel formation region 21 of the second field effect transistor 20 satisfies:

$$0.90 \leq H_L/H_H \leq 1.04.$$

Specifically, for example,
the nanowire structure 50' has the diameter=9 nm,
$H_L$=18.0 nm, and
$H_H$=18.5 nm.

Furthermore, even in the semiconductor device in Example 2, a gate insulating film 12 and a gate electrode 16 for the first field effect transistor are formed in the channel structure units 11 in the first field effect transistor 10, and a gate insulating film 22 and a gate electrode 26 for the second field effect transistor are formed in the channel formation region 21 in the second field effect transistor 20. That is, in the first field effect transistor 10, the gate insulating film 12 and the gate electrode 16 are formed between the channel structure unit 11 and the channel structure unit 11, and a space between the channel structure unit 11 and the channel structure unit 11 is embedded with the gate insulating film 12 and the gate electrode 16. The first field effect transistor 10 and the second field effect transistor 20 are p-channel field effect transistors. The gate electrodes 16 and 26 contain TiN, gate insulating films 13 and 23 configuring parts of the gate insulating films 12 and 22 contain $SiO_2$, and gate insulating films 15 and 25 configuring rests of the gate insulating films 12 and 22 contain $HfO_2$.

Then, even in the semiconductor device in Example 2, the first field effect transistor 10 is a low withstand voltage/field effect transistor, the second field effect transistor 20 is a high withstand voltage/field effect transistor, the voltage applied to the gate electrode 16 of the first field effect transistor 10 is 0.5 to 0.3 volts, and the voltage applied to the gate electrode 26 of the second field effect transistor 20 is 1.5 to 3 volts.

Hereinafter, a method of manufacturing the semiconductor device according to Example 2 will be described with reference to FIGS. 14A, 14B, 14C, 15A, 15B, 15C, 16A, 165, 16C, 17A, 17B, 18A, 18B, 19A, 19B, 20A, 20B, 21A, 21B, 21C, 22A and 22B. These drawings are schematic partial end views similar to the schematic partial end view taken along arrow A-A in FIG. 1A.

[Process-200]

First, the first semiconductor layer 51 is formed on a first region 31 and a second region 32 of the base 30.

Figure 14A:
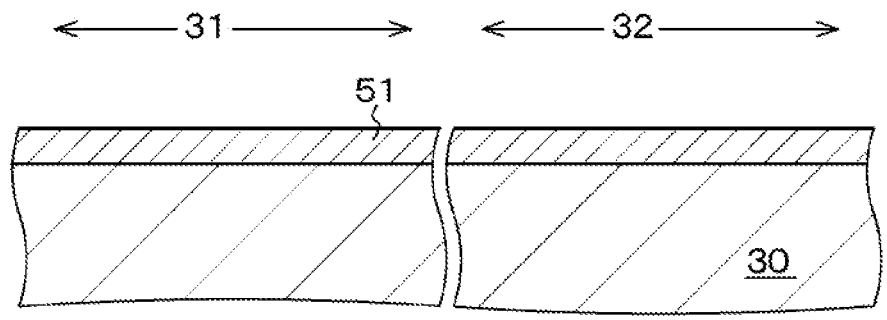
FIGS. 14A, 14B, and 14C are schematic partial end views of a base and the like for describing a method of manufacturing the semiconductor device according to Example 2.
Figure 14B:
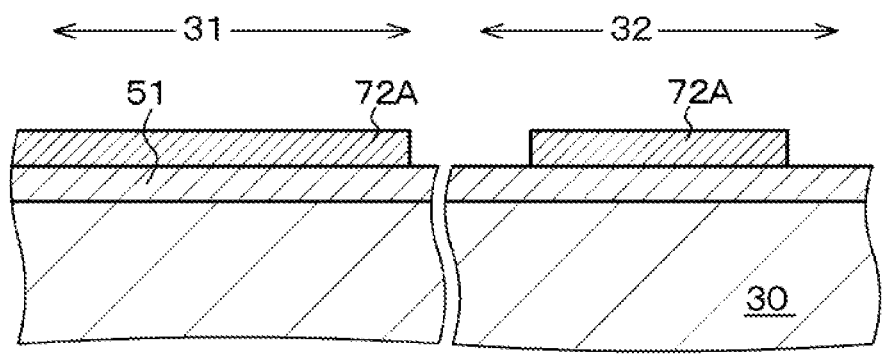
Figure 14C:
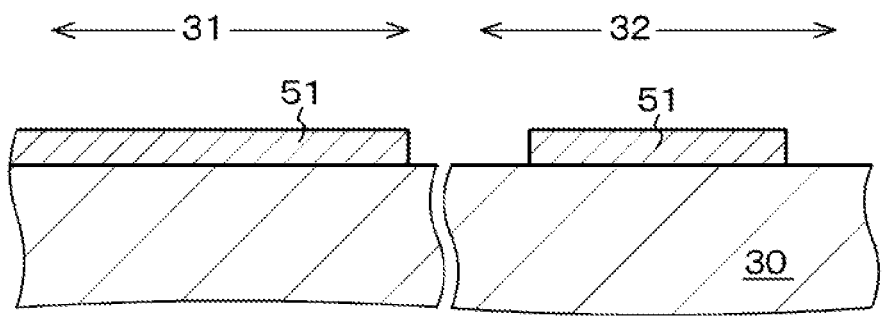

Specifically, first, the first semiconductor layer 51 is formed on the entire surface of the base 30 on the basis of an epitaxial CVD method (see FIG. 14A), and then an etching resist 72A having a desired resist pattern is formed on the first semiconductor layer 51 (see FIG. 14B). Then, the first semiconductor layer 51 on the first region 31 and the second region 32 is patterned, and then the etching resist 72A is removed, whereby the first semiconductor layer 51 can be formed on the first region 31 and on the second region 32 (see FIG. 14C).

[Process-210]

Next, the sacrificial layer 63 is formed on the first semiconductor layer 51, next, the sacrificial layer 63 is removed in the second region 32, the second semiconductor layer 52 is formed on the sacrificial layer 63 in the first region 31, and the second semiconductor layer 52 is formed on the first semiconductor layer 51 in the second region 32.

[Process-210A]

Figure 15A:
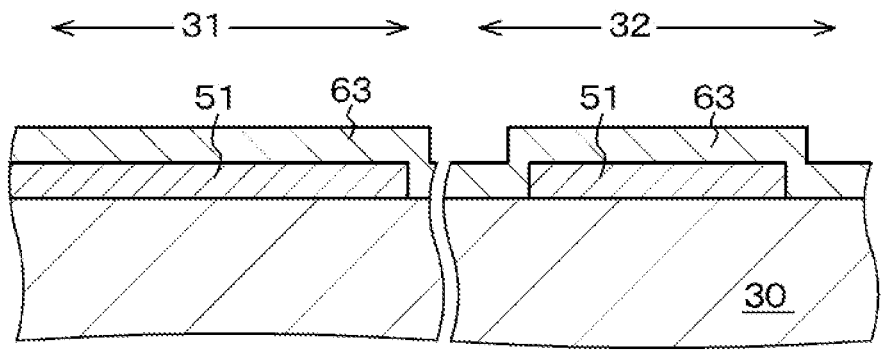
FIGS. 15A, 15B, and 15C are schematic partial end views of a base and the like for describing a method of manufacturing the semiconductor device according to Example 2, following FIG. 14C.
Figure 15B:
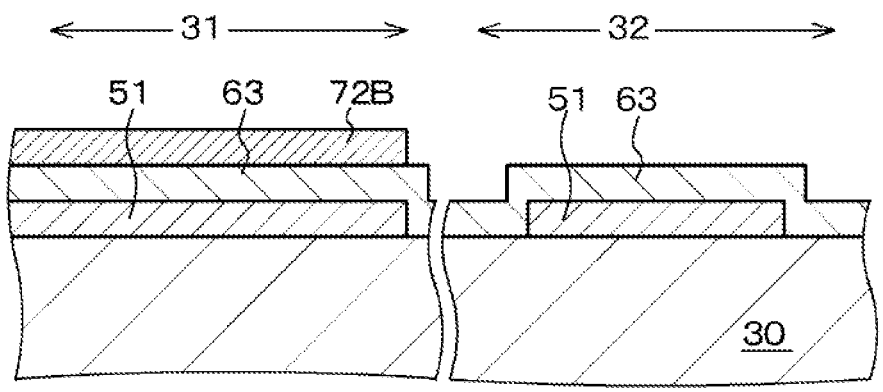
Figure 15C:
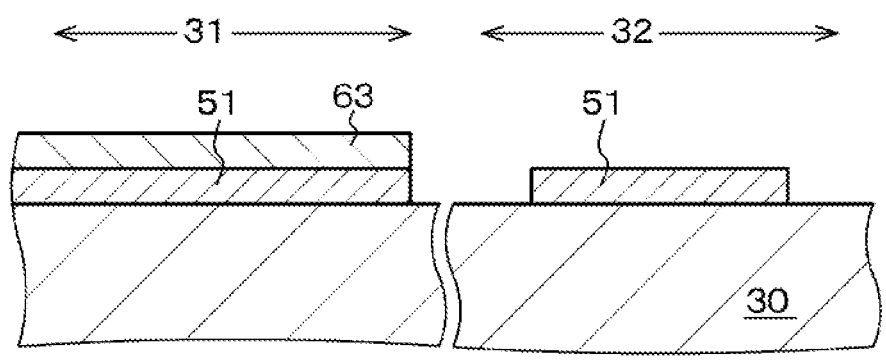
Figure 16A:
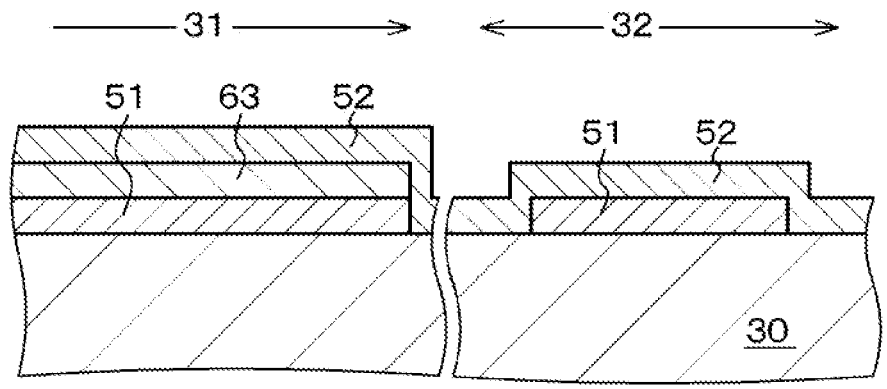
FIGS. 16A, 16B, and 16C are schematic partial end views of a base and the like for describing a method of manufacturing the semiconductor device according to Example 2, following FIG. 15C.
Figure 16B:
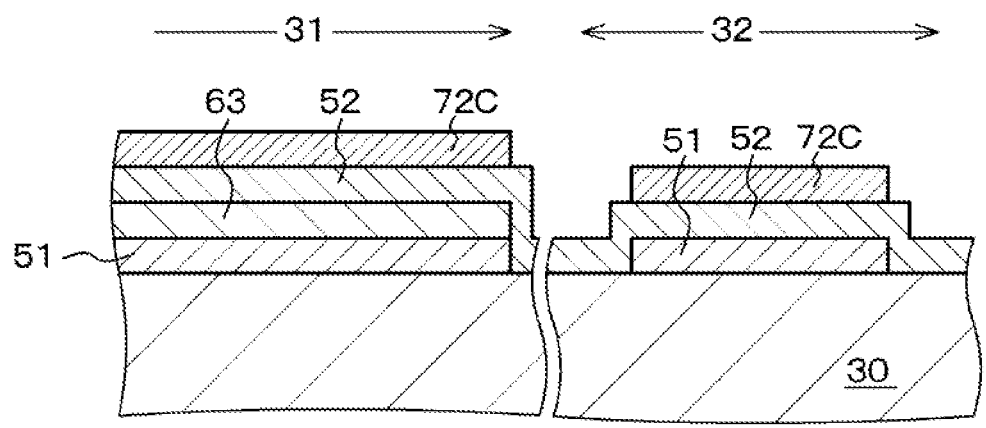
Figure 16C:
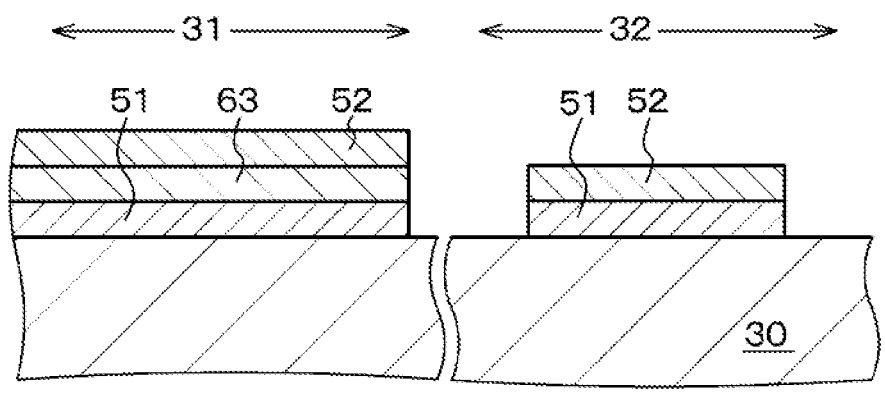

Specifically, the sacrificial layer 63 is formed on the entire surface on the basis of the epitaxial CVD method (see FIG. 15A), and then an etching resist 72B having a desired resist pattern is formed on the sacrificial layer 63 (see FIG. 15B). Then, the sacrificial layer 63 on the first region 31 is patterned and the sacrificial layer 63 on the second region 32 is removed, and then the etching resist 72B is removed, whereby the sacrificial layer 63 can be formed on the first semiconductor layer 51 in the first region 31 (see FIG. 15C).

[Process-210B]

Next, the second semiconductor layer 52 is formed on the entire surface on the basis of the epitaxial CVD method (see FIG. 16A), and then an etching resist 72C having a desired resist pattern is formed on the second semiconductor layer 52 (see FIG. 13B). Then, the second semiconductor layer 52 is patterned and the etching resist 72C is removed, whereby the second semiconductor layer 52 can be formed on the sacrificial layer 63 and on the first semiconductor layer 51 on the second region 32 (see FIG. 16C). In this way, the channel formation region 21 in the second field effect transistor can be formed in the second region 32.

[Process-220]

Thereafter, a stacked structure body 10" including the second semiconductor layer 52, the sacrificial layer 63, and the first semiconductor layer 51 is formed on the first region 31, and next, a part of the sacrificial layer 63 in the stacked structure body 10" is removed.

[Process-220A]

Figure 17A:
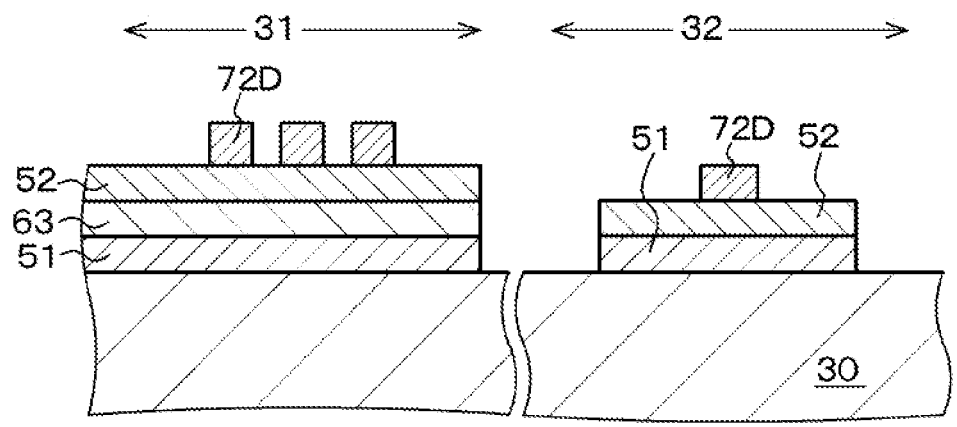
FIGS. 17A and 17B are schematic partial end views of a base and the like for describing a method of manufacturing the semiconductor device according to Example 2, following FIG. 16C.
Figure 17B:
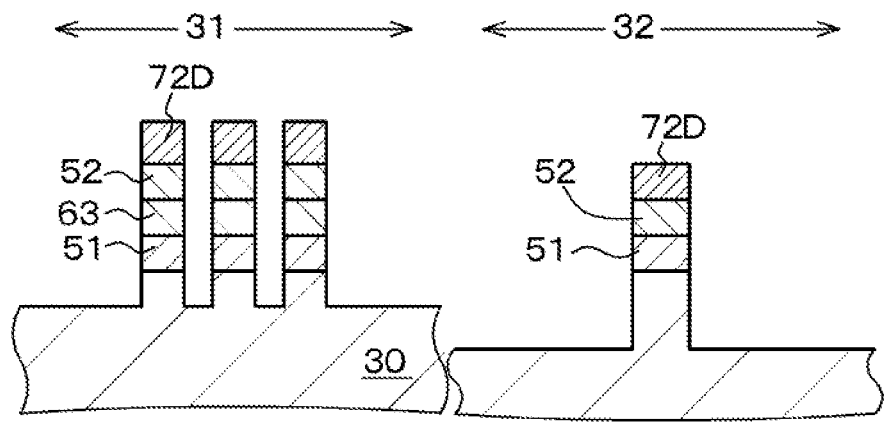

Specifically, an etching resist 72D having a desired resist pattern is formed on the entire surface (see FIG. 17A). Then, the second semiconductor layer 52, the sacrificial layer 63, and the first semiconductor layer 51 in the first region 31 are patterned and the second semiconductor layer 52 and the first semiconductor layer 51 in the second region 32 are patterned, and further, a part of the base 30 is etched, whereby the structure illustrated in FIG. 17B can be obtained.

Along with the above, a source/drain region 27 including the first semiconductor layer 51 and the second semiconductor layer 52 in the second field effect transistor 20 is formed. Furthermore, a source/drain region 17 including the first semiconductor layer 51, the sacrificial layer 63, and the second semiconductor layer 52 in the first field effect transistor 10 is formed.

[Process-220B]

Figure 18A:
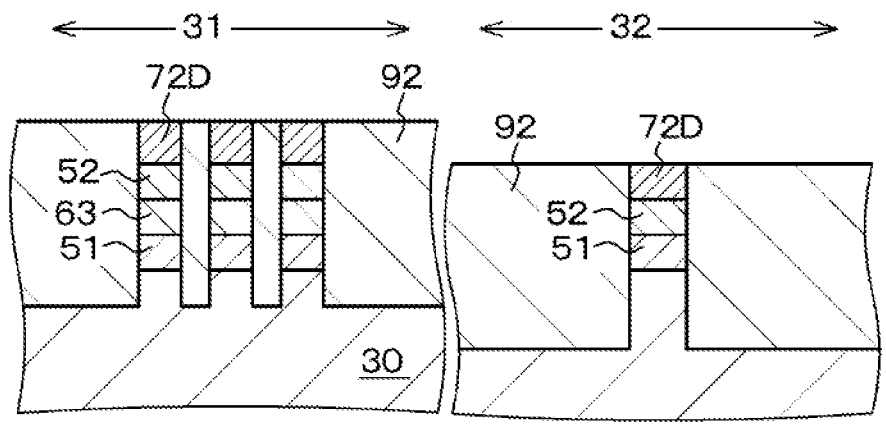
FIGS. 18A and 18B are schematic partial end views of a base and the like for describing a method of manufacturing the semiconductor device according to Example 2, following FIG. 17B.
Figure 18B:
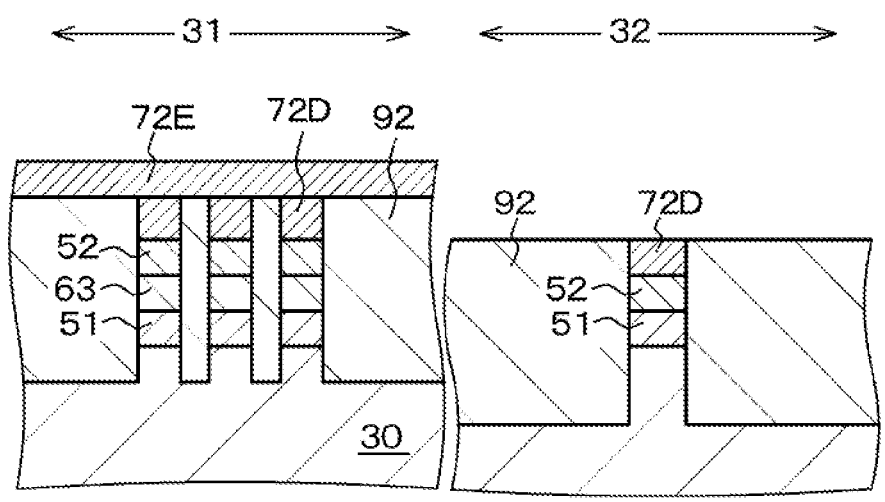
Figure 19A:
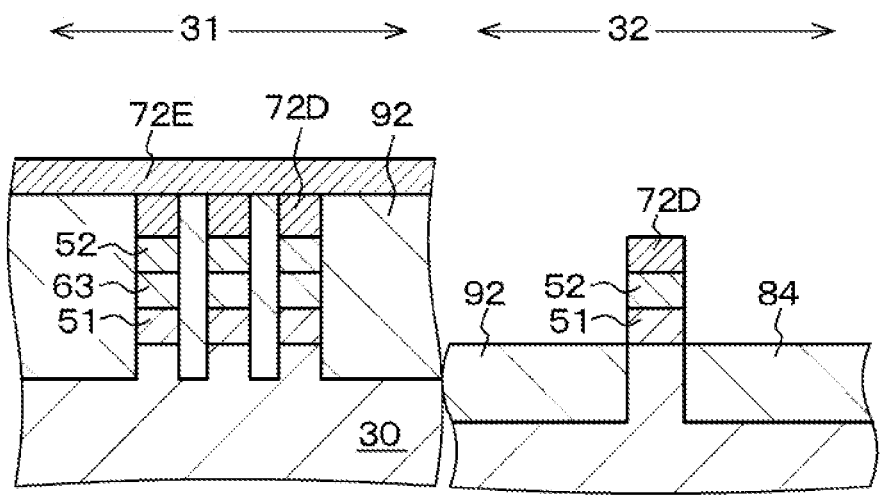
FIGS. 19A and 19B are schematic partial end views of a base and the like for describing a method of manufacturing the semiconductor device according to Example 2, following FIG. 18B.
Figure 19B:
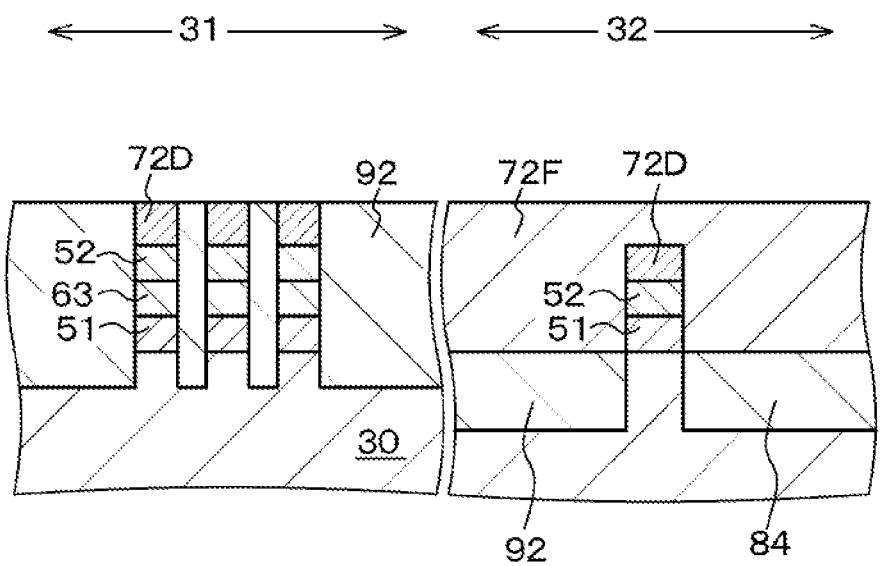
Figure 20A:
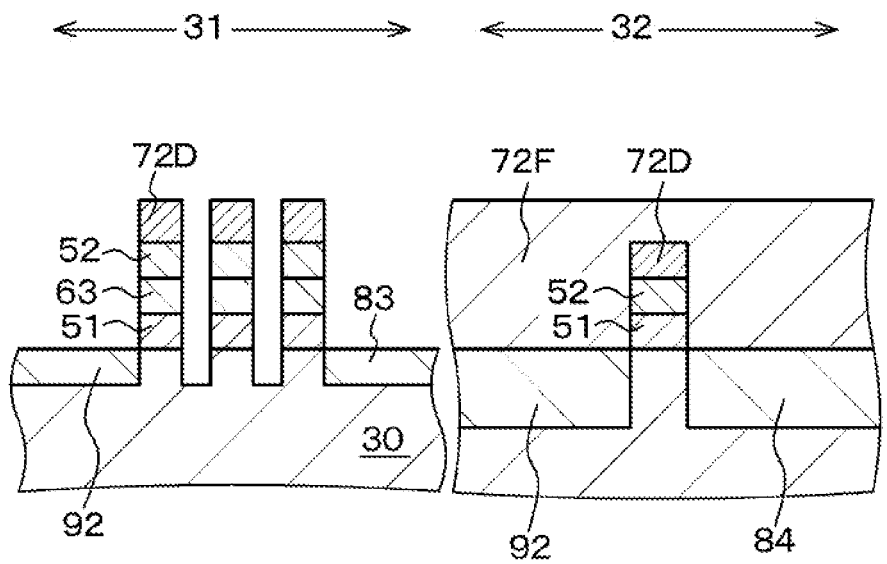
FIGS. 20A and 20B are schematic partial end views of a base and the like for describing a method of manufacturing the semiconductor device according to Example 2, following FIG. 19B.
Figure 20B:
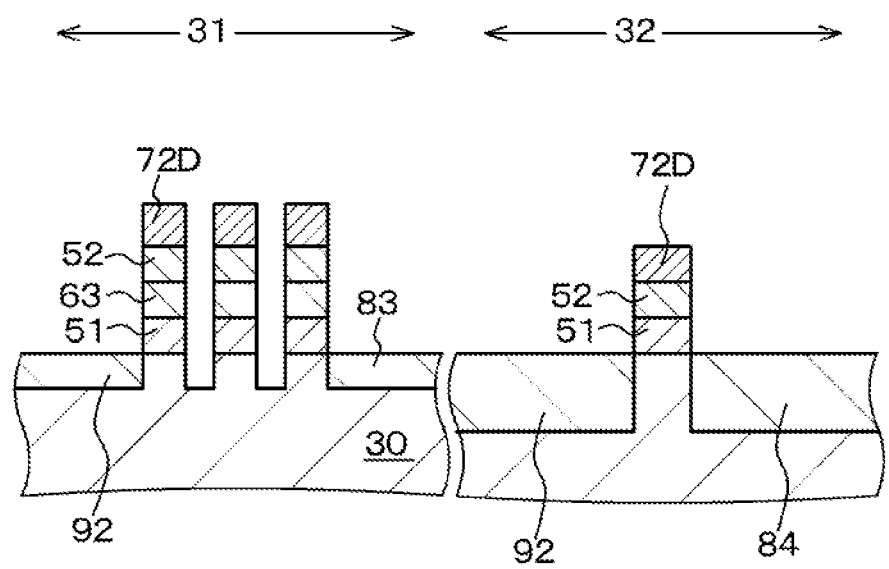
Figure 21A:
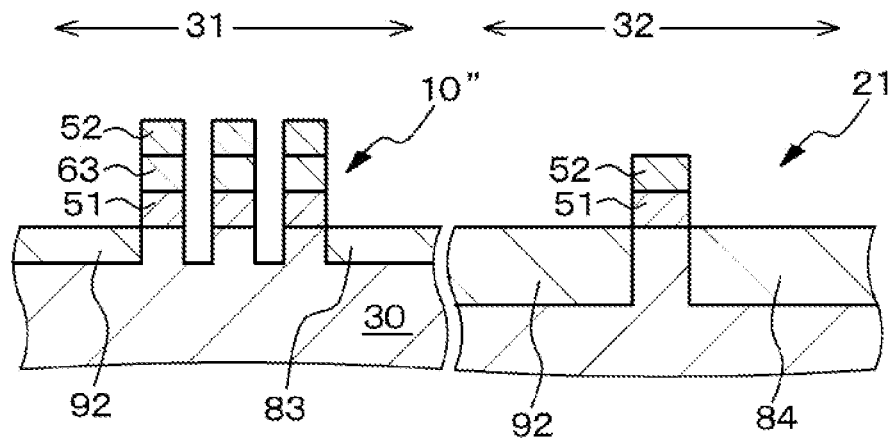
FIGS. 21A, 21B, and 21C are schematic partial end views of a base and the like for describing a method of manufacturing the semiconductor device according to Example 2, following FIG. 20B.

Next, an insulating layer 92 containing $SiO_2$ is formed on the entire surface on the basis of the CVD method, and then flattening processing is performed, whereby the structure illustrated in FIG. 18A can be obtained. Next, an etching resist 72E is formed in the first region 31 (see FIG. 18B) and then the insulating layer 92 in the second region 32 is etched, whereby the structure illustrated in FIG. 19A can be obtained. An element isolation region 84 is formed by embedding a top of the base 30 with the insulating layer 92. Thereafter, the etching resist 72E is removed and an etching resist 72F is formed in the second region 32 (see. FIG. 19B), then the insulating layer 92 in the first region 31 is etched (see FIG. 20A), and the etching resist 72F is removed (see FIG. 20B). Then, moreover, the etching resist 72D is removed, whereby the stacked structure body 10" including the second semiconductor layer 52, the sacrificial layer 63, and the first semiconductor layer 51 can be formed in the first region 31 (see. FIG. 21A). An element isolation region 83 is formed by embedding a top of the base 30 with the insulating layer 92.

[Process-220C]

Figure 21B:
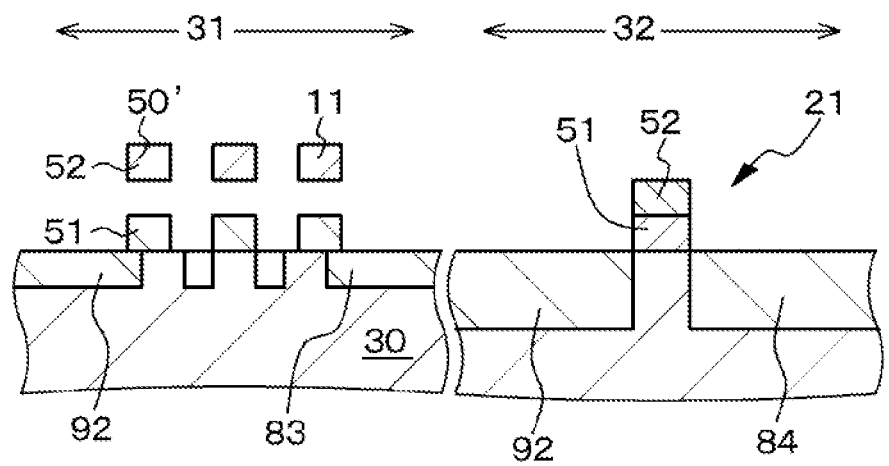

Next, the sacrificial layer 63 containing Si is removed using an etchant having an etching selectivity for the material (SiGe) configuring the first semiconductor layer 51 and the second semiconductor layer 52, whereby the structure illustrated in FIG. 21B can be obtained. Both end of the channel structure unit 11 of the first field effect transistor 10 having the nanowire structure 50' are supported by the source/drain region 17 of the first field effect transistor 10.

In this way, (C-1) a first structure 10' including the source/drain region 17 including the stacked structure body 10", and the channel structure units 11 including the first semiconductor layer 51 and the second semiconductor layer 52 spaced apart from the first semiconductor layer 51, in the first region 31, and (C-2) a second structure 20' including the source/drain region 27 including a stacked structure of the first semiconductor layer 51 and the second semiconductor layer 52, and the channel formation region 21, in the second region 32 can be obtained.

[Process-230]

Thereafter, the gate insulating films 12 and 22 and the gate electrodes 16 and 26 are formed in the channel structure units 11 in the first structure 10' and in the channel formation region 21 in the second structure 20', whereby the first field effect transistor 10 and the second field effect transistor 20 are obtained in the first region 31 and the second region 32, respectively.

[Process-230A]

Figure 21C:
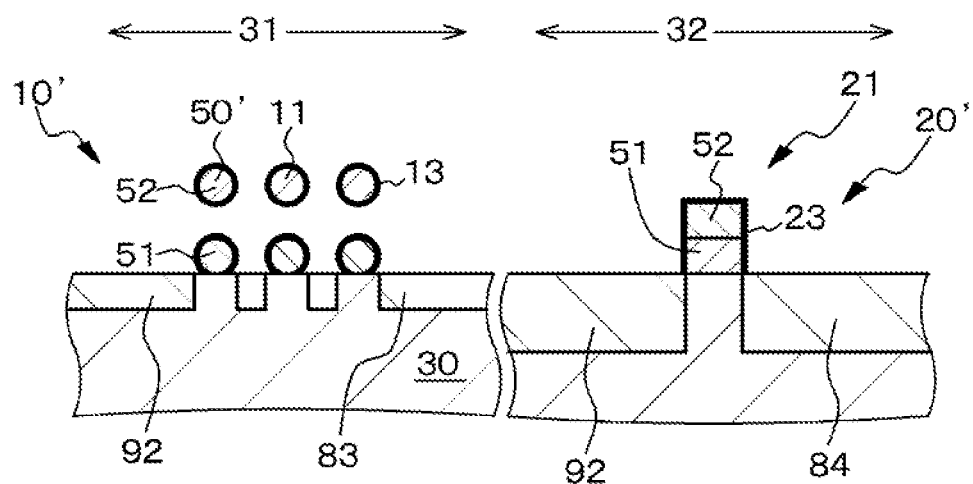

Specifically, first, a resist layer (not illustrated) including a desired resist pattern is formed, and thermal oxidation treatment is performed for the channel structure units 11 of the first structure 10' and the channel formation region 21 of the second structure 20', whereby parts 13 and 23 of the gate insulating films containing SiON are formed (see FIG. 21C).

[Process-230B]

Next, the resist layer is removed, then a mask layer containing SiN (not illustrated) is formed on the entire surface, the mask layer in the channel formation region 21 is removed, and a part 23 of the gate insulating film formed on the channel formation region 21 is exposed. Then, the thermal oxidation treatment is performed, whereby a part 24 of the gate insulating film containing a thermal oxidation film is formed in the channel formation region 21 of the second structure 20' (see FIG. 22A). Thereafter, the mask layer is removed.

[Process-230C]

Figure 22A:
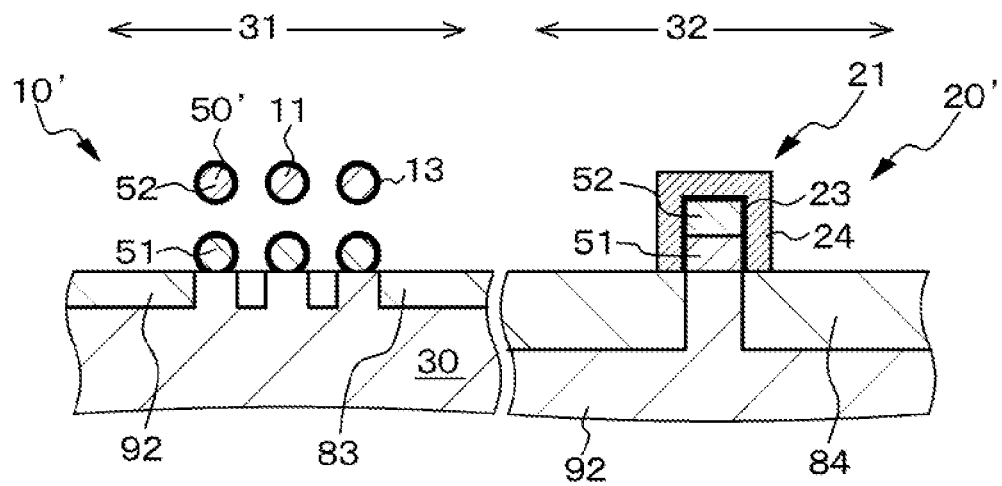
FIGS. 22A and 22B are schematic partial end views of a base and the like for describing a method of manufacturing the semiconductor device according to Example 2, following FIG. 21C.
Figure 22B:
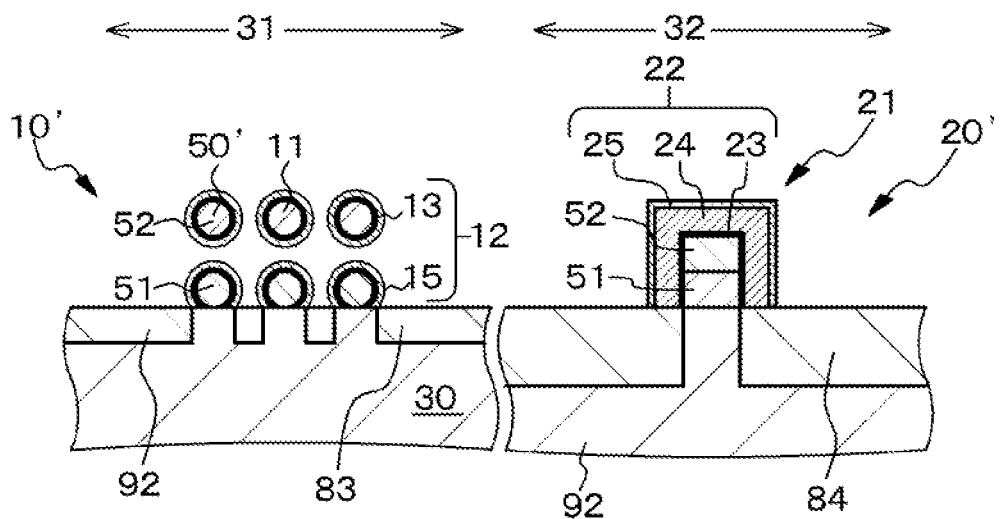

Next, remaining parts 15 and 25 of the gate insulating films containing $HfO_2$ are formed on parts 13 and 24 of the gate insulating films on the basis of the ALD method (see FIG. 22B). The total thickness of the gate insulating films 23, 24, and 25 formed in the channel formation region 21 of the second structure 20' is larger than the thicknesses of the gate insulating films 13 and 15 formed in the channel structure units 11 of the first structure 10'.

[Process-230D]

Thereafter, a material layer containing TiN and configuring the gate electrodes is formed on the entire surface on the basis of the CVD method, and this material layer is patterned, whereby the gate electrodes 16 and 26 are formed on the gate insulating films 12 and 22. Thus, the structure illustrated in FIG. 13 can be obtained.

[Process-240]

Next, an insulating layer (not illustrated) is formed on the entire surface, openings are formed in the insulating layer located above the gate electrodes 16 and 26 and the source/drain regions 17 and 27, and connection holes and wirings are only required to be formed through the openings onto the insulating layer.

EXAMPLE 3

Example 3 is a modification of Examples 1 and 2 and relates to a method of manufacturing a semiconductor device according to the third mode of the present disclosure.

Figure 23:
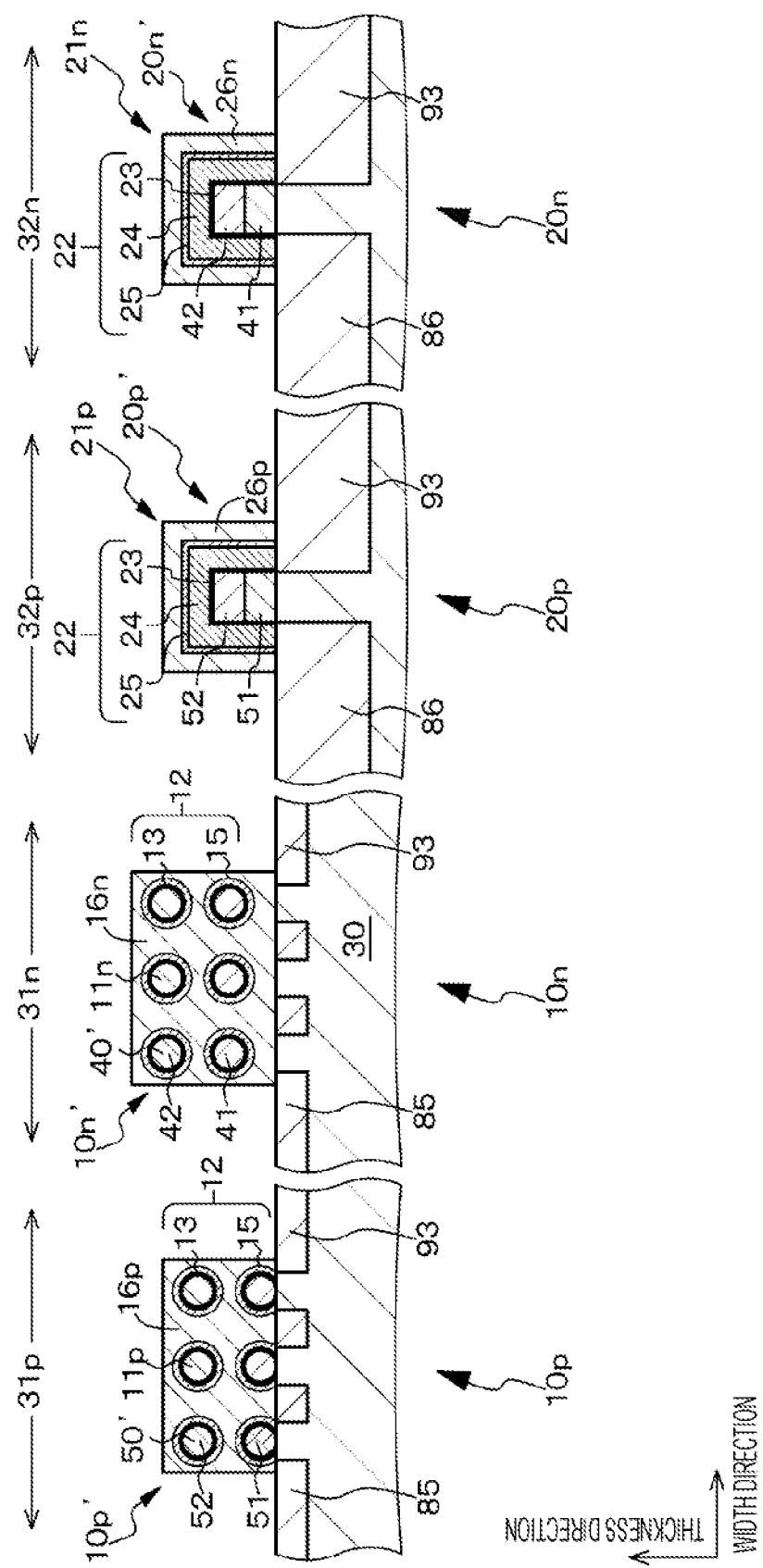
FIG. 23 is a schematic partial cross-sectional view of a semiconductor device according to Example 3.

As a schematic cross-sectional view is illustrated in FIG. 23, in the semiconductor device according to Example 3, a first field effect transistor is configured by a combination of a p-channel first field effect transistor (first A field effect transistor 10p) and an n-channel first field effect transistor (first B field effect transistor 10n). The first A field effect transistor 10p is formed in a first a region 31p, and the first B field effect transistor 10n is formed in a first b region 31n. Channel structure units 11p in one first field effect transistor (specifically, the first A field effect transistor 10p in Example 3), of the p-channel first field effect transistor (first A field effect transistor 10p) and the n-channel first field effect transistor (first B field effect transistor 10n), are formed in odd-numbered levels of layers (a first layer and a third layer), and channel structure units 11n in the other first field effect transistor (specifically, the first B field effect transistor 10n in Example 3) are formed in even-numbered levels of layers (a second layer and a fourth layer). The channel structure unit 11p in the p-channel first field effect transistor (first A field effect transistor 10p) contains SiGe, and the channel structure unit 11n in the n-channel first field effect transistor (first B field effect transistor 10n) contains Si.

Moreover, a gate insulating film 12 and a gate electrode 16p for the first A field effect transistor are formed in the channel structure unit 11p in the first A field effect transistor 10p, a gate insulating film 12 and a gate electrode 16n for the first B field effect transistor are formed in the channel structure unit 11n in the first B field effect transistor 10n, a gate insulating film 22 and a gate electrode 26p for the second A field effect transistor are formed in a channel formation region 21p in a second A field effect transistor 20p, and a gate insulating film 22 and a gate electrode 26n for the second B field effect transistor are formed in a channel formation region 21n in a second B field effect transistor 20n, as described above.

Here, the semiconductor device in Example 3 satisfies:

$$0.91 \leq H_{L-1A}/H_{H-2A} \leq 1.04; \text{ and}$$

$$0.90 \leq H_{L-1B}/H_{H-2B} \leq 1.03,$$

where the total height of the channel structure units 11p of the first A field effect transistor 10p is $H_{L-1A}$, the total height of the channel structure units 11n of the first B field effect transistor 10n is $H_{L-1B}$, the height of the channel formation region 21p of the second A field effect transistor 20p is $H_{H-2A}$, and the height of the channel formation region 21n of the second B field effect transistor 20n is $H_{H-2B}$.

Furthermore, in the semiconductor device according to Example 3, the second field effect transistor 20 is configured by a combination of the p-channel second field effect transistor (second A field effect transistor 20p) and the n-channel second field effect transistor (second B field effect transistor 20n). The second A field effect transistor 20p is formed in a second a region 32p, and the second B field effect transistor 20n is formed in a second b region 32n. The channel formation region 21p in the p-channel second A field effect transistor 20p contains SiGe and the channel formation region 21n in the p-channel second B field effect transistor 20n contains Si. The channel structure units 11p in the first A field effect transistor 10p are formed in odd-numbered levels of layers (a first layer and a third layer), and the channel structure units 11n of the first B field effect transistor 10n are formed in even-numbered levels of layers (a second layer and a fourth layer).

Moreover, in the semiconductor device or the like according to Example 3, the first A field effect transistor 10p and the first B field effect transistor 10n are low withstand voltage/field effect transistors, and the second A field effect transistor 20p and the second B field effect transistor 20n are high withstand voltage/field effect transistors. The voltage applied to the gate electrodes 16p and 16n of the first A field effect transistor 10p and the first B field effect transistor 10n is 0.5 to 0.8 volts, and the voltage applied to the gate electrodes 26p and 26n of the second A field effect transistor 20p and the second B field effect transistor 20n is 1.5 to 3 volts.

Hereinafter, a method of manufacturing the semiconductor device according to Example 3 will be described with reference to FIGS. 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, and 35B. These drawings are schematic partial end views similar to the schematic partial end view taken along arrow A n in FIG. 1A.

[Process-300]

First, in the first a region 31p, the first b region 31n, the second a region 32p, and the second b region 32n of the base 30, a first A semiconductor layer 51 is formed on the first a region 31p, the first b region 31n, and the second a region 32p, and next, a first B semiconductor layer 41 is formed on the first A semiconductor layer 51 in the first a region 31p and the first b region 31n, and on the second b region 32n.

[Process-300A]

Specifically, first, the first A semiconductor layer 51 is formed on the entire surface of the base 30 on the basis of the epitaxial CVD method (see FIG. 24A), and then an etching resist 73A having a desired resist pattern is formed on the first A semiconductor layer 51 in the first a region 31p, the first b region 31n, and the second a region 32p of the base 30 (see FIG. 24B). Then, the first A semiconductor layer 51 on the first a region 31p, the first b region 31n, and the second a region 32p is patterned and the first A semiconductor layer 51 on the second b region 32p is removed, and then the etching resist 73A is removed, whereby the first A semiconductor layer 51 can be formed on the first a region 31p, the first b region 31n, and the second a region 32p (see FIG. 25A).

[Process-300B]

Next, the first B semiconductor layer 41 is formed on the entire surface on the basis of the epitaxial CVD method, and then an etching resist having a desired resist pattern (not illustrated) is formed on the first B semiconductor layer 41. Then, the first B semiconductor layer 41 on the second a region 32p is removed, and then the etching resist is removed. Thus, the structure illustrated in FIG. 25B can be obtained.

[Process-300C]

Thereafter, an etching resist 73B having a desired resist pattern is formed on the first B semiconductor layer 41 on the first a region 31p, the first b region 31n, and the second b region 32n of the base 30, and on the first A semiconductor layer 51 on the second a region 32p (see FIG. 26A). Then, the first B semiconductor layer 41 on the first a region 31p, the first b region 31n, and the second b region 32n of the base 30 is patterned, and then the etching resist 73B is removed, whereby the first B semiconductor layer 41 can be formed on the first A semiconductor layer 51 in the first a region 31p and the first b region 31n and on the second b region 32n (see FIG. 26B).

[Process-310]

Next, a second A semiconductor layer 52 is formed on the first B semiconductor layer 41 in the first a region 31p and the first b region 31n and on the first A semiconductor layer 51 in the second a region 32p, and next, a second B semiconductor layer 42 is formed on the second A semiconductor layer 52 in the first a region 31p and the first b region 31n and on the first B semiconductor layer 41 in the second b region 32n.

[Process-310A]

Figure 27A:
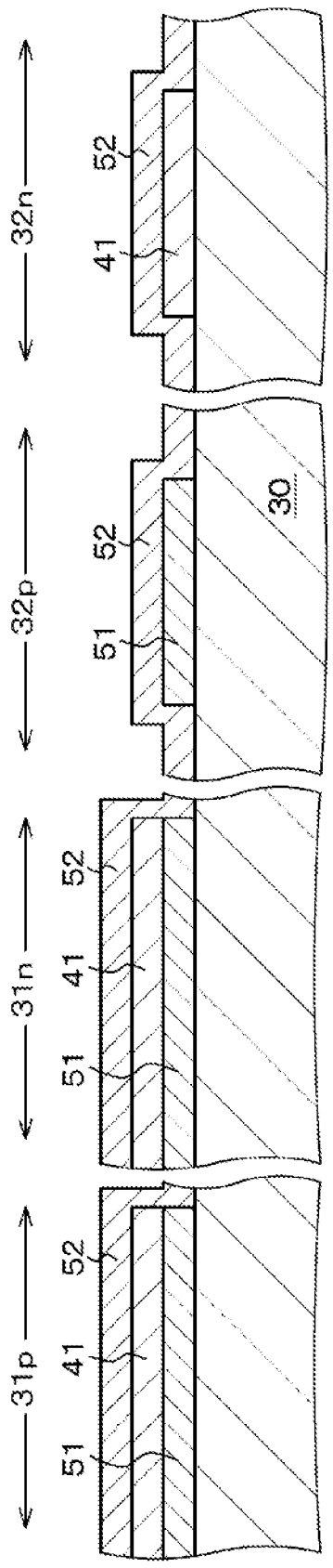
FIGS. 27A and 27B are schematic partial end views of a base and the like for describing a method of manufacturing the semiconductor device according to Example 3, following FIG. 26B.
Figure 27B:
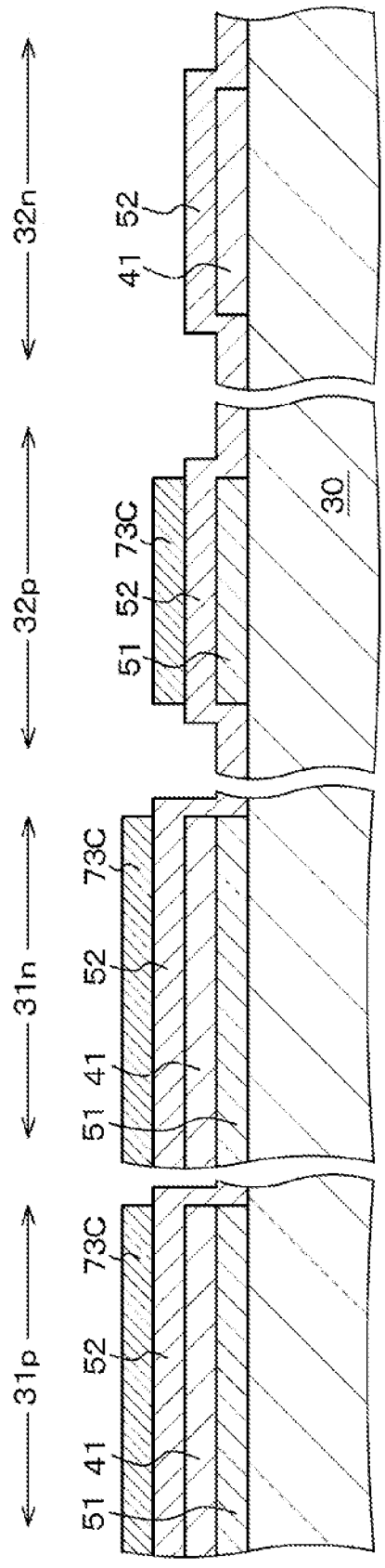

Specifically, the second A semiconductor layer 52 is formed on the entire surface on the basis of the epitaxial CVD method (see FIG. 27A), and then an etching resist 73C having a desired resist pattern is formed on the second A semiconductor layer 52 in the first a region 31p, the first b region 31n, and the second a region 32p of the base 30 (see FIG. 27B). Then, the second A semiconductor layer 52 on the first a region 31p, the first b region 31n, and the second a region 32p is patterned and the second A semiconductor layer 52 on the second b region 32p is removed, and then the etching resist 73C is removed, whereby the second A semiconductor layer 52 can be formed on the first B semiconductor layer 41 in the first a region 31p and the first b region 31n and on the first A semiconductor layer 51 in the second a region 32p (see FIG. 28A).

[Process-310B]

Figure 29A:
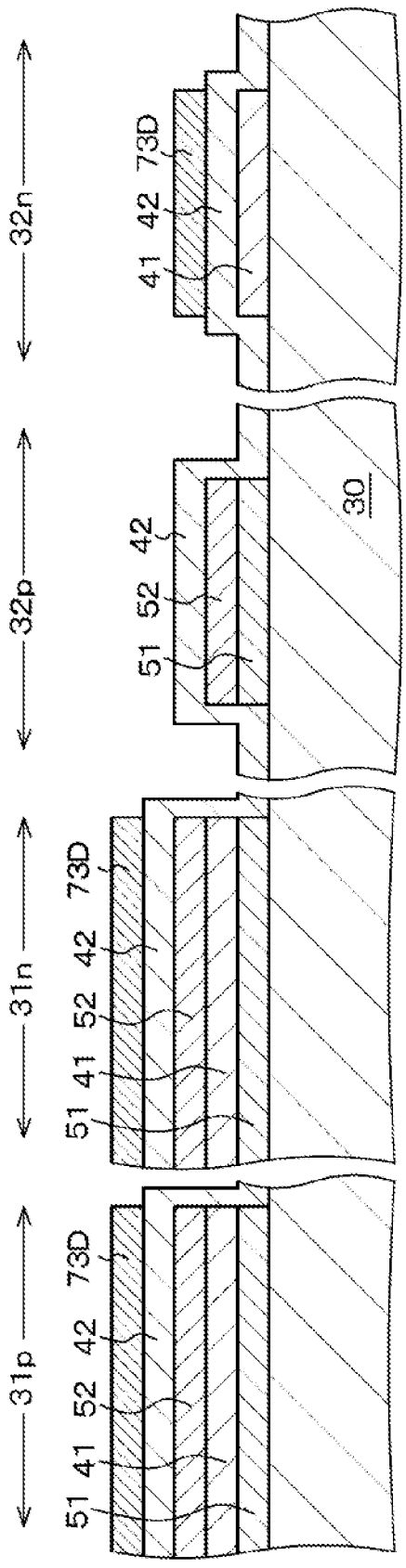
FIGS. 29A and 29B are schematic partial end views of a base and the like for describing a method of manufacturing the semiconductor device according to Example 3, following FIG. 28B.
Figure 29B:
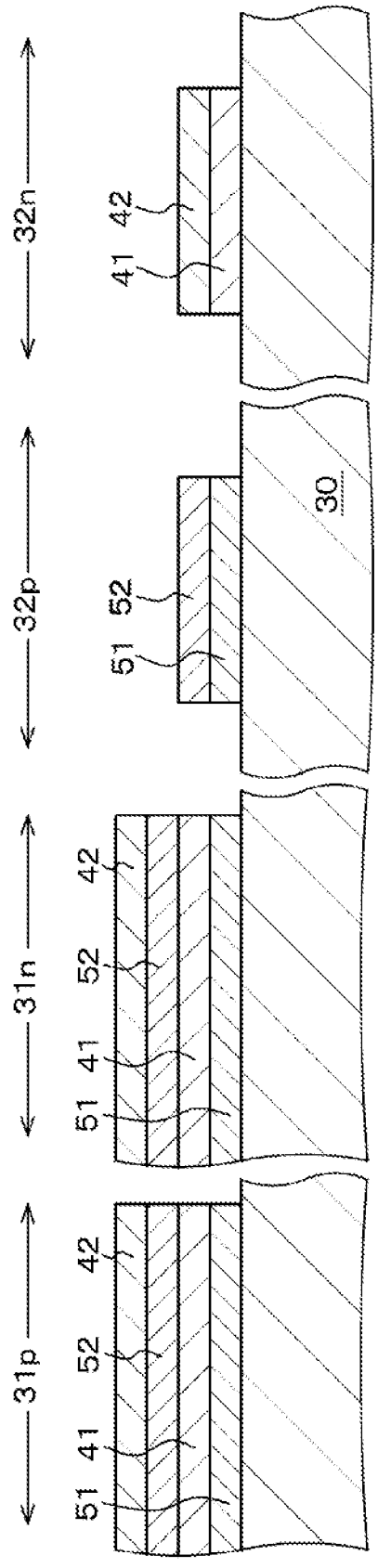

Next, the second B semiconductor layer 42 is formed on the entire surface on the basis of the epitaxial CVD method (see FIG. 28B), and then etching resist 73D having a desired resist pattern is formed on the second B semiconductor layer 42 (see FIG. 29A). Then, the second B semiconductor layer 42 on the first a region 31p, the first b region 31n, and the second b region 32n is patterned, and the second B semiconductor layer 42 on the second a region 32p is removed, and then the etching resist 73D is removed. In this way, the second B semiconductor layer 42 can be formed on the second A semiconductor layer 52 in the first a region 31p and the first b region 31n and on the first B semiconductor layer 41 in the second b region 32n (see FIG. 29B).

[Process-320]

Next, a first stacked structure body 10p" including the second B semiconductor layer 42, the second A semiconductor layer 52, the first B semiconductor layer 41, and the first A semiconductor layer 51 is formed in the first a region 31p, and a second stacked structure body 10n" including the second B semiconductor layer 42, the second A semiconductor layer 52, the first B semiconductor layer 41, and the first A semiconductor layer 51 is formed in the first b region 31n.

[Process-320A]

Specifically, an etching resist 73E having a desired resist pattern is formed on the entire surface (see FIG. 30A), then the second B semiconductor layer 42, the second A semiconductor layer 52, the first B semiconductor layer 41, and the first A semiconductor layer 51 in the first a region 31p, the first b region 31n, the second a region 32p, and the second a region 31n are patterned, and moreover, a part of the base 30 is etched, whereby the structure illustrated in FIG. 30B can be obtained.

Along with the above, a source/drain region 27 including the first A semiconductor layer 51 and the second A semiconductor layer 52 in the second A field effect transistor 20p and a source/drain region 27 including the first B semiconductor layer 41 and the second B semiconductor layer 42 in the second B field effect transistor 20n are formed. Furthermore, a source/drain region 17 including the first A semiconductor layer 51, the first 3 semiconductor layer 41, the second A semiconductor layer 51, and the second B semiconductor layer 42 in the first A field effect transistor 10p and the first B field effect transistor 10n is formed.

[Process-320B]

Figure 31A:
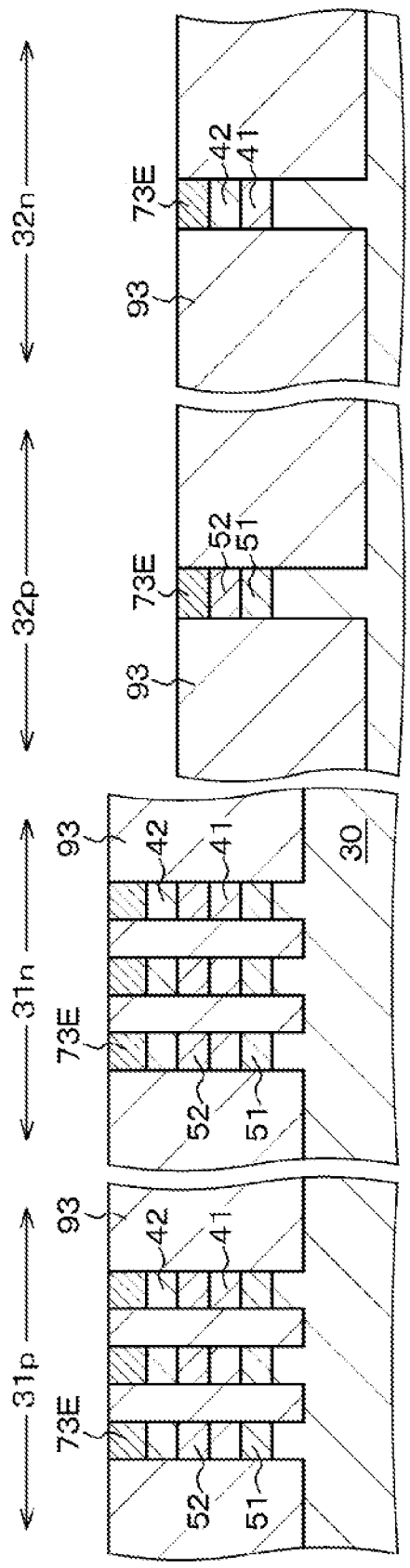
FIGS. 31A and 31B are schematic partial end views of a base and the like for describing a method of manufacturing the semiconductor device according to Example 3, following FIG. 30B.
Figure 31B:
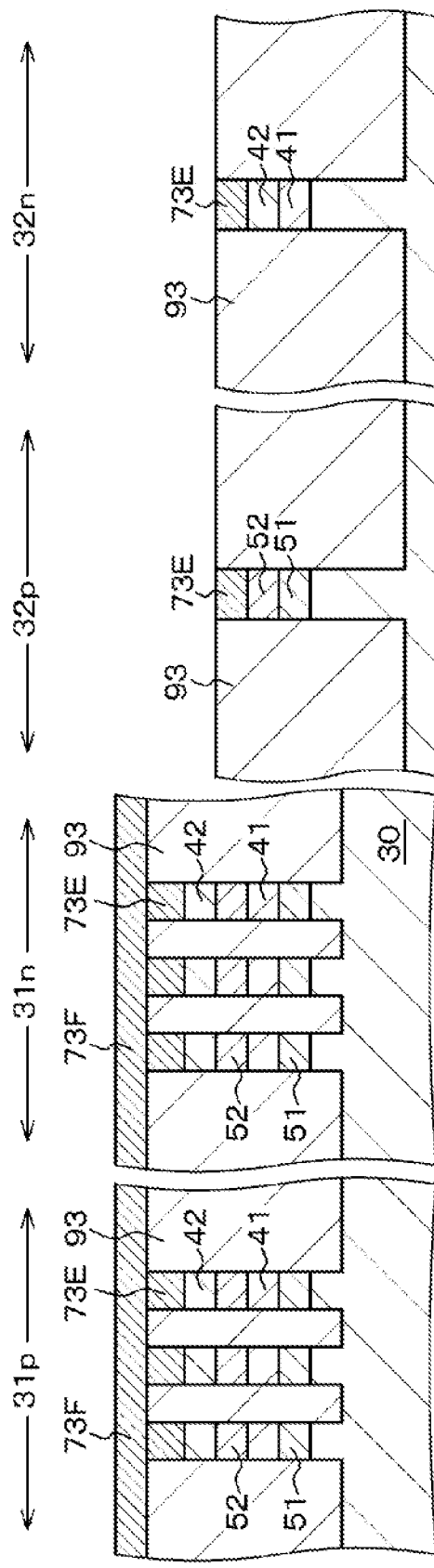
Figure 32A:
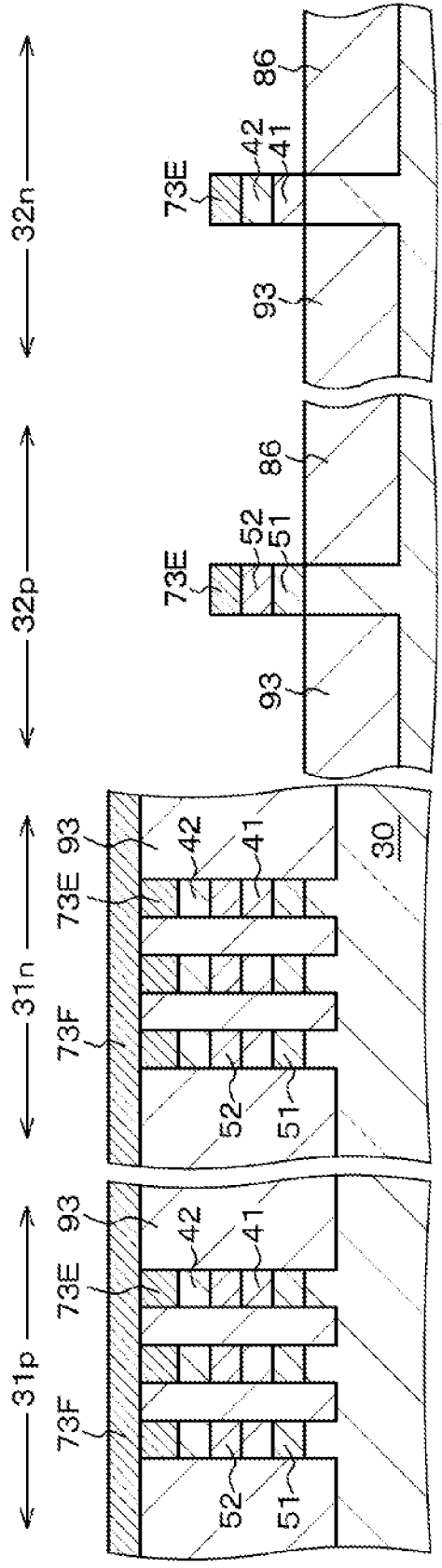
FIGS. 32A and 32B are schematic partial end views of a base and the like for describing a method of manufacturing the semiconductor device according to Example 3, following FIG. 31B.
Figure 32B:
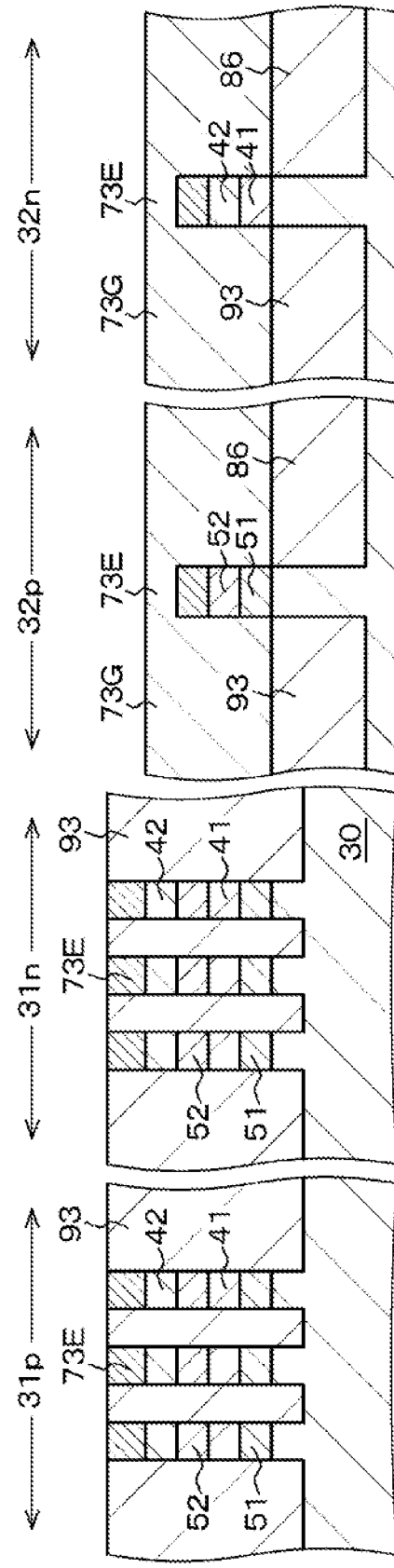
Figure 33A:
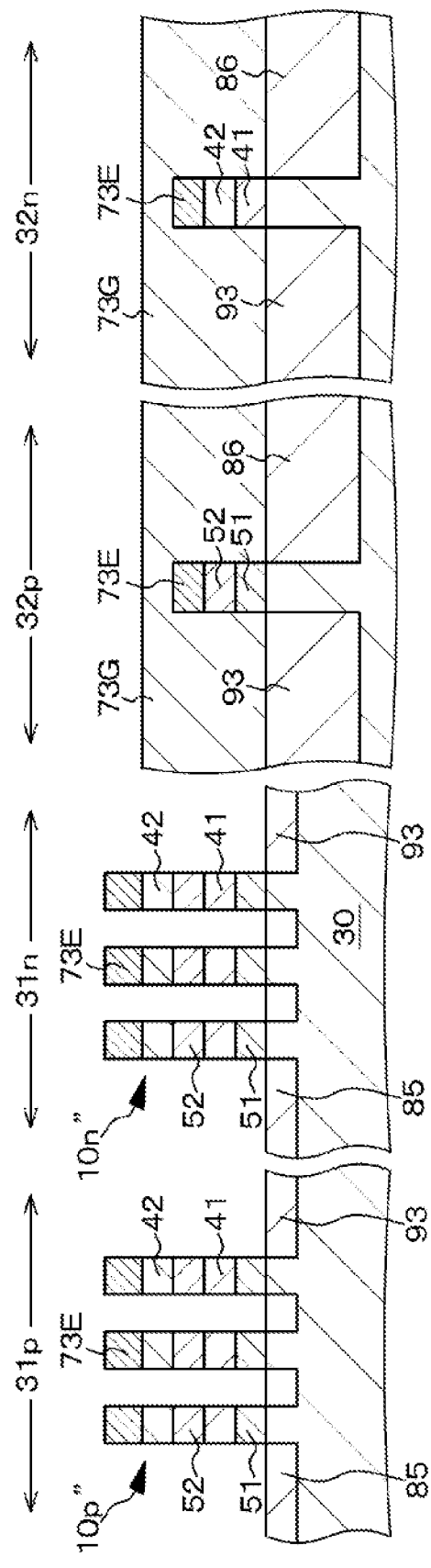
FIGS. 33A and 33B are schematic partial end views of a base and the like for describing a method of manufacturing the semiconductor device according to Example 3, following FIG. 32B.
Figure 33B:
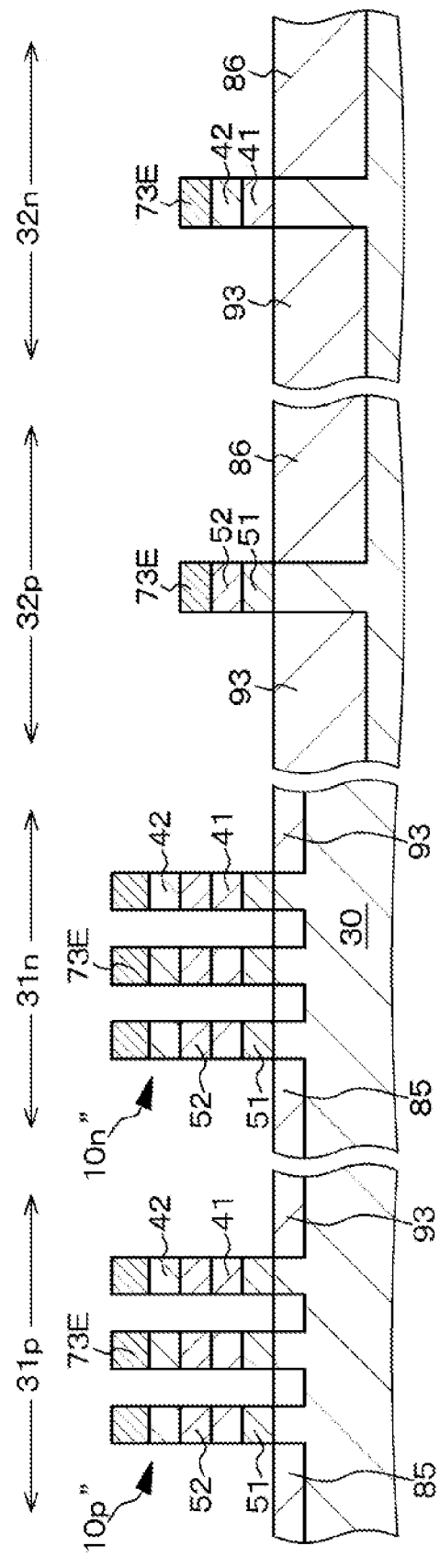

Next, an insulating layer 93 containing $SiO_2$ is formed on the entire surface on the basis of the CVD method, and then flattening processing is performed, whereby the structure illustrated in FIG. 31A can be obtained. Next, an etching resist 73F is formed in the first a region 31p and the first b region 31n (see FIG. 31B), and then the insulating layer 93 in the second a region 32p and the second b region 32n is etched, whereby the structure illustrated in FIG. 32A can be obtained. An element isolation region 86 is formed by embedding a top of the base 30 with the insulating layer 93. Thereafter, the etching resist 73F is removed, and an etching resist 73G is formed in the second a region 32p and the second b region 32n (see FIG. 32B), the insulating layer 93 in the first a region 31p and the first b region 31n is etched (see FIG. 33A), and the etching resist 73G is removed, whereby the structure illustrated in FIG. 33B can be obtained. Then, the etching resist 73E is removed, whereby second stacked structure bodies 10p" and 10n" including the second B semiconductor layer 42, the second A semiconductor layer 52, the first B semiconductor layer 41, and the first A semiconductor layer 51 can be formed in the first a region 31p and the first b region 31n (see FIG. 34A). An element isolation region 85 is formed by embedding a top of the base 30 with the insulating layer 93.

[Process-330]

Next, parts of the second B semiconductor layer 42 and the first B semiconductor layer 41 in the first stacked structure body 10p'' are removed in the first a region 31p, and parts of the second A semiconductor layer 52 and the first A semiconductor layer 51 in the second stacked structure body 10n'' are removed in the first b region 31n.

Figure 34A:
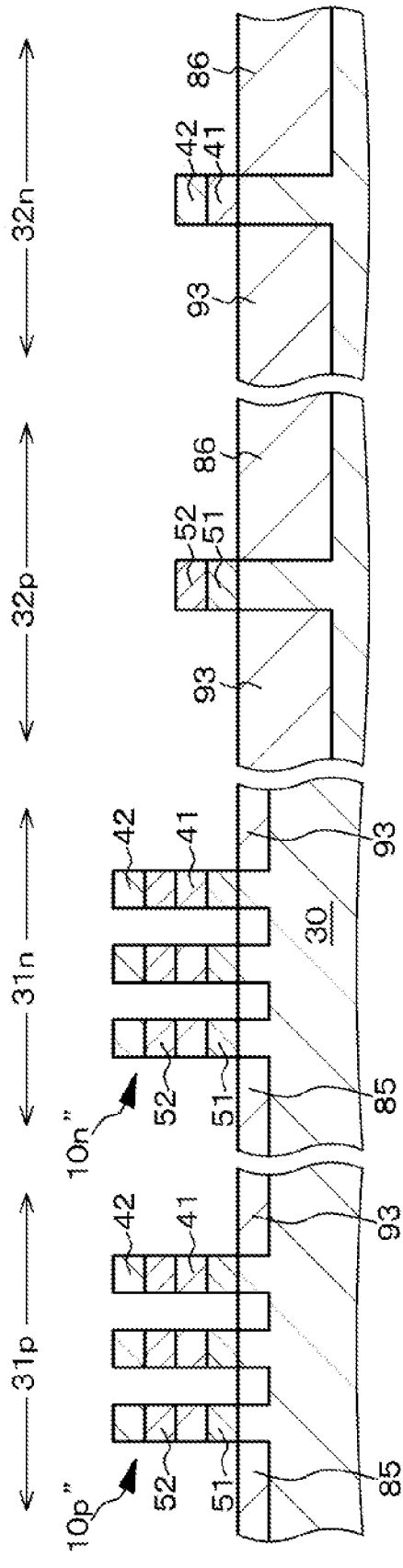
FIGS. 34A and 34B are schematic partial end views of a base and the like for describing a method of manufacturing the semiconductor device according to Example 3, following FIG. 33B.
Figure 34B:
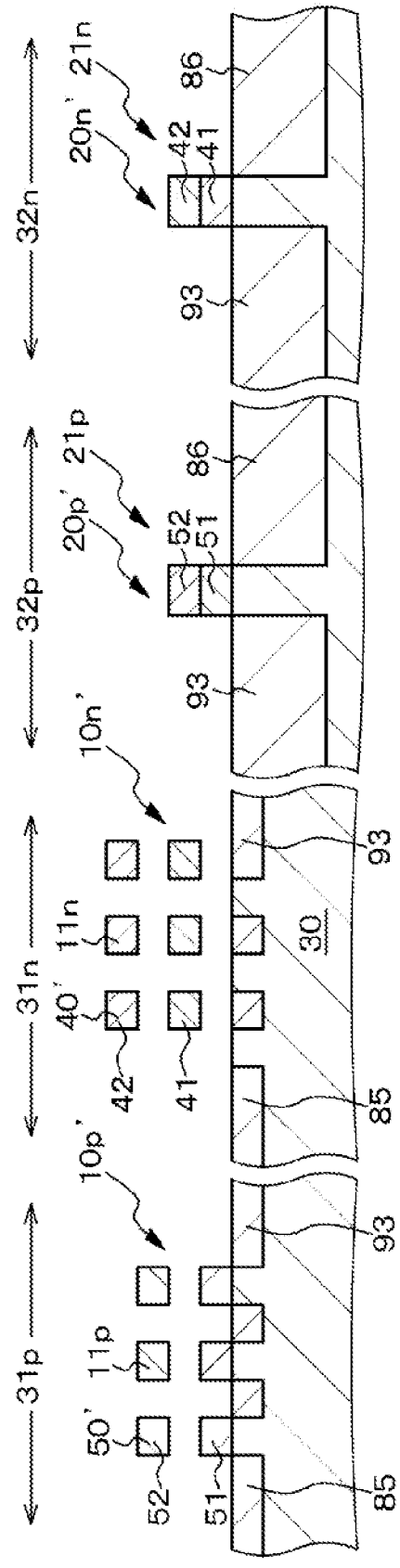

Specifically, the first B semiconductor layer 41 and the second B semiconductor layer 42 containing Si are removed using an etchant having an etching selectivity for the material (SiGe) configuring the first A semiconductor layer 51 and the second A semiconductor layer 52, and the first A semiconductor layer 51 and the second A semiconductor layer 52 containing SiGe are removed using an etchant having an etching selectivity for the material (Si) configuring the first B semiconductor layer 41 and the second B semiconductor layer 42, whereby the structure illustrated in FIG. 34B can be obtained. Both ends of the channel structure units 11p and 11n of the first A field effect transistor 10p and the first B field effect transistor 10n including the nanowire structures 40' and 50' are supported by the source/drain regions 17 of the first A field effect transistor 10p and the first B field effect transistor 10n.

In this way, (D-1) a first A structure 10p' including the source/drain region 17 having the first stacked structure body 10p'', and the channel structure units 11p including the first A semiconductor layer 51 and the second A semiconductor layer 52 spaced apart from the first A semiconductor layer 51, in the first a region 31p, (D-2) a first B structure 10n' including the source/drain region 17 having the second stacked structure body 10n'', and the channel structure units 11n including the first B semiconductor layer 41 and the second B semiconductor layer 42 spaced apart from the first B semiconductor layer 41, in the first b region 31n, (D-3) a second A structure 20p' including the source/drain region 27 having a stacked structure of the first A semiconductor layer 51 and the second A semiconductor layer 52, and the channel formation region 21p, in the second a region 32p, and (D-4) a second B structure 20n' including the source/drain region 27 having a stacked structure of the first B semiconductor layer 41 and the second B semiconductor layer 42, and the channel formation region 21n, in the second b region 32n can be obtained.

[Process-340]

Thereafter, the gate insulating films 12 and 22 and the gate electrodes 16p, 16n, 26p, and 26n are formed in the channel structure units 11p and 11n in the first A structure 10p' and the first B structure 10n' and in the channel formation regions 21p and 21n of the second A structure 20p' and the second B structure 20n', whereby the first A field effect transistor 10p, the first B field effect transistor 10n, the second A field effect transistor 20p, and the second B field effect transistor 20n are obtained in the first a region 31p, the first b region 31n, the second a region 32p, and the second b region 32n of the base 30, respectively.

[Process-340A]

Specifically, first, a resist layer (not illustrated) having a desired resist pattern is formed, and thermal oxidation treatment is performed for the channel structure units 11p and 11n of the first A structure 10p' and the first B structure 10n' and for the channel formation regions 21p and 21n of the second A structure 20p' and the second B structure 20n', whereby parts 13 and 23 of the gate insulating films containing SiON are formed (see FIG. 35A).

[Process-340B]

Next, the resist layer is removed, then a mask layer containing SiN (not illustrated) is formed on the entire surface, the mask layer on the channel formation regions 21p and 21n in the second A field effect transistor 20p and the second B field effect transistor 20n is removed, and a part 23 of the gate insulating film formed on the channel formation regions 21p and 21n is exposed. Then, the thermal oxidation treatment is performed, whereby a part 24 of the gate insulating film containing a thermal oxidation film is formed on the channel formation regions 21p and 21n of the second A structure 20p' and the second B structure 20n'. Thereafter, the mask layer is removed.

[Process-340C]

Next, a mask layer containing SiN (not illustrated) is formed on the entire surface, the mask layer on the channel structure units 11p in the first A field effect transistor 10p and on the channel formation region 21p in the second A field effect transistor 20p is removed, and parts 13 and 24 of the gate insulating films formed on the channel structure units 11p and the channel formation region 21p are exposed. Then, gate insulating films 15 and 25 containing a high dielectric constant material, specifically, $HfO_2$ are formed. Thereafter, the mask layer is removed.

[Process-340D]

Next, a mask layer containing SiN (not illustrated) is formed on the entire surface, the mask layer on the channel structure units 11n in the first B field effect transistor 10n and on the channel formation region 21n in the second B field effect transistor 20n is removed, and parts 13 and 24 of the gate insulating films formed on the channel structure units 11n and the channel formation region 21n are exposed. Then, gate insulating films 15 and 25 containing a high dielectric constant material, specifically, $HfO_2$ are formed. Thereafter, the mask layer is removed. Thus, the structure illustrated in FIG. 35B can be obtained.

[Process-340E]

Thereafter, the gate electrodes 16p and 26p are formed in the first A field effect transistor 10p and the second A field effect transistor 20p, and the gate electrodes 16n and 26n are formed in the first B field effect transistor 10n and the second B field effect transistor 20n. Thus, the structure illustrated in FIG. 23 can be obtained.

[Process-350]

Next, an insulating layer (not illustrated) is formed on the entire surface, openings are formed in the insulating layer located above the gate electrodes 16p, 16n, 26p, and 26n and the source/drain regions 17 and 27, and connection holes and wirings are only required to be formed through the openings onto the insulating layer.

EXAMPLE 4

Example 4 is also a modification of Examples 1 and 2.

Figure 36:
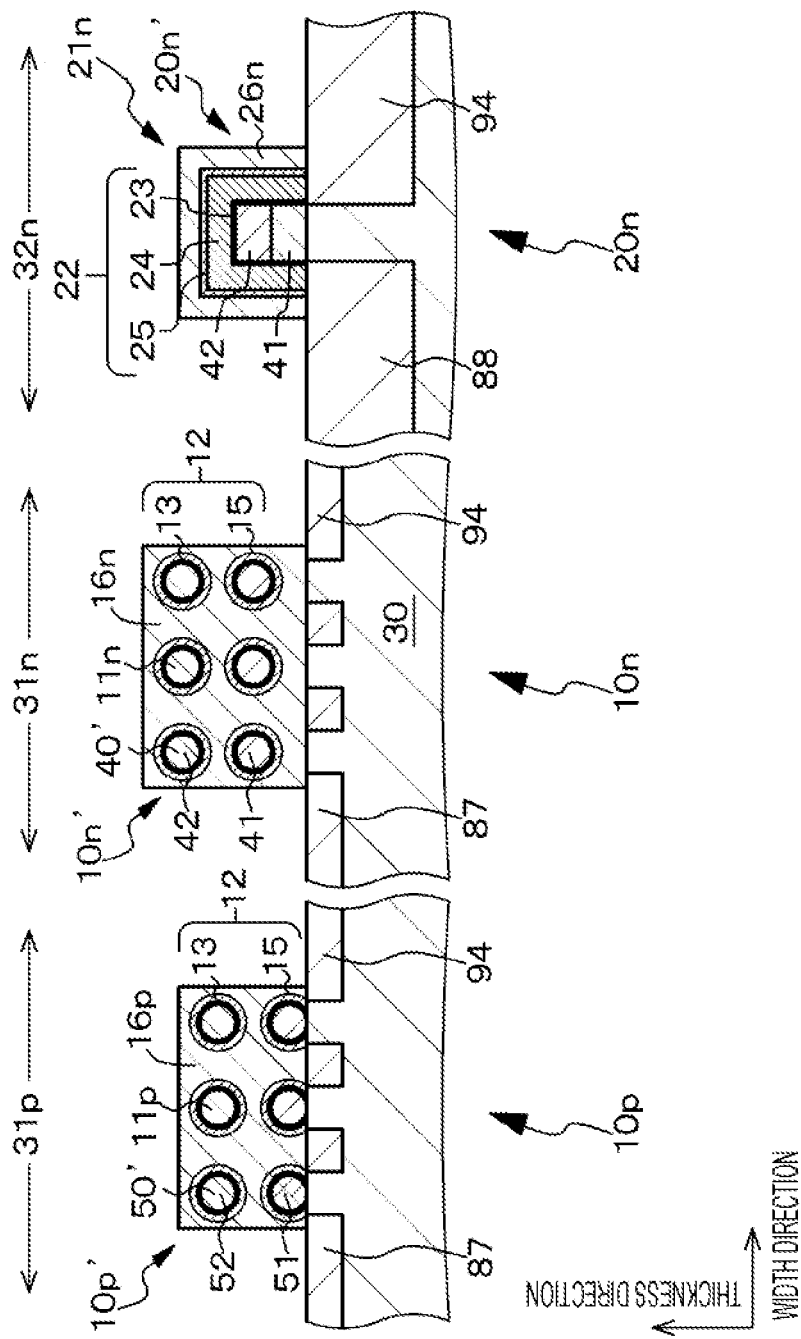
FIG. 36 is a schematic partial cross-sectional view of a semiconductor device according to Example 4.
Figure 37A:
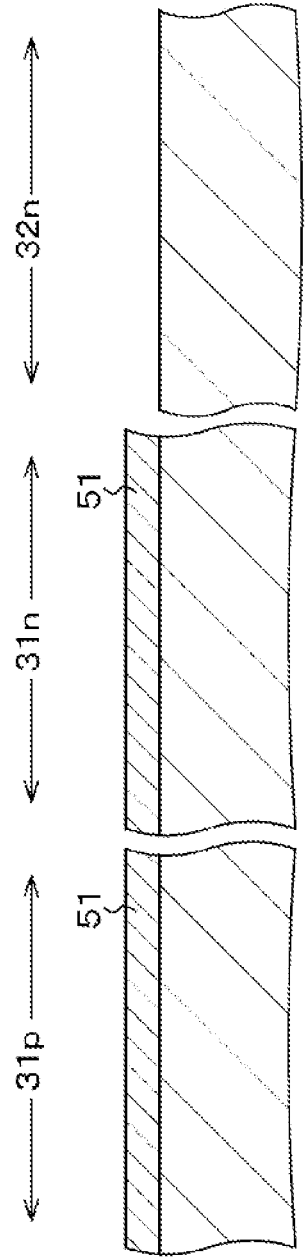
FIGS. 37A and 37B are schematic partial end views of a base and the like for describing a method of manufacturing the semiconductor device according to Example 4.
Figure 37B:
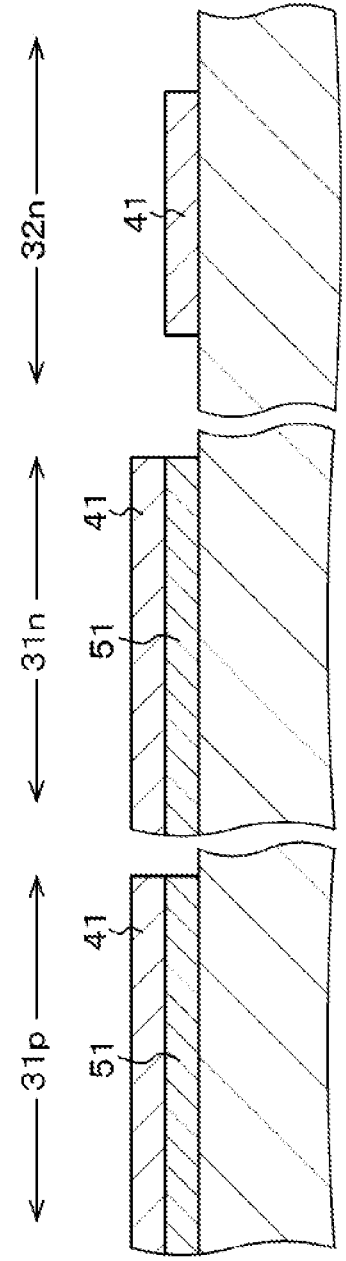
Figure 38A:
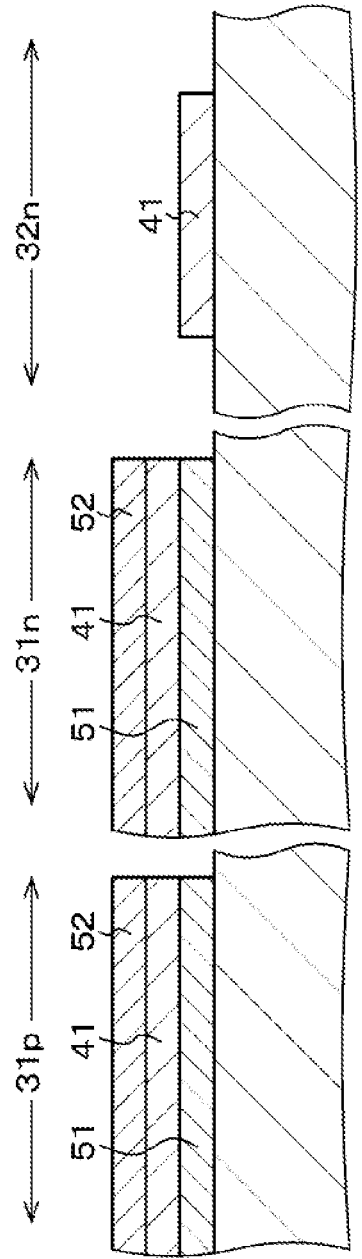
FIGS. 38A and 38B are schematic partial end views of a base and the like for describing a method of manufacturing the semiconductor device according to Example 4, following FIG. 37B.
Figure 38B:
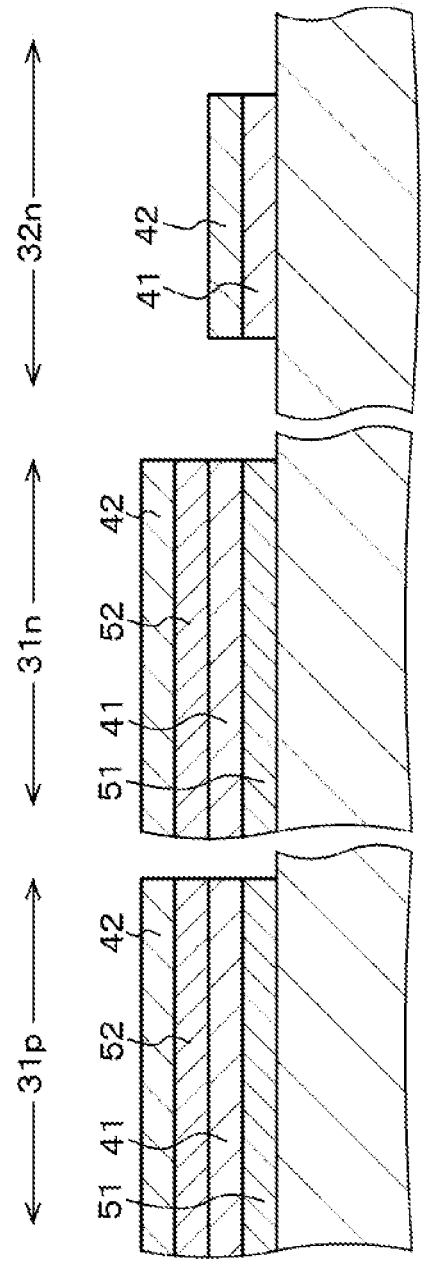

As a schematic cross-sectional view is illustrated in FIG. 36, in the semiconductor device according to Example 4, a first field effect transistor is configured by a combination of a p-channel first field effect transistor (first A field effect transistor 10*p*) and an n-channel first field effect transistor (first B field effect transistor 10*n*), similarly to Example 3. The first A field effect transistor 10*p* is formed in a first a region 31*p*, and the first B field effect transistor 10*n* is formed in a first b region 31*n*. Channel structure units 11*p* in one first field effect transistor (specifically, the first A field effect transistor 10*p* in Example 4), of the p-channel first field effect transistor (first A field effect transistor 10*p*) and the n-channel first field effect transistor (first B field effect transistor 10*n*), are formed in odd-numbered levels of layers (a first layer and a third layer), and channel structure units 11*n* in the other first field effect transistor (specifically, the first B field effect transistor 10*n* in Example 4) are formed in even-numbered levels of layers (a second layer and a fourth layer). The channel structure unit 11*p* in the p-channel first field effect transistor (first A field effect transistor 10*p*) contains SiGe, and the channel structure unit 11*n* in the n-channel first field effect transistor (first B field effect transistor 10*n*) contains Si. Then, the gate insulating film 12 and the gate electrode 16*p* for the first A field effect transistor are formed in the channel structure unit 11*p* in the first A field effect transistor 10*p*, and the gate insulating film 12 and the gate electrode 16*n* for the first B field effect transistor are formed in the channel structure unit 11*n* in the first B field effect transistor 10*n*.

Meanwhile, the second field effect transistor 20 includes the n-channel second field effect transistor, which is different from Example 3. In the second field effect transistor 20, the gate insulating film 22 and the gate electrode 26 for the second field effect transistor are formed in the channel formation region 21.

Moreover, even in the semiconductor device or the like according to Example 4, the first A field effect transistor 10*p* and the first B field effect transistor 10*n* are low withstand voltage/field effect transistors, and the second field effect transistor 20 is a high withstand voltage/field effect transistor. The voltage applied to the gate electrodes 16*p* and 16*n* of the first A field effect transistor 10*p* and the first B field effect transistor 10*n* is 0.5 to 0.8 volts, and the voltage applied to the gate electrode 26 of the second field effect transistor 20 is 1.5 to 3 volts.

Hereinafter, a method of manufacturing the semiconductor device according to Example 4 will be described with reference to FIGS. 36A, 36B, 37A, 37B, 38A, 38B, 39A, 39B, 40A, 40B, 41A, 41B, 42A, 42B, 43A, 43B, 44A and 44B. These drawings are schematic partial end views similar to the schematic partial end view taken along arrow A-A in FIG. 1A.

[Process-400]

First, in the first a region 31*p*, the first b region 31*n*, and the second region 32 of the base 30, the first A semiconductor layer 51 is formed on the first a region 31*p*, the first b region 31*n*, and the second region 32, next, the first B semiconductor layer 41 is formed on the first A semiconductor layer 51 in the first a region 31*p* and the first b region 31*n*, and the first B semiconductor layer 41 is formed on the base 30 in the second region 32.

[Process-400A]

Specifically, first, the first A semiconductor layer 51 is formed on the first a region 31*p*, the first b region 31*n*, and the second region 32 of the base 30 on the basis of the epitaxial CVD method, and then an etching resist having a desired resist pattern (not illustrated) is formed on the first A semiconductor layer 51 in the first a region 31*p*, the first b region 31*n*, and the second region 32 of the base 30. Then, the first A semiconductor layer 51 on the first a region 31*p* and the first b region 31*n* is patterned, the first A semiconductor layer 51 on the second region 32 is removed, and then the etching resist is removed, whereby the first A semiconductor layer 51 can be formed on the first a region 31*p* and the first b region 31*n* (see FIG. 37A).

[Process-400B]

Next, the first B semiconductor layer 41 is formed on the entire surface on the basis of the epitaxial CVD method, and then an etching resist having a desired resist pattern (not illustrated) is formed on the first B semiconductor layer 41. Then, the first B semiconductor layer 41 is patterned, and then the etching resist is removed. Thus, the structure illustrated in FIG. 37B can be obtained.

[Process-410]

Next, the second A semiconductor layer 52 is formed on the first B semiconductor layer 41 in the first a region 31*p* and the first b region 31*n*, and next, the second B semiconductor layer 42 is formed on the second A semiconductor layer 52 in the first a region 31*p* and the first b region 31*n* and on the first B semiconductor layer 41 in the second region 32.

[Process-410A]

Specifically, the second A semiconductor layer 52 is formed on the entire surface on the basis of the epitaxial CVD method, and then an etching resist having a desired resist pattern (not illustrated) is formed on the second A semiconductor layer 52 in the first a region 31*p*, the first b region 31*n*, and the second region 32 of the base 30. Then, the second A semiconductor layer 52 on the first a region 31*p* and the first b region 31*n* is patterned, the second A semiconductor layer 52 on the second region 32 is removed and then the etching resist is removed, whereby the second A semiconductor layer 52 can be formed on the first B semiconductor layer 41 in the first a region 31*p* and the first b region 31*n*.

[Process-410B]

Next, the second B semiconductor layer 42 is formed on the entire surface on the basis of the epitaxial CVD method, and then an etching resist having a desired resist pattern (not illustrated) is formed on the second B semiconductor layer 42. Then, the second B semiconductor layer 42 on the first a region 31*p* and the first b 31*n* is patterned and the second B semiconductor layer 42 on the second region patterned, and then the etching resist is removed. In this way, the second B semiconductor layer 42 can be formed on the second A semiconductor layer 52 in the first a region 31*p* and the first b region 31*n* and on the first B semiconductor layer 41 in the second region 32 (see FIG. 38B).

[Process-420]

Next, a first stacked structure body 10*p*" including the second B semiconductor 42, the second A semiconductor layer 52, the first B semiconductor layer 41, and the first A semiconductor layer 51 is formed in the first a region 31*p*, and a second stacked structure body 10*n*" including the second B semiconductor layer 42, the second A semiconductor layer 52, the first B semiconductor layer 41, and the first A semiconductor layer 51 is formed in the first b region 31*n*.

[Process-420A]

Figure 39A:
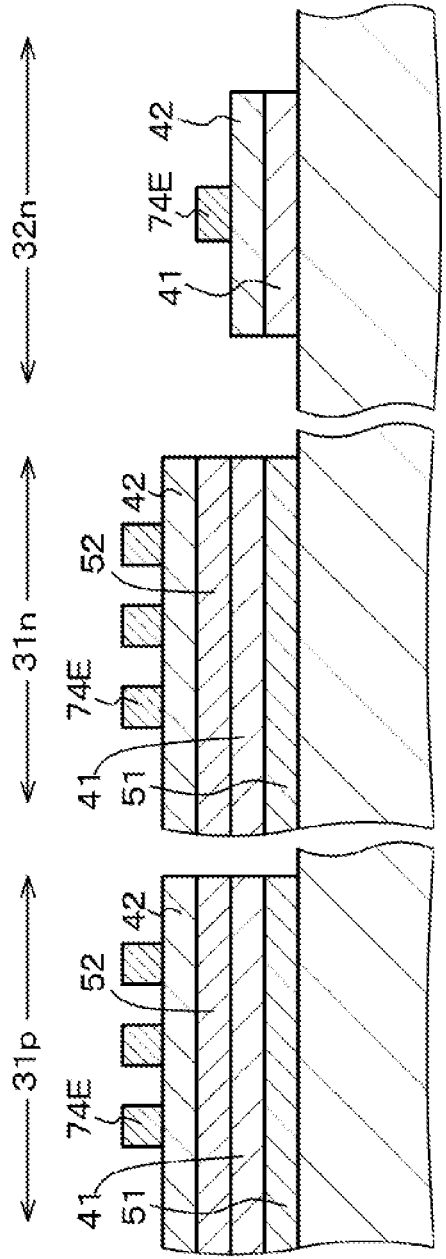
FIGS. 39A and 39B are schematic partial end views of a base and the like for describing a method of manufacturing the semiconductor device according to Example 4, following FIG. 38B.
Figure 39B:
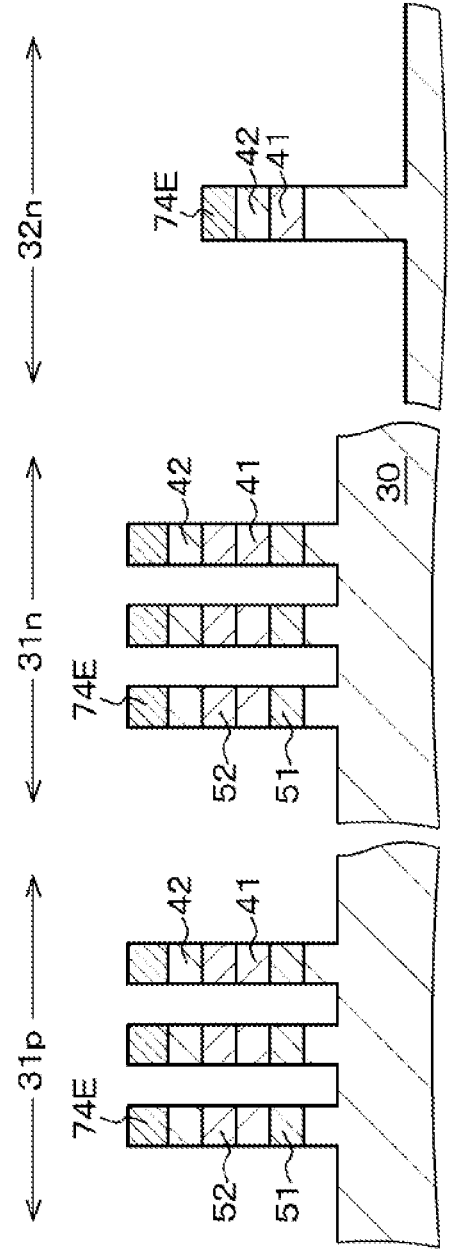

Specifically, an etching resist 74E having a desired resist pattern is formed on the entire surface (see FIG. 39A), then the second B semiconductor layer 42, the second A semiconductor layer 52, the first B semiconductor layer 41, and the first A semiconductor layer 51 in the first a region 31*p*, the first b region 31*n*, and the second region 31 are patterned, and moreover, a part of the base 30 is etched, whereby the structure illustrated in FIG. 39B can be obtained.

Along with the above, a source/drain region 27 including the first B semiconductor layer 41 and the second B semiconductor layer 42 in the second field effect transistor 20 is formed. Furthermore, a source/drain region 17 including the first A semiconductor layer 51, the first B semiconductor layer 41, the second A semiconductor layer 51, and the second B semiconductor layer 42 in the first A field effect transistor 10p and the first B field effect transistor 10n is formed.

[Process-420B]

Figure 40A:
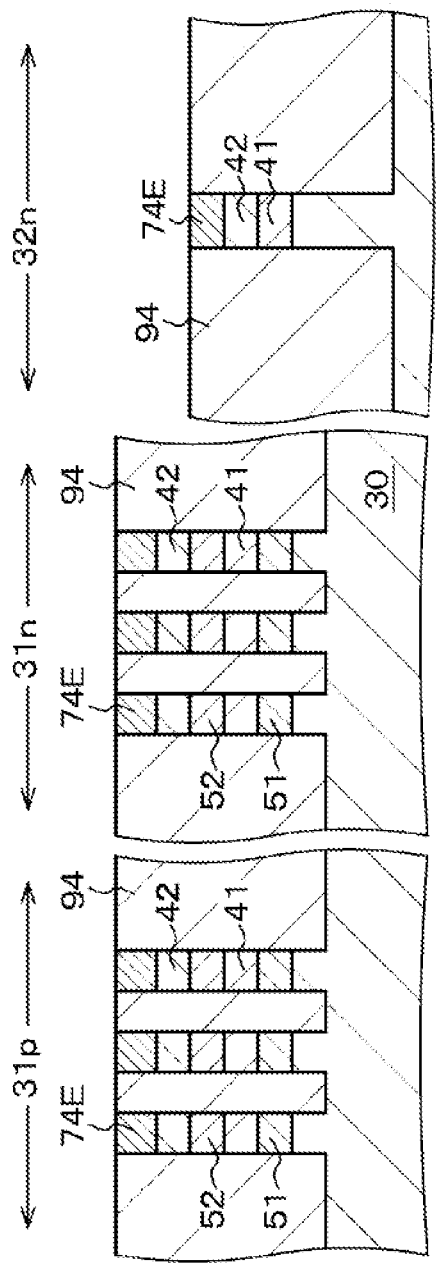
FIGS. 40A and 40B are schematic partial end views of a base and the like for describing a method of manufacturing the semiconductor device according to Example 4, following FIG. 39B.
Figure 40B:
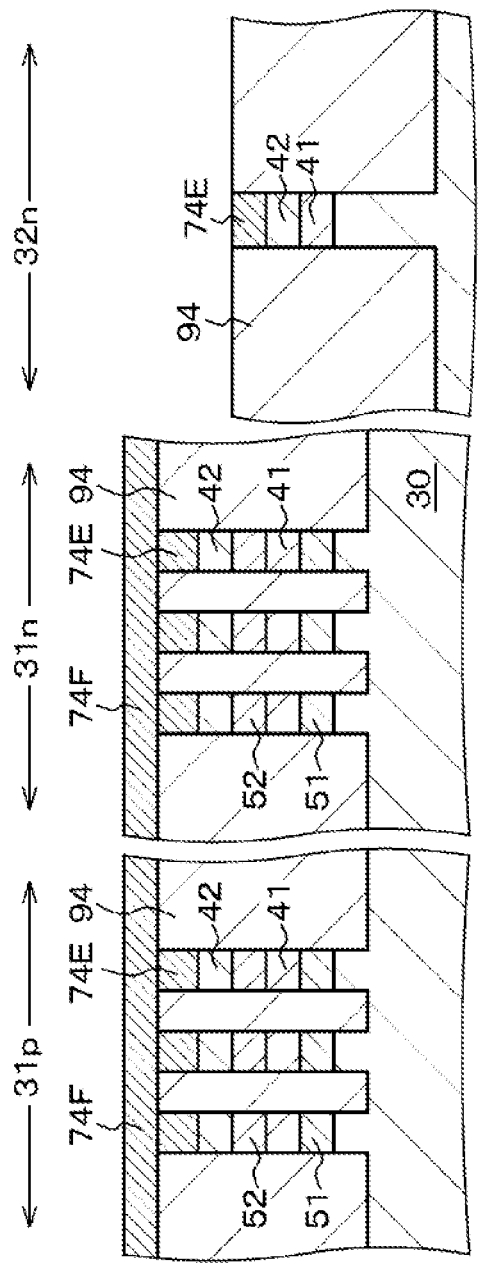
Figure 42A:
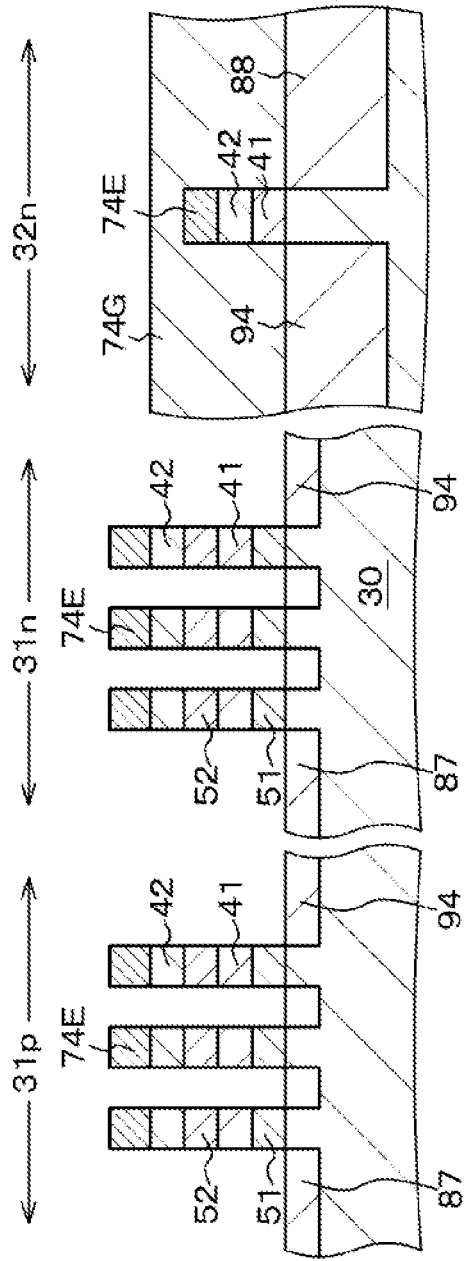
FIGS. 42A and 42B are schematic partial end views of a base and the like for describing a method of manufacturing the semiconductor device according to Example 4, following FIG. 41B.
Figure 42B:
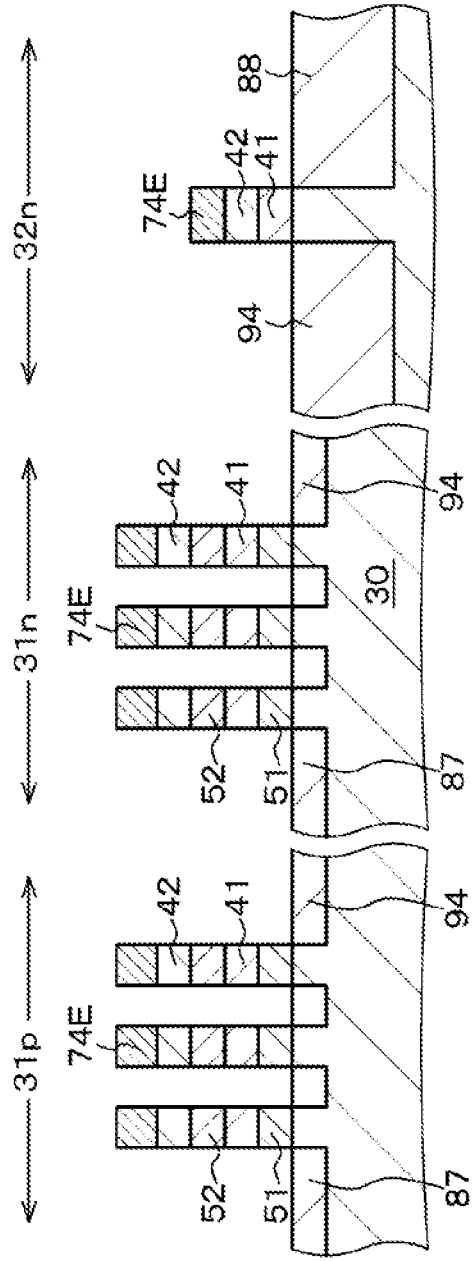

Next, an insulating layer 94 containing $SiO_2$ is formed on the entire surface on the basis of the CVD method, and then flattening processing is performed, whereby the structure illustrated in FIG. 40A can be obtained. Next, an etching resist 74F is formed on the first a region 31p and the first b region 31n (see FIG. 40B), and then, an insulating layer 94 in the second region 32 is etched, whereby the structure illustrated in FIG. 41A can be obtained. An element isolation region 88 is formed by embedding a top of the base 30 with the insulating layer 94. Thereafter, the etching resist 74F is removed and an etching resist 74G is formed on the second region 32 (see FIG. 41B), then the insulating layer 94 in the first a region 31p and the first b region 31n is etched (see FIG. 42A), and the etching resist 74G is removed, whereby the structure illustrated in FIG. 42B can be obtained. Then, the etching resist 74E is removed, whereby second stacked structure bodies 10p" and 10n" including the second B semiconductor layer 42, the second A semiconductor layer 52, the first B semiconductor layer 41, and the first A semiconductor layer 51 can be formed in the first a region 31p and the first b region 31n (see FIG. 43A). An element isolation region 67 is formed by embedding a top of the base 30 with the insulating layer 94.

[Process-430]

Next, parts of the second B semiconductor layer 42 and the first B semiconductor layer 41 in the first stacked structure body 10p" are removed in the first a region 31p, and parts of the second A semiconductor layer 52 and the first A semiconductor layer 51 in the second stacked structure body 10n" are removed in the first b region 31n.

Figure 43A:
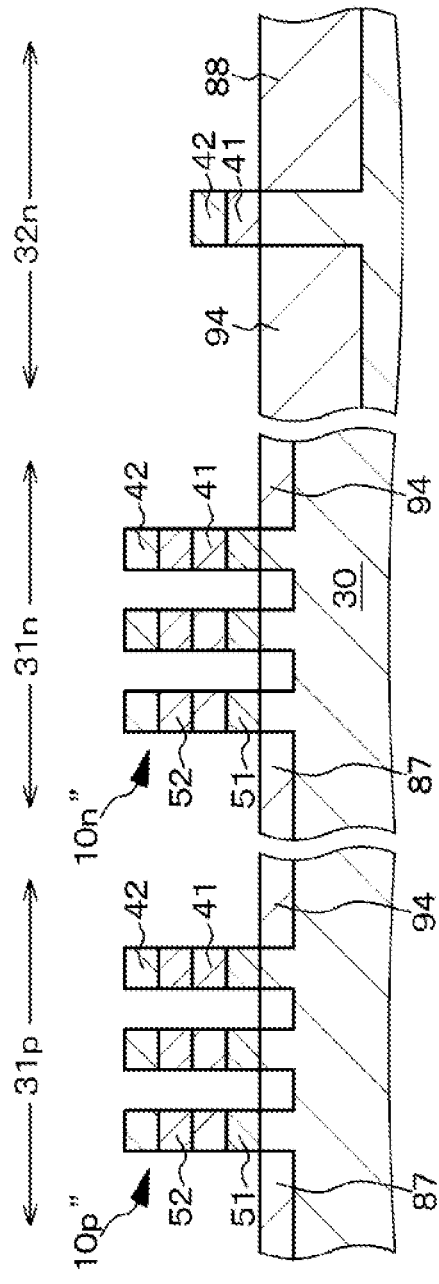
FIGS. 43A and 43B are schematic partial end views of a base and the like for describing a method of manufacturing the semiconductor device according to Example 4, following FIG. 42B.
Figure 43B:
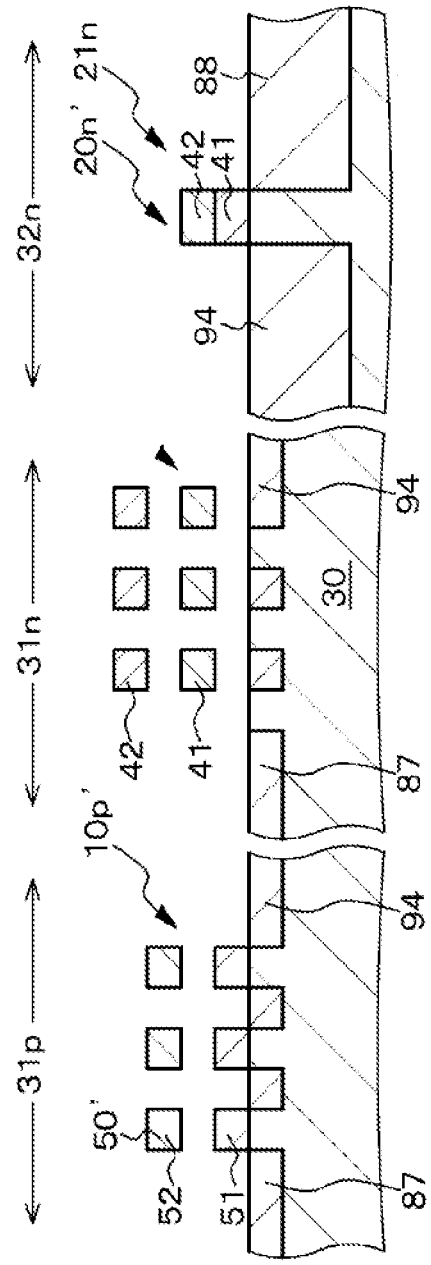

Specifically, the first B semiconductor layer 41 and the second B semiconductor layer 42 containing Si are removed using an etchant having an etching selectivity for the material (SiGe) configuring the first A semiconductor layer 51 and the second A semiconductor layer 52, and the first A semiconductor layer 51 and the second A semiconductor layer 52 containing SiGe are removed using an etchant having an etching selectivity for the material (Si) configuring the first B semiconductor layer 41 and the second B semiconductor layer 42, whereby the structure illustrated in FIG. 43B can be obtained. Both ends of the channel structure units 11p and 11n of the first A field effect transistor 10p and the first B field effect transistor 10n including the nanowire structures 40' and 50' are supported by the source/drain regions 17 of the first A field effect transistor 10p and the first B field effect transistor 10n.

In this way, (D-1) a first A structure 10p' including the source/drain region 17 having the first stacked structure body 10p", and the channel structure units 11p including the first A semiconductor layer 51 and the second A semiconductor layer 52 spaced apart from the first A semiconductor layer 51, in the first a region 31p, (D-2) a first B structure 10n' including the source/drain region 17 having the second stacked structure body 10n", and the channel structure units 11n including the first B semiconductor layer 41 and the second B semiconductor layer 42 spaced apart from the first B semiconductor layer 41, in the first b region 31n, and (D-3) a second structure 20' including the source/drain region 27 having a stacked structure of the first B semiconductor layer 41 and the second B semiconductor layer 42, and the channel formation region 21, in the second region 32 can be obtained.

[Process-440]

Thereafter, the gate insulating films 12 and 22 and the gate electrodes 16p, 16n, and 26 are formed in the channel structure units 11p and 11n in the first A structure 10p' and the first B structure 10n' and in the channel formation region 21 of the second structure 20, whereby the first A field effect transistor 10p, the first B field effect transistor 10n, and the second field effect transistor 20 are obtained in the first a region 31p, the first b region 31n, and the second region 32 of the base 30, respectively.

[Process-440A]

Figure 44A:
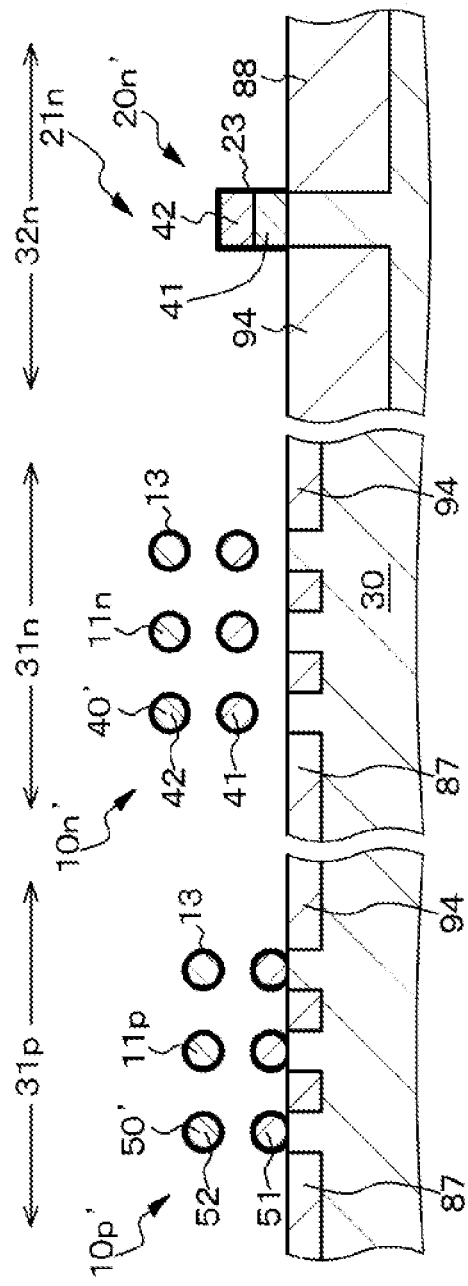
FIGS. 44A and 44B are schematic partial end views of a base and the like for describing a method of manufacturing the semiconductor device according to Example 4, following FIG. 43B.
Figure 44B:
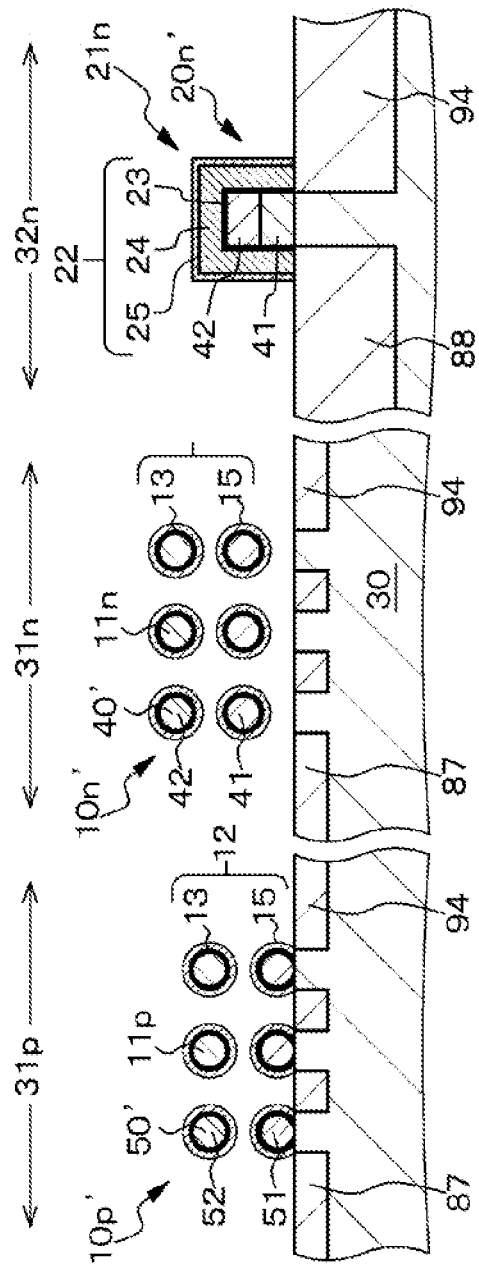

Specifically, first, a resist layer (not illustrated) having a desired resist pattern is formed, and thermal oxidation treatment is performed for the channel structure units 11p and 11n of the first A structure 10p' and the first B structure 10n' and for the channel formation region 21 of the second structure 20, whereby parts 13 and 23 of the gate insulating films containing SiON are formed (see FIG. 44A).

[Process-440B]

Next, the resist layer is removed, then a mask layer containing SiN (not illustrated) is formed on the entire surface, the mask layer in the channel formation region 21 in the second field effect transistor 20 is removed, and a part 23 of the gate insulating film formed on the channel formation region 21 is exposed. Then, the thermal oxidation treatment is performed, whereby a part 24 of the gate insulating film containing a thermal oxidation film is formed in the channel formation region 21 of the second structure 20'. Thereafter, the mask layer is removed.

[Process-440C]

Next, a mask layer (not illustrated) containing SiN is formed on the entire surface, the mask layer on the channel structure units 11p in the first A field effect transistor 10p is removed, and a part 13 of the gate insulating film formed on the channel structure units 11p is exposed. Then, a gate insulating film 15 containing a high dielectric constant material, specifically, $HfO_2$ is formed. Thereafter, the mask layer is removed.

[Process-440D]

Next, a mask layer containing SiN (not illustrated) is formed on the entire surface, the mask layer on the channel structure units 11n in the first B field effect transistor 10n and on the channel formation region 21 in the second field effect transistor 20 is removed, and parts 13 and 24 of the gate insulating films formed on the channel structure units 11n and the channel formation region 21 are exposed. Then, gate insulating films 15 and 25 containing a high dielectric constant material, specifically, $HfO_2$ are formed. Thereafter, the mask layer is removed. Thus, the structure illustrated in FIG. 44B can be obtained.

[Process-440E]

Thereafter, the gate electrode 16p is formed in the first A field effect transistor 10p, and the gate electrodes 16n and 26 are formed in the first B field effect transistor 10n and the second field effect transistor 20. Thus, the structure illustrated in FIG. 36 can be obtained.

[Process-450]

Next, an insulating layer (not illustrated) is formed on the entire surface, openings are formed in the insulating layer located above the gate electrodes 16p, 16n, and 26 and the source/drain regions 17 and 27, and connection holes and wirings are only required to be formed through the openings onto the insulating layer.

As described above, the present disclosure has been described on the basis of the favorable examples. However, the configurations and structures of the semiconductor devices, the materials configuring the semiconductor devices, and the methods of manufacturing the semiconductor devices described in the examples are examples and can be appropriately changed. Furthermore, the order of the steps in the method of manufacturing the semiconductor device in each example can be appropriately changed as desired. In the examples, the channel structure unit has been exclusively described on the basis of the nanowire structure. However, the channel structure unit can be a nanosheet structure. Furthermore, in Example 1, the first and second field effect transistors have been the n-channel field effect transistors, and in Example 2, the first and second field effect transistors have been the p-channel field effect transistors. However, the channel types of these field effect transistors may be reversed. In Examples 3 and 4, the first A field effect transistor and the second A field effect transistor have been the p-channel field effect transistors, and the first B field effect transistor and the second B field effect transistor have been the n-channel field effect transistors. However, the first A field effect transistor and the second A field effect transistor can be n-channel field effect transistors, and the first B field effect transistor and the second B field effect transistor can be the p-channel field effect transistors. In these cases, the materials for configuring the field effect transistors are only required to be changed as appropriate. As the base, an SOI substrate can be used instead of the silicon semiconductor substrate, thereby, the etching amount on the top of the base in the etching of the insulating layer 91 in [Process-120B] in Example 1 can be accurately controlled, for example. In some cases, the element isolation region may be formed in the first step of the method of manufacturing the semiconductor device.

Note that the present disclosure can have the following configurations.

[A01] «Semiconductor Device»

A semiconductor device including:

a first field effect transistor including at least two channel structure units each having a nanowire structure or a nanosheet structure; and a second field effect transistor having a Fin structure, in which the channel structure units are spaced apart from each other in a thickness direction of the first field effect transistor.

[A02] The semiconductor device according to [A01], in which $$0.90 \leq H_L/H_H \leq 1.04$$

is satisfied where a total height of the channel structure units is $H_L$ and a height of a channel formation region of the second field effect transistor is $H_H$.

[A03] The semiconductor device according to [A01] or [A02], in which a gate insulating film and a gate electrode for the first field effect transistor are formed in the channel structure unit in the first field effect transistor, and a gate insulating film and a gate electrode for the second field effect transistor are formed in the channel formation region in the second field effect transistor. [A04] The semiconductor device according to any one of [A01] to [A03], in which the first field effect transistor is configured by a combination of an n-channel first field effect transistor and a p-channel first field effect transistor.

[A05] The semiconductor device according to [A04], in which the channel structure unit in one of the n-channel first field effect transistor and the p-channel first field effect transistor is formed in an odd-numbered level of a layer, and the channel structure unit of the other first field effect transistor is formed in an even-numbered level of a layer.

[A06] The semiconductor device according to [A04] or [A05], in which the channel structure unit in the n-channel first field effect transistor contains Si, and the channel structure unit in the p-channel first field effect transistor contains SiGe.

[A07] The semiconductor device according to any one of [A01] to [A06], in which the second field effect transistor is configured by a combination of an n-channel second field effect transistor and a p-channel second field effect transistor.

[A08] The semiconductor device according to [A07], in which the channel formation region in the n-channel second field effect transistor contains Si, and the channel formation region in the p-channel second field effect transistor contains SiGe.

[A09] The semiconductor device according to any one of [A01] to [A06], in which the second field effect transistor includes an n-channel second field effect transistor.

[A10] The semiconductor device according to any one of [A01] to [A09], in which the first field effect transistor is a low withstand voltage/field effect transistor, and the second field effect transistor is a high withstand voltage/field effect transistor.

[A11] The semiconductor device according to [A10], in which a voltage applied to the gate electrode of the first field effect transistor is 0.5 to 0.8 volts, and a voltage applied to the gate electrode of the second field effect transistor is 1.5 to 3 volts.

[B01] «Method of Manufacturing Semiconductor Device: First Mode»

A method of manufacturing a semiconductor device, including the steps of:

(A) in a first region and a second region of a base, forming a first sacrificial layer on the first region and next forming a first semiconductor layer on the first sacrificial layer and on the second region;

(B) forming a second sacrificial layer on the first semiconductor layer in the first region and next forming a second semiconductor layer on the second sacrificial layer and on the first semiconductor layer in the second region;

(C) forming a stacked structure body including the first semiconductor layer, the first sacrificial layer, the second semiconductor layer, and the second sacrificial layer on the first region and next removing parts of the second sacrificial layer and the first sacrificial layer in the stacked structure body;

(C-1) obtaining a first structure including a source/drain region including the stacked structure body and a channel structure unit including the first semiconductor layer and the second semiconductor layer spaced apart from the first semiconductor layer in the first region; and C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

[B02] «Method of Manufacturing Semiconductor Device: Second Mode»

A method of manufacturing a semiconductor device, including the steps of:

(A) forming a first semiconductor layer on a first region and on a second region of a base;

(B) forming a sacrificial layer on the first semiconductor layer, next removing the sacrificial layer in the second region, forming a second semiconductor layer on the sacrificial layer in the first region, and forming the second semiconductor layer on the first semiconductor layer in the second region;

C) forming a stacked structure body including the second semiconductor layer, the sacrificial layer, the first semiconductor layer and next removing a part of the sacrificial layer in the stacked structure body in the first region;

(C-1) obtaining a first structure including a source/drain region including the stacked structure body and a channel structure unit including the first semiconductor layer and the second semiconductor layer spaced apart from the first semiconductor layer in the first region; and (C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

[B03] «Method of Manufacturing Semiconductor Device: Third Mode»

A method of manufacturing a semiconductor device, including the steps of:

(A) in a first a region, a first b region, a second a region, and a second b region of a base, forming a first A semiconductor layer on the first a region, the first b region, and the second a region and next forming a first B semiconductor layer on the first A semiconductor layer in the first a region and the first b region and on the second b region;

(B) forming a second A semiconductor layer on the first B semiconductor layer in the first a region and the first b region and on the first A semiconductor layer in the second a region and next forming a second B semiconductor layer on the second A semiconductor layer in the first a region and the first b region and on the first B semiconductor layer in the second b region;

(C) forming a first stacked structure body including the second B semiconductor layer, the second A semiconductor layer, the first B semiconductor layer, and the first A semiconductor layer in the first a region, and forming a second stacked structure body including the second B semiconductor layer, the second A semiconductor layer, the first B semiconductor layer, and the first A semiconductor layer in the first b region;

(D) removing parts of the second B semiconductor layer and the first B semiconductor layer in the first stacked structure body in the first a region, and removing parts of the second A semiconductor layer and the first A semiconductor layer in the second stacked structure body in the first b region;

(D-1) obtaining a first A structure including a source/drain region including the first stacked structure body and a channel structure unit including the first A semiconductor layer and the second A semiconductor layer spaced apart from the first A semiconductor layer in the first a region;

(D-2) obtaining a first B structure including a source/drain region including the second stacked structure body and a channel structure unit including the first B semiconductor layer and the second B semiconductor layer spaced apart from the first B semiconductor layer in the first b region;

(D-3) obtaining a second A structure including a source/drain region including a stacked structure of the first A semiconductor layer and the second A semiconductor layer and a channel formation region in the second a region;

(D-4) obtaining a second B structure including a source/drain region including a stacked structure of the first B semiconductor layer and the second B semiconductor layer and a channel formation region in the second b region; and (E) forming a gate insulating film and a gate electrode in the channel structure units in the first A structure and the first B structure and in the channel formation regions in the second A structure and the second B structure, and therefore obtaining a first A field effect transistor, a first B field effect transistor, a second A field effect transistor, and a second B field effect transistor in the first a region, the first b region, the second a region, and the second b region of the base, respectively.

REFERENCE SIGNS LIST

10 First field effect transistor
10$p$ First A field effect transistor
10$n$ First B field effect transistor
10', 10$p$', 10$n$' First structure
10'', 10$p$'', 10$n$'' Stacked structure body
11, 11$p$, 11$n$ Channel structure unit
12, 13, 15, 22, 23, 24, 25 Gate insulating film
16, 16$p$, 16$n$, 26, 26$p$, 26$n$ Gate electrode
17, 27 Source/drain region
20 Second field effect transistor
20$p$ Second A field effect transistor
20$n$ Second B field effect transistor
20', 20$p$', 20$n$' Second structure
21, 21$p$, 21$n$ Channel formation region
30 Base
31 First region
31$a$ First a region
31$n$ First b region
32 Second region
32$p$ Second a region
32$n$ Second b region
40', 50' Nanowire structure
41, 42, 51, 52 Semiconductor layer
61, 62, 63 Sacrificial layer
71A, 71B, 71C, 71D, 71E, 71F, 71G, 72A, 72B, 72C, 72D, 72E, 72F, 72G, 73A, 73B, 73C, 73D, 73E, 73F, 73G, 74A, 74B, 74C, 74D, 74E, 74F, 74G Etching resist
81, 82, 83, 84, 85, 86, 87, 88 Element isolation region
91, 92, 93, 94 Insulating layer

What is claimed is:

1. A semiconductor device, comprising:
a first field effect transistor including at least two channel structure units each having a nanowire structure or a nanosheet structure; and a second field effect transistor having a Fin structure,
wherein the channel structure units are spaced apart from each other in a thickness direction of the first field effect transistor, and
wherein $0.90 \leq H_L/H_H \leq 1.04$ is satisfied where a total height of the channel structure units is $H_L$ and a height of a channel formation region of the second field effect transistor is $H_H$.

2. The semiconductor device according to claim 1, wherein a gate insulating film and a gate electrode for the first field effect transistor are formed in the channel structure unit in the first field effect transistor, and
wherein a gate insulating film and a gate electrode for the second field effect transistor are formed in the channel formation region in the second field effect transistor.

3. The semiconductor device according to claim 1, wherein the first field effect transistor is configured by a combination of an n-channel first field effect transistor and a p-channel first field effect transistor.

4. The semiconductor device according to claim 1, wherein the second field effect transistor is configured by a combination of an n-channel second field effect transistor and a p-channel second field effect transistor.

5. The semiconductor device according to claim 1, wherein the second field effect transistor includes an n-channel second field effect transistor.

6. The semiconductor device according to claim 1, wherein the first field effect transistor is a low withstand voltage/field effect transistor, and wherein the second field effect transistor is a high withstand voltage/field effect transistor.

7. A semiconductor device, comprising:
a first field effect transistor including at least two channel structure units each having a nanowire structure or a nanosheet structure; and
a second field effect transistor having a Fin structure,
wherein the channel structure units are spaced apart from each other in a thickness direction of the first field effect transistor,
wherein the first field effect transistor is configured by a combination of an n-channel first field effect transistor and a p-channel first field effect transistor, and
wherein the channel structure unit in one of the n-channel first field effect transistor and the p-channel first field effect transistor is formed in an odd-numbered level of a layer, and the channel structure unit of another first field effect transistor is formed in an even-numbered level of a layer.

8. The semiconductor device according to claim 7, wherein a gate insulating film and a gate electrode for the first field effect transistor are formed in the channel structure unit in the first field effect transistor, and wherein a gate insulating film and a gate electrode for the second field effect transistor are formed in the channel formation region in the second field effect transistor.

9. The semiconductor device according to claim 7, wherein the channel structure unit in the n-channel first field effect transistor contains Si, and wherein the channel structure unit in the p-channel first field effect transistor contains SiGe.

10. The semiconductor device according to claim 7, wherein the second field effect transistor is configured by a combination of an n-channel second field effect transistor and a p-channel second field effect transistor.

11. The semiconductor device according to claim 7, wherein the second field effect transistor includes an n-channel second field effect transistor.

12. The semiconductor device according to claim 7, wherein the first field effect transistor is a low withstand voltage/field effect transistor, and wherein the second field effect transistor is a high withstand voltage/field effect transistor.

13. A semiconductor device, comprising
a first field effect transistor including at least two channel structure units each having a nanowire structure or a nanosheet structure; and
a second field effect transistor having a Fin structure,
wherein the channel structure units are spaced apart from each other in a thickness direction of the first field effect transistor,
wherein the first field effect transistor is configured by a combination of an n-channel first field effect transistor and a p-channel first field effect transistor,
wherein the channel structure unit in the n-channel first field effect transistor contains Si, and
wherein the channel structure unit in the p-channel first field effect transistor contains SiGe.

14. The semiconductor device according to claim 13, wherein the first field effect transistor is a low withstand voltage/field effect transistor, and wherein the second field effect transistor is a high withstand voltage/field effect transistor.

15. A semiconductor device, comprising
a first field effect transistor including at least two channel structure units each having a nanowire structure or a nanosheet structure; and
a second field effect transistor having a Fin structure,
wherein the channel structure units are spaced apart from each other in a thickness direction of the first field effect transistor,
wherein the second field effect transistor is configured by a combination of an n-channel second field effect transistor and a p-channel second field effect transistor,
wherein the channel formation region in the n-channel second field effect transistor contains Si, and
wherein the channel formation region in the p-channel second field effect transistor contains SiGe.

16. A semiconductor device, comprising
a first field effect transistor including at least two channel structure units each having a nanowire structure or a nanosheet structure; and
a second field effect transistor having a Fin structure,
wherein the channel structure units are spaced apart from each other in a thickness direction of the first field effect transistor,
wherein the first field effect transistor is a low withstand voltage/field effect transistor, and
wherein the second field effect transistor is a high withstand voltage/field effect transistor.

17. The semiconductor device according to claim 16, wherein
a voltage applied to the gate electrode of the first field effect transistor is 0.5 to 0.8 volts, and
a voltage applied to the gate electrode of the second field effect transistor is 1.5 to 3 volts.

18. A method of manufacturing a semiconductor device, comprising the steps of:
(A) in a first region and a second region of a base, forming a first sacrificial layer on the first region and next forming a first semiconductor layer on the first sacrificial layer and on the second region;
(B) forming a second sacrificial layer on the first semiconductor layer in the first region and next forming a second semiconductor layer on the second sacrificial layer and on the first semiconductor layer in the second region;

(C) forming a stacked structure body including the first semiconductor layer, the first sacrificial layer, the second semiconductor layer, and the second sacrificial layer on the first region and next removing parts of the second sacrificial layer and the first sacrificial layer in the stacked structure body;

(C-1) obtaining a first structure including a source/drain region including the stacked structure body and a channel structure unit including the first semiconductor layer and the second semiconductor layer spaced apart from the first semiconductor layer in the first region; and (C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

19. A method of manufacturing a semiconductor device, comprising the steps of:

(A) forming a first semiconductor layer on a first region and on a second region of a base;

(B) forming a sacrificial layer on the first semiconductor layer, next removing the sacrificial layer in the second region, forming a second semiconductor layer on the sacrificial layer in the first region, and forming the second semiconductor layer on the first semiconductor layer in the second region;

(C) forming a stacked structure body including the second semiconductor layer, the sacrificial layer, the first semiconductor layer and next removing a part of the sacrificial layer in the stacked structure body in the first region;

(C-1) obtaining a first structure including a source/drain region including the stacked structure body and a channel structure unit including the first semiconductor layer and the second semiconductor layer spaced apart from the first semiconductor layer in the first region; and (C-2) obtaining a second structure including a source/drain region including a stacked structure of the first semiconductor layer and the second semiconductor layer, and a channel formation region in the second region; and (D) forming a gate insulating film and a gate electrode in the channel structure unit in the first structure and in the channel formation region in the second structure, and therefore obtaining a first field effect transistor and a second field effect transistor in the first region and the second region, respectively.

20. A method of manufacturing a semiconductor device, comprising the steps of:

(A) in a first a region, a first b region, a second a region, and a second b region of a base, forming a first A semiconductor layer on the first a region, the first b region, and the second a region and next forming a first B semiconductor layer on the first A semiconductor layer in the first a region and the first b region and on the second b region;

(B) forming a second A semiconductor layer on the first B semiconductor layer in the first a region and the first b region and on the first A semiconductor layer in the second a region and next forming a second B semiconductor layer on the second A semiconductor layer in the first a region and the first b region and on the first B semiconductor layer in the second b region;

(C) forming a first stacked structure body including the second B semiconductor layer, the second A semiconductor layer, the first B semiconductor layer, and the first A semiconductor layer in the first a region, and forming a second stacked structure body including the second B semiconductor layer, the second A semiconductor layer, the first B semiconductor layer, and the first A semiconductor layer in the first b region;

(D) removing parts of the second B semiconductor layer and the first B semiconductor layer in the first stacked structure body in the first a region, and removing parts of the second A semiconductor layer and the first A semiconductor layer in the second stacked structure body in the first b region;

(D-1) obtaining a first A structure including a source/drain region including the first stacked structure body and a channel structure unit including the first A semiconductor layer and the second A semiconductor layer spaced apart from the first A semiconductor layer in the first a region;

(D-2) obtaining a first B structure including a source/drain region including the second stacked structure body and a channel structure unit including the first B semiconductor layer and the second B semiconductor layer spaced apart from the first B semiconductor layer in the first b region;

(D-3) obtaining a second A structure including a source/drain region including a stacked structure of the first A semiconductor layer and the second A semiconductor layer and a channel formation region in the second a region;

(D-4) obtaining a second B structure including a source/drain region including a stacked structure of the first B semiconductor layer and the second B semiconductor layer and a channel formation region in the second b region; and (E) forming a gate insulating film and a gate electrode in the channel structure units in the first A structure and the first B structure and in the channel formation regions in the second A structure and the second B structure, and therefore obtaining a first A field effect transistor, a first B field effect transistor, a second A field effect transistor, and a second B field effect transistor in the first a region, the first b region, the second a region, and the second b region of the base, respectively.

* * * * *